(12) United States Patent
Hayashi

(10) Patent No.: US 8,405,231 B2
(45) Date of Patent: *Mar. 26, 2013

(54) SEMICONDUCTOR DEVICE, MANUFACTURING METHOD THEREOF, AND MANUFACTURING METHOD OF SEMICONDUCTOR MODULE

(75) Inventor: Yoshinari Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/289,593

(22) Filed: Nov. 4, 2011

(65) Prior Publication Data

US 2012/0043656 A1 Feb. 23, 2012

Related U.S. Application Data

(63) Continuation of application No. 12/549,718, filed on Aug. 28, 2009, now Pat. No. 8,076,787.

(30) Foreign Application Priority Data

Oct. 9, 2008 (JP) ................................ 2008-262682

(51) Int. Cl.
 *H01L 23/42* (2006.01)
 *H01L 23/58* (2006.01)
(52) U.S. Cl. .... 257/786; 257/773; 257/780; 257/E23.07
(58) Field of Classification Search .................. 257/773, 257/786, E23.07, 780
See application file for complete search history.

(56) References Cited

U.S. PATENT DOCUMENTS

| | | | |
|---|---|---|---|
| 4,437,141 A | 3/1984 | Prokop | |
| 5,686,699 A | 11/1997 | Chu et al. | |
| 5,691,568 A | 11/1997 | Chou et al. | |
| 5,801,440 A | 9/1998 | Chu et al. | |
| 5,874,776 A * | 2/1999 | Kresge et al. | 257/747 |
| 6,137,168 A | 10/2000 | Kirkman | |
| 6,157,080 A * | 12/2000 | Tamaki et al. | 257/738 |
| 6,157,783 A * | 12/2000 | Ide | 396/106 |
| 6,198,635 B1 | 3/2001 | Shenoy et al. | |
| 6,265,783 B1 | 7/2001 | Juso et al. | |
| 6,897,555 B1 | 5/2005 | Lim et al. | |
| 6,919,227 B2 | 7/2005 | Nishiyama | |
| 2001/0004135 A1 | 6/2001 | Okamura | |
| 2002/0195722 A1 | 12/2002 | Nishiyama | |
| 2003/0038377 A1* | 2/2003 | Nakata et al. | 257/778 |
| 2004/0124007 A1 | 7/2004 | Ashida | |
| 2004/0164428 A1* | 8/2004 | Takahashi et al. | 257/780 |
| 2006/0192282 A1 | 8/2006 | Suwa et al. | |

(Continued)

FOREIGN PATENT DOCUMENTS

JP 08-298264 A 11/1996
JP 2001-176928 A 6/2001

(Continued)

*Primary Examiner* — Nitin Parekh
(74) *Attorney, Agent, or Firm* — Mattingly & Malur, PC

(57) ABSTRACT

An improvement is achieved in the mounting reliability of a semiconductor device. A semiconductor chip is mounted over an upper surface of a wiring substrate. A plurality of solder balls are disposed individually over a plurality of lands formed on a lower surface of the wiring substrate. The plural lands include a first land group arranged in a plurality of rows and arranged along a peripheral edge portion of the lower surface of the wiring substrate, and a second land group arranged inside the first land group in the lower surface of the wiring substrate. The lands in the first land group are arranged with a first pitch, and the lands in the second land group are arranged with a second pitch higher than the first pitch.

18 Claims, 44 Drawing Sheets

U.S. PATENT DOCUMENTS

2006/0279315 A1 12/2006 Takagi et al.
2007/0120245 A1* 5/2007 Yoshikawa et al. .......... 257/691
2008/0230884 A1 9/2008 Yang et al.
2011/0001239 A1 1/2011 Hsieh

FOREIGN PATENT DOCUMENTS

JP 2005-217264 A 8/2005
JP 2006-237385 A 9/2006

* cited by examiner

3: WIRING SUBSTRATE
3b: LOWER SURFACE
6: SOLDER BALL
16a, 16b: LAND
56: FIRST LAND GROUP
57: SECOND LAND GROUP

SEMICONDUCTOR DEVICE, MANUFACTURING METHOD THEREOF, AND MANUFACTURING METHOD OF SEMICONDUCTOR MODULE

CROSS-REFERENCE TO RELATED APPLICATIONS

This is a continuation of U.S. patent application Ser. No. 12/549,718, filed Aug. 28, 2009, which claims priority to Japanese Patent Application No. 2008-262682, filed Oct. 9, 2008, the disclosure of which, including the specification, drawings and abstract, is incorporated herein by reference in its entirety.

BACKGROUND OF THE INVENTION

The present invention relates to a semiconductor device, a manufacturing method thereof, and a manufacturing method of a semiconductor module, and particularly to a technology which is effective when applied to a semiconductor device in which a semiconductor chip is mounted on a wiring substrate, and solder balls are arranged on the lower surface of the wiring substrate, a manufacturing method thereof, and a manufacturing method of a semiconductor module using the semiconductor device.

There are numerous types of package structures of semiconductor devices, such as a ball grid array (BGA) type semiconductor device using a wiring substrate, and a quad flat package (QFP) type semiconductor device using a lead frame. Among them, in the BGA type semiconductor device (hereinafter referred to as BGA), external terminals for electrically coupling a semiconductor chip mounted within the package structure to peripheral equipment of the BGA (external equipment outside the BGA) can be arranged in a plurality of rows and columns on the lower surface (back surface or mounting surface) of the wiring substrate forming the BGA. Therefore, the BGA is more adaptable than the QFP type semiconductor device to a larger number of external terminals which increase with an increase in the functionality of a semiconductor device, while restraining an increase in the outer dimension of the semiconductor device.

As shown in, e.g., FIG. 7 of Japanese Unexamined Patent Publication No. 2006-237385 (Patent Document 1), there is a BGA type semiconductor device in which the substrate bump electrodes (external coupling terminals) of a wiring substrate (resin substrate with multilayer wiring or mounting substrate) are divided into a bump electrode group to be located at an outer peripheral portion and a bump electrode group to be located at a center portion, and disposed on the wiring substrate.

On the other hand, as shown in, e.g., FIG. 2 of Japanese Unexamined Patent Publication No. 2005-217264 (Patent Document 2), it has been known to divide the plural bumps (external terminals) of a semiconductor element (semiconductor chip) mounted on a semiconductor carrier substrate (wiring substrate) into those to be located at the peripheral edge portion of the semiconductor element and those to be located at the center portion thereof, and further dispose the plural bumps on the main surface of the semiconductor element such that the pitch of the bumps located at the center portion is higher than the pitch of the bumps located at the peripheral edge portion.

[Patent Document 1]
Japanese Unexamined Patent Publication No. 2006-237385
[Patent Document 2]
Japanese Unexamined Patent Publication No. 2005-217264

SUMMARY OF THE INVENTION

However, as a result of examining a BGA having solder bumps which are arranged/configured as shown in FIG. 7 of Patent Document 1 mentioned above, the present inventors have found the following problems.

First, when the BGA is mounted on a mounting substrate (motherboard), the bump electrodes (solder bumps) provided as the external terminals of the BGA are molten by performing a heat treatment thereto, and electrically coupled to the substrate terminals of the mounting substrate (referred to also as solder reflow). At this time, the thermal expansion coefficient of a semiconductor chip mounted on the wiring substrate (resin substrate with multilayer wiring or interposer), the thermal expansion coefficient of the wiring substrate or the thermal expansion coefficient of a mounting substrate, and the thermal expansion coefficient of the BGA including the semiconductor chip and a resin forming a molded body are different from each other. Therefore, due to heat applied during the mounting, the warping of the semiconductor package (BGA) is likely to occur. At this time, in the case where the resin used to form the molded body formed on the upper surface (main surface) of the wiring substrate in the BGA has a thermal expansion coefficient lower than that of the wiring substrate, when the BGA is placed under a high-temperature environment in a heat treatment step (solder reflow step), the wiring substrate warps so that the center portion of the lower surface thereof is located below (protrudes relative to) the four corner portions thereof. As a result, in contrast to the solder bumps located closer to the peripheral portion of the lower surface of the wiring substrate forming the BGA, the solder bumps located closer to the center portion of the lower surface of the wiring substrate are brought into a molten state, while being collapsed under the pressure of the warped wiring substrate of the BGA and the mounting substrate. When the solder bumps in the molten state are collapsed, the solder from the collapsed portion spreads to the surrounding area to reach an adjacent solder bump as shown in FIG. 66, which may result in a contact (short circuit) between adjacent solder bumps (solder balls) 206 that have been solidified after the solder reflow. FIG. 66 is an illustrative view for illustrating the contact between the solder bumps 206 of a BGA 201 mounted on a mounting substrate 231, which diagrammatically shows the warped state of the BGA 201 mounted on the mounting substrate 231. Since it is necessary to sort out and remove the BGA that has undergone a short circuit and the mounting substrate having the BGA mounted thereon as a defective product, such a solder-bump-collapse failure or a short circuit failure reduces the yield of mounting the BGA.

Therefore, if the solder bumps provided on the lower surface of the wiring substrate forming the BGA are merely divided into the two solder bump groups and arranged as shown in Patent Document 1 mentioned above, the locations where the solder bumps are disposed come closer to the center portion of the lower surface (mounting surface) of the wiring substrate. Consequently, when the BGA is warped by the heat treatment step during the mounting of the BGA, the solder bumps located closer to the center portion of the lower surface of the wiring substrate are collapsed under pressure. As a result, a short circuit is more likely occur, and the reliability of the BGA (or mounting reliability after the mounting of the BGA on the mounting substrate) is degraded.

On the other hand, Patent Document 2 mentioned above is characterized in that the gap between the wiring electrode portion of the semiconductor carrier substrate and the bumps of the semiconductor element mounted on the semiconductor carrier substrate is corrected with the dimensions of the bumps. In Patent Document 2 mentioned above, there is no description of a detailed arrangement of the plural external terminals (lands) formed on the lower surface (mounting surface) of the semiconductor carrier substrate (wiring substrate).

It is therefore an object of the present invention to provide a technology which allows an improvement in the reliability of a semiconductor device.

Another object of the present invention is to provide a technology which allows an improvement in the yield of mounting the semiconductor device.

The above and other objects and novel features of the present invention will become apparent from the description of the present specification and the accompanying drawings.

As shown below, a brief description will be given of representative aspects of the invention disclosed in the present application.

A semiconductor device according to a representative embodiment includes a wiring substrate having a first surface, a plurality of bonding leads formed on the first surface, a second surface opposite to the first surface, and a plurality of lands formed on the second surface, a semiconductor chip having a third surface, a plurality of electrode pads formed on the third surface, and a fourth surface opposite to the third surface, and mounted over the first surface of the wiring substrate, a plurality of conductive members electrically connecting the plural electrode pads of the semiconductor chip and the plural bonding leads of the wiring substrate to each other, and a plurality of external terminals disposed individually on the plural lands of the wiring substrate, respectively. Here, the plural lands include a first land group arranged in a plurality of rows and arranged along a peripheral edge portion of the second surface of the wiring substrate, and a second land group arranged inside the first land group in the second surface of the wiring substrate. In the first land group, the lands are arranged with a first pitch. In the second land group, the lands are arranged with a second pitch higher than the first pitch.

A manufacturing method of a semiconductor module according to another representative embodiment includes (a) preparing a semiconductor device having a wiring substrate having a first surface, a plurality of bonding leads formed on the first surface, a second surface opposite to the first surface, and a plurality of lands formed on the second surface, a semiconductor chip having a third surface, a plurality of electrode pads formed on the third surface, and a fourth surface opposite to the third surface, and mounted over the first surface of the wiring substrate, a plurality of conductive members electrically connecting the plural electrode pads of the semiconductor chip and the plural bonding leads of the wiring substrate to each other, and a plurality of external terminals disposed individually on the plural lands of the wiring substrate, respectively, (b) preparing a mounting substrate having a surface, and a plurality of coupling terminals formed on the surface, (c) disposing the semiconductor device over the surface of the mounting substrate so as to oppose the second surface to the surface, and (d) after the step (c), performing a heat treatment to electrically couple the plural external terminals of the semiconductor device individually to the plural coupling terminals of the mounting substrate. Here, in the semiconductor device prepared in the step (a), the plural lands include a first land group arranged in a plurality of rows and arranged along a peripheral edge portion of the second surface of the wiring substrate, and a second land group arranged inside the first land group on the second surface of the wiring substrate. In the first land group, the lands are arranged with a first pitch. In the second land group, the lands are arranged with a second pitch higher than the first pitch.

A semiconductor device according to still another representative embodiment includes a wiring substrate having a first surface, a plurality of bonding leads formed on the first surface, a second surface opposite to the first surface, and a plurality of lands formed on the second surface, a semiconductor chip having a third surface, a plurality of electrode pads formed on the third surface, and a fourth surface opposite to the third surface, and mounted over the first surface of the wiring substrate, a plurality of conductive members electrically connecting the plural electrode pads of the semiconductor chip and the plural bonding leads of the wiring substrate to each other, and a plurality of external terminals disposed individually on the plural lands of the wiring substrate, respectively. Here, the plural external terminals include a first external terminal group arranged in a plurality of rows along a peripheral edge portion of the second surface of the wiring substrate, and a second external terminal group arranged inside the first external terminal group in the second surface of the wiring substrate. In the first external terminal group, the external terminals are arranged with a first pitch. In the second external terminal group, the external terminals are arranged with a second pitch higher than the first pitch.

A manufacturing method of a semiconductor device according to yet another representative embodiment includes the steps of (a) preparing a wiring substrate having a first surface, a plurality of bonding leads formed on the first surface, a second surface opposite to the first surface, and a plurality of lands formed on the second surface, (b) mounting, over the first surface of the wiring substrate, a semiconductor chip having a third surface, a plurality of electrode pads formed on the third surface, and a fourth surface opposite to the third surface, (c) electrically connecting the plural electrode pads of the semiconductor chip and the plural bonding leads of the wiring substrate to each other via a plurality of conductive members, and (d) disposing a plurality of external terminals individually on the plural lands of the wiring substrate, respectively. Here, the plural external terminals include a first external terminal group arranged in a plurality of rows and arranged along a peripheral edge portion of the second surface of the wiring substrate, and a second external terminal group arranged inside the first external terminal group in the second surface of the wiring substrate. In the first external terminal group, the external terminals are arranged with a first pitch. In the second external terminal group, the external terminals are arranged with a second pitch higher than the first pitch.

The following is a brief description of effects obtained by the representative aspects of the invention disclosed in the present application.

According to the representative embodiments, the reliability of the semiconductor device can be improved.

In addition, the yield of mounting the semiconductor device can be improved.

DESCRIPTION OF THE PREFERRED EMBODIMENTS

Figure 1:
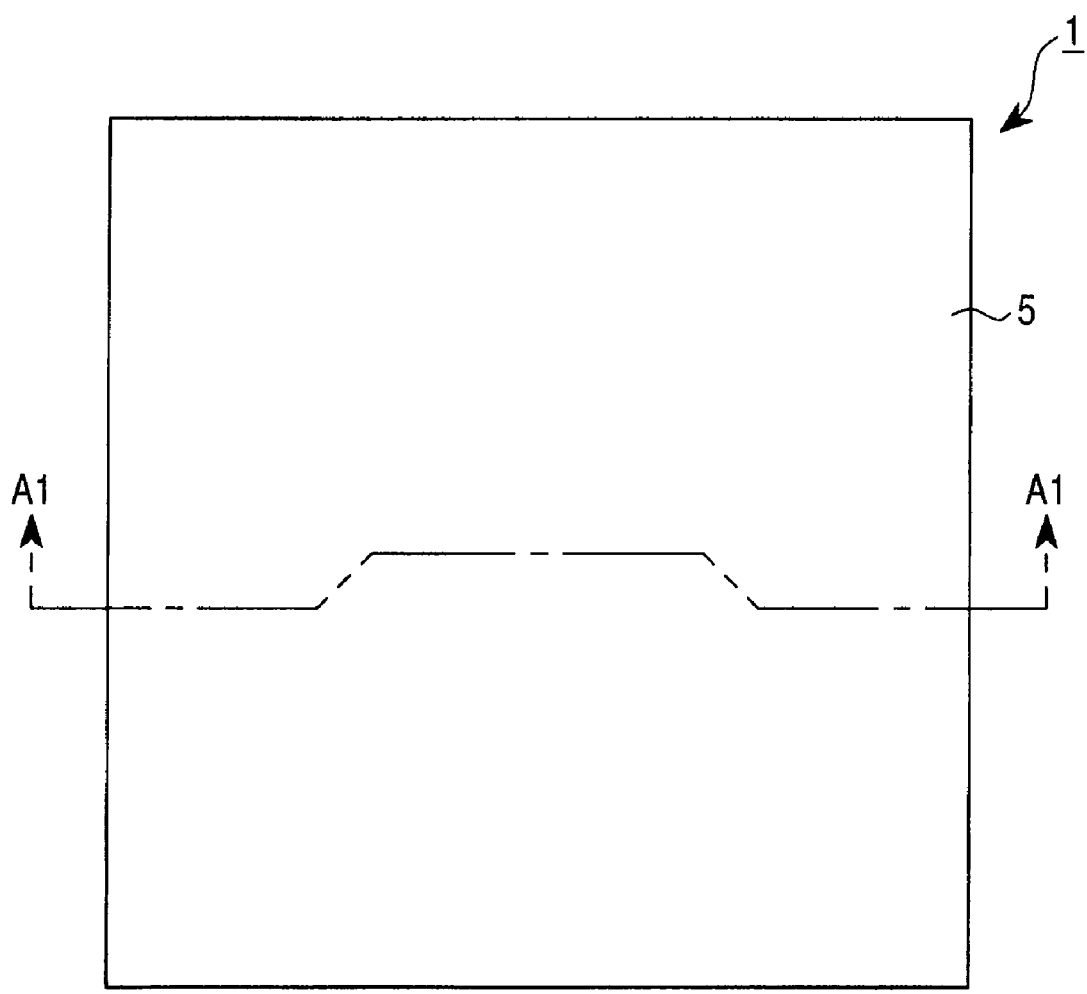
FIG. 1 is a top view of a semiconductor device of Embodiment 1 of the present invention.

If necessary for the sake of convenience, each of the following embodiments will be described by dividing it into a plurality of sections or embodiments. However, they are by no means irrelevant to each other unless shown particularly explicitly, and are mutually related to each other such that one of the sections or embodiments is a variation or a detailed or complementary description of some or all of the others. When the number and the like (including the number, numerical value, amount, and range thereof) of elements are referred to in the following embodiments, they are not limited to specific numbers unless shown particularly explicitly or unless they are obviously limited to specific numbers in principle. The number and the like of the elements may be not less than or not more than specific numbers. It will be easily appreciated that, in the following embodiments, the components thereof (including also elements, steps, and the like) are not necessarily indispensable unless shown particularly explicitly or unless the components are considered to be obviously indispensable in principle. Likewise, if the shapes, positional relationship, and the like of the components and the like are referred to in the following embodiments, the shapes and the like are assumed to include those substantially proximate or similar thereto unless shown particularly explicitly or unless obviously they are not in principle. The same holds true with regard to the foregoing numerical value and range.

Referring now to the drawings, the embodiments of the present invention will be described hereinbelow in detail. Throughout the drawings for illustrating the embodiments, members having the same functions will be provided with the same reference numerals, and a repeated description thereof is omitted. In the following embodiments, a description of the same or like parts will not be repeated in principle unless particularly necessary.

There are cases where hatching may be omitted for clarity of illustration even in a cross-sectional view in the drawings used in the embodiments. There are also cases where even a plan view may be hatched for clarity of illustration.
(Embodiment 1)

A semiconductor device of the present embodiment will be described with reference to the drawings.

Figure 2:
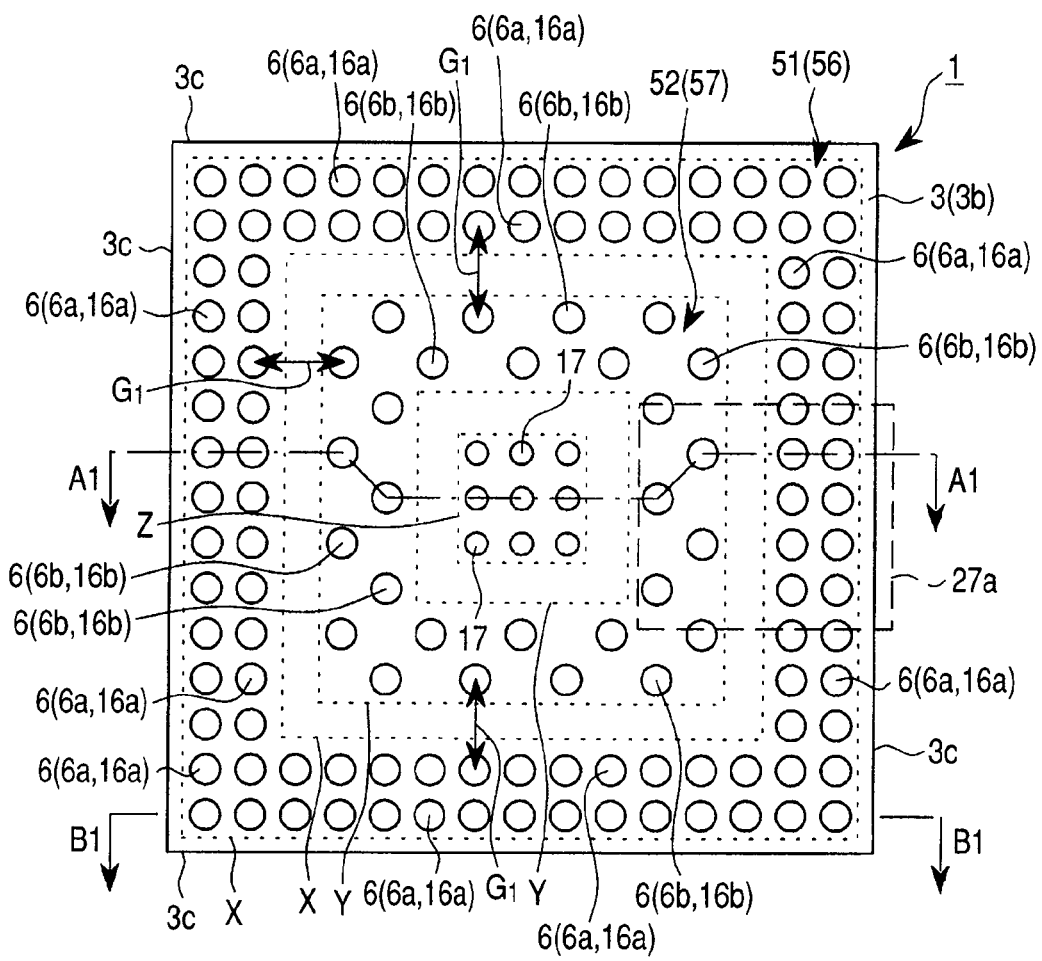
FIG. 2 is a bottom view of the semiconductor device of Embodiment 1.
Figure 3:
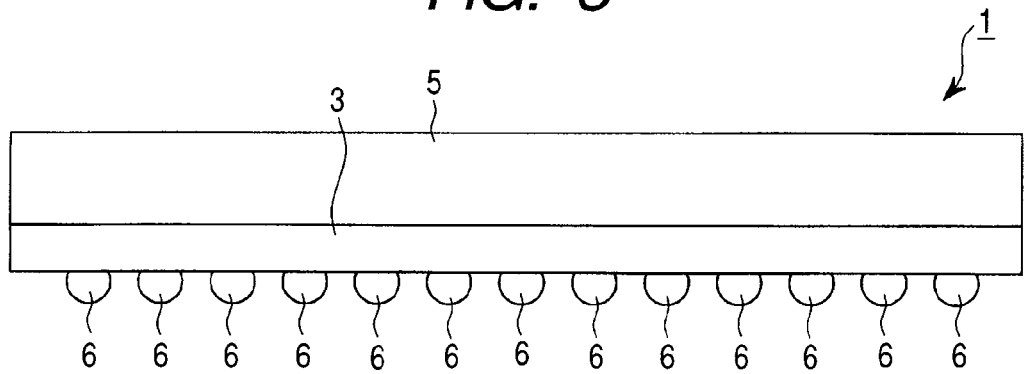
FIG. 3 is a side view of the semiconductor device of Embodiment 1.
Figure 4:
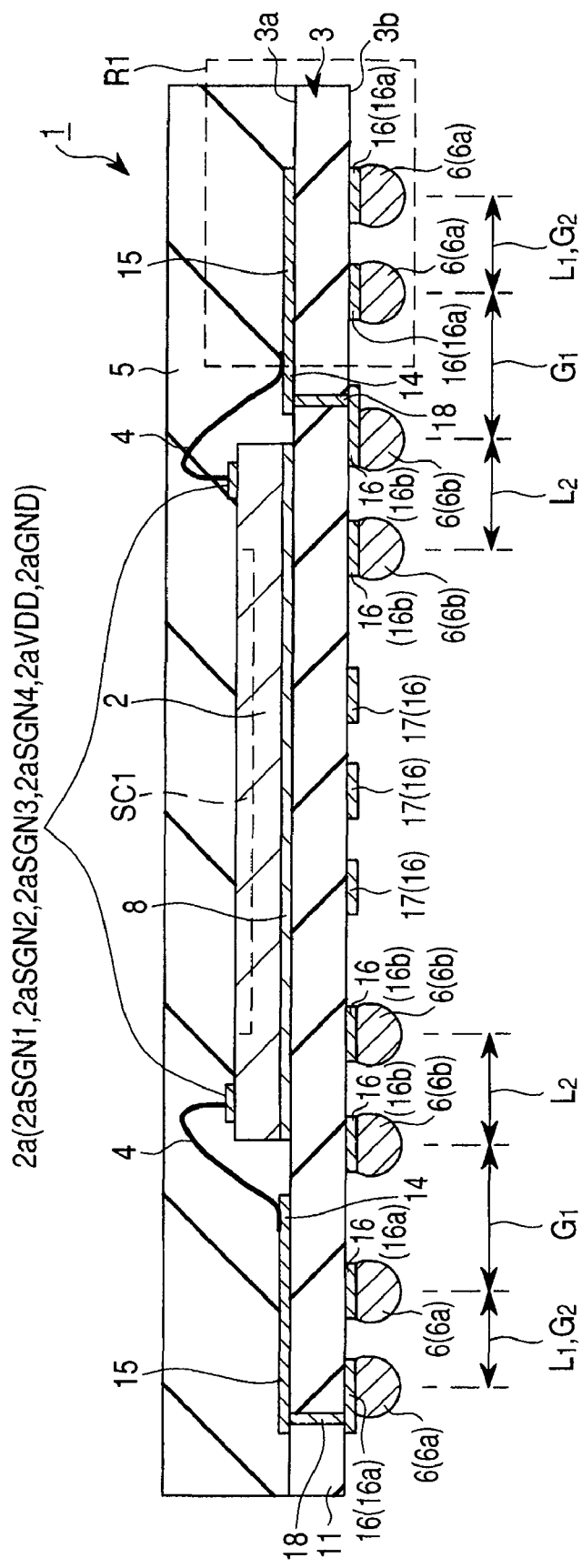
FIG. 4 is a cross-sectional view of the semiconductor device of Embodiment 1.
Figure 5:
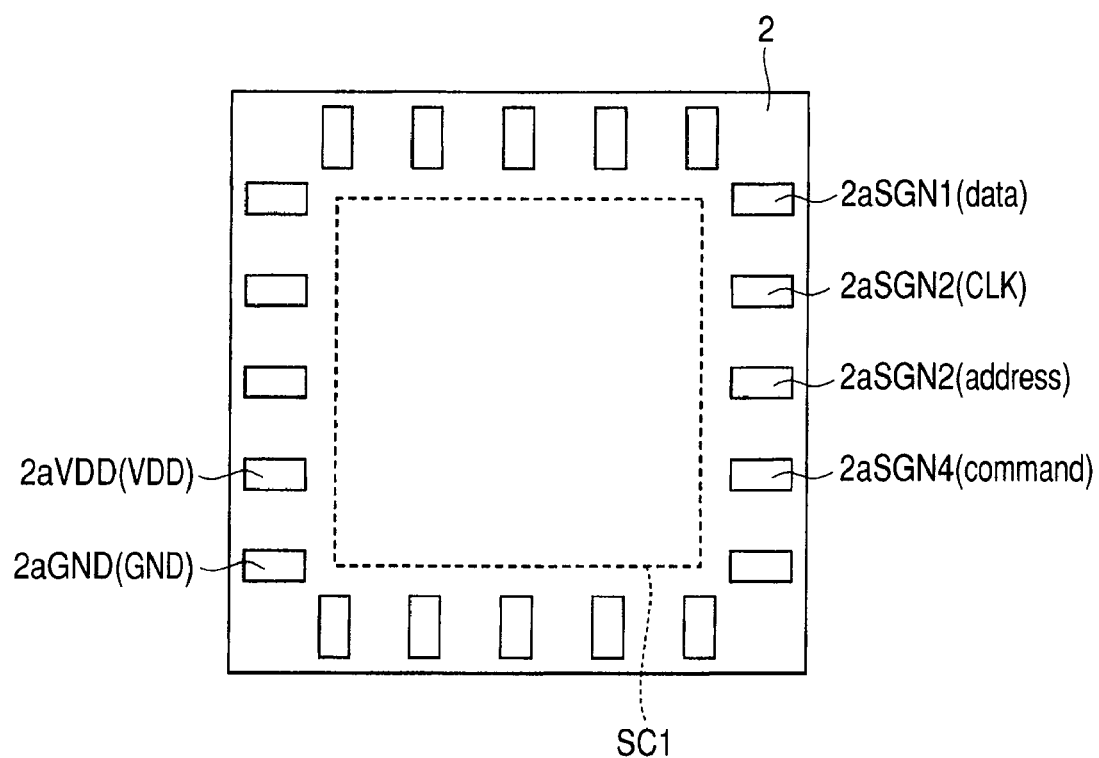
FIG. 5 is a plan view of a semiconductor chip used in the semiconductor device of Embodiment 1.
Figure 6:
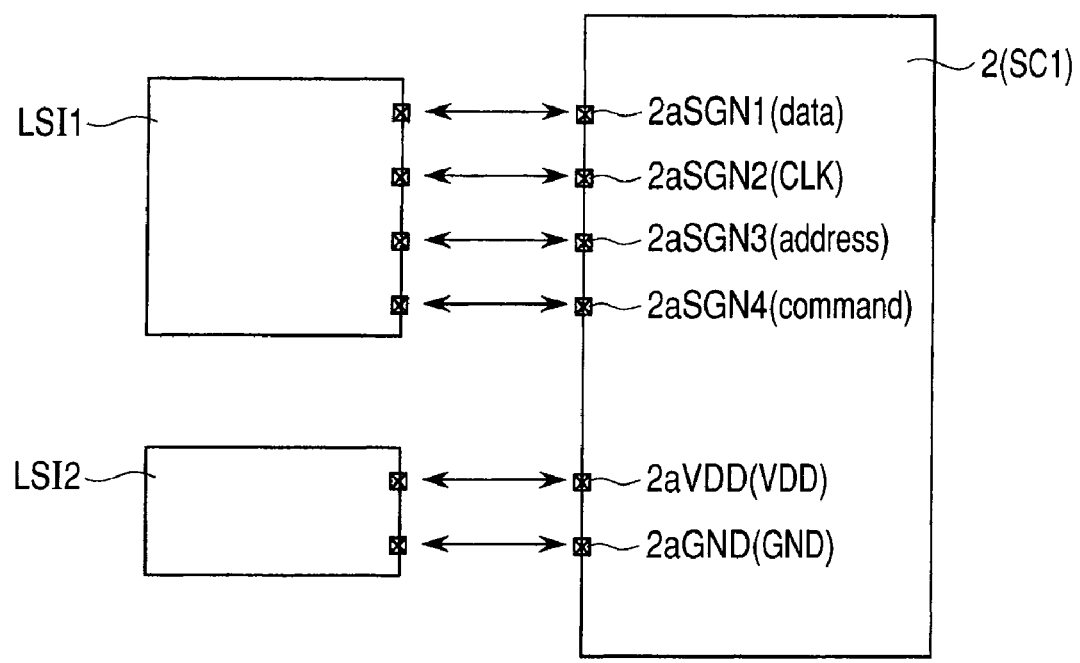
FIG. 6 is a circuit block diagram showing a coupling relationship between the semiconductor chip of FIG. 5 and external LSIs.
Figure 7:
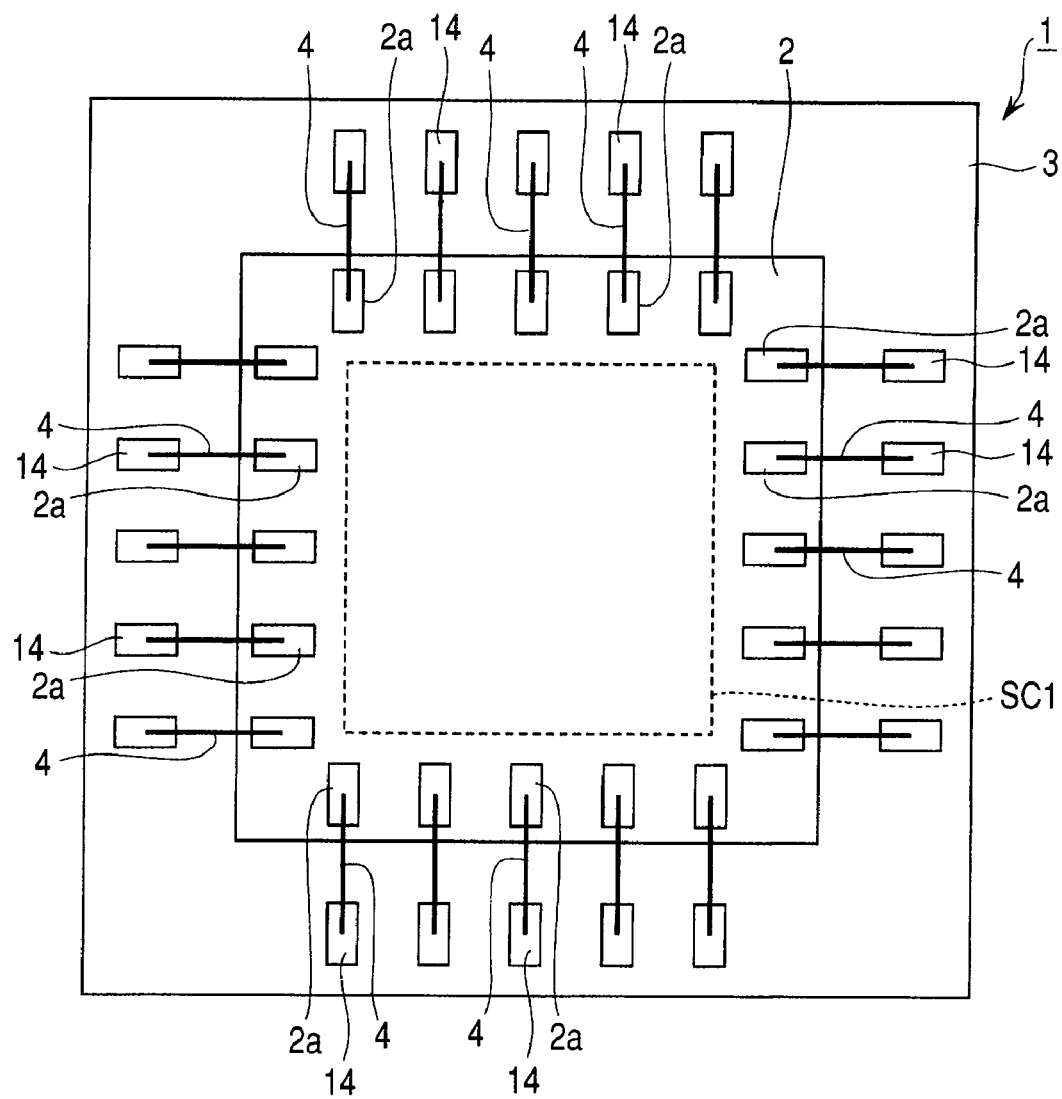
FIG. 7 is a plan perspective view of the semiconductor device of Embodiment 1.

FIG. 1 is a top view (plan view) of a semiconductor device 1 as an embodiment of the present invention. FIG. 2 is a bottom view (bottom surface view, back surface view, or plan view) of the semiconductor device 1. FIG. 3 is a side view of the semiconductor device 1. FIG. 4 is a cross-sectional view (side cross-sectional view) of the semiconductor device 1. A cross section along the line A1-A1 of each of FIGS. 1 and 2 substantially corresponds to FIG. 4. FIG. 5 is a conceptual plan view (top view) of a semiconductor chip 2 used in the semiconductor device 1. FIG. 6 is a circuit block diagram showing a coupling relationship between the semiconductor chip 2 and external LSIs. FIG. 7 is a conceptual plan perspective view (top view) of the semiconductor device 1 when the semiconductor device 1 is viewed through a mold resin 5.

The semiconductor device 1 of the present embodiment shown in FIGS. 1 to 4, and 7 is a ball grid array (BGA) type semiconductor package.

As shown in FIGS. 2 and 4, the semiconductor device 1 of the present embodiment includes a wiring substrate 3 having an upper surface (first surface, top surface, main surface, or chip supporting surface) 3a, a plurality of bonding leads 14 formed on the upper surface 3a, a lower surface (second surface, back surface, or main surface opposite to the upper surface 3a) 3b opposite to the upper surface, and a plurality of lands 16 formed on the second surface 3b. The plural lands 16 of the wiring substrate 3 include a first land group 56 (land group corresponding to a first solder ball group 51) arranged in a plurality of rows and arranged along the peripheral edge portion of the lower surface 3b of the wiring substrate 3, and a second land group (land group corresponding to a second solder ball group 52) arranged inside the first land group 56 (closer to the center portion of the lower surface 3b of the wiring substrate 3 than the first land group 56) in the lower surface 3b of the wiring substrate 3. In the first land group 56, the lands 16 are arranged with a first pitch (first spacing corresponding to a pitch $P_1$ described later). In the second land group 57, the lands 16 are arranged with a second pitch (second spacing corresponding to a pitch $P_2$ described later) higher than the first pitch.

As shown in FIG. 4, the semiconductor device 1 of the present embodiment has a semiconductor chip 2, the wiring substrate 3 for supporting or mounting thereon the semiconductor chip 2, a plurality of conductive members 4 electrically coupling a plurality of electrodes (electrode pads) 2a on the surface of the semiconductor chip 2 to the plural bonding leads 14 of the wiring substrate 3 corresponding thereto, a mold resin 5 covering the upper surface 3a of the wiring substrate 3 including the semiconductor chip 2 and the conductive members 4, and a plurality of solder balls 6 provided on the lower surface 3b of the wiring substrate 3. The conductive members 4 in Embodiment 1 are bonding wires (wires) made of, e.g., gold so that the conductive members 4 will be described hereinbelow as the bonding wires (conductive members) 4.

Hereinbelow, a description will be given of a detailed structure of the semiconductor device 1 of the present embodiment.

<Semiconductor Chip>

First, a structure of the semiconductor chip 2 will be described.

The semiconductor 2 is obtained by, e.g., forming various semiconductor integrated circuits (semiconductor elements) SC1 and the like in the respective device formation regions of the main surface of a semiconductor substrate (semiconductor wafer) made of single-crystal silicon or the like, polishing the back surface of the semiconductor substrate as necessary, and then dividing the semiconductor substrate into individual separate dies each serving as the semiconductor chip 2 by dicing or the like. The semiconductor chip 2 has a top surface (third surface or main surface on which the semiconductor element is formed) and a back surface (fourth surface or main surface opposite to the main surface on which the semiconductor element is formed) which oppose each other. The semiconductor chip 2 is disposed (mounted) on the upper surface (top surface, main surface, or chip supporting surface) 3a of the wiring substrate 3 such that the top surface thereof faces upward (such that the back surface thereof opposes the upper surface 3a of the wiring substrate 3). The back surface of the semiconductor chip 2 is bonded and fixed to the upper surface 3a of the wiring substrate 3 via an adhesive material (die bonding material, bonding material, or adhesive) 8. As shown in FIG. 5, a plan shape of the semiconductor chip 2 in a direction intersecting the thickness direction thereof is a rectangle, which is a square in the present embodiment. The semiconductor chip 2 has a thermal expansion coefficient (thermal expansivity) of, e.g., $3 \times 10^{-6}$/K (or /° C.). The size (outer dimension) of the semiconductor chip 2 is, e.g., □7 to 9 mm (square having sizes each measuring 7 to 9 mm).

Examples of the bonding material 8 that can be used include an insulating or conductive paste material and the like. As shown in FIG. 5, a plurality of electrodes (electrode pads or bonding pads) 2a are formed along the peripheral edge portion of the top surface (main surface) of the semiconductor chip 2. The electrodes 2a are electrically coupled to the semiconductor element or semiconductor integrated circuit SC1 formed within the semiconductor chip 2 or in the surface layer portion thereof via wires (not shown). The semiconductor chip 2 is disposed on the upper surface 3a of the wiring substrate 3, and has at least a part thereof molded with the mold resin 5.

A description will be given herein of a coupling relationship between the semiconductor integrated circuit SC1 formed on the main surface of the semiconductor chip 2 and the plural electrodes 2a with reference to FIGS. 5 and 6.

The semiconductor integrated circuit (circuit element) SC1 has a circuit for data signal which converts signal (input/output) data supplied from the external LSI, a circuit for clock which is supplied with a periodic signal (clock signal or clock pulse) for timing (synchronizing) the circuit for data signal when the circuit for data signal operates, a circuit for address which is supplied with an address signal, a circuit for command which is supplied with a command signal, a circuit for power source potential which is supplied with a power source potential for operating these circuits, and a circuit for reference potential which is supplied with a reference potential. The external LSIs are located outside the semiconductor device 1, and denoted by reference numerals LSI1 and LSI2 in FIG. 6. For example, the semiconductor chip 2 is a microcomputer chip.

The plural electrodes (electrode pads) 2a include electrodes 2aSGN1, 2aSGN2, 2aSGN3, 2aSGN4, 2aVDD, and 2aGND. The electrode (first electrode) 2aSGN1 is a pad (electrode) for external interface which is electrically coupled to the circuit for data signal to receive the signal (input/output) data supplied from the external LSI1. The electrode (second electrode) 2aSGN2 is a pad (electrode) for external interface which is electrically coupled to the circuit for clock to receive the clock signal supplied from external equipment. The electrode (third electrode) 2aSGN3 is a pad (electrode) for external interface which is electrically coupled to the circuit for address to receive the address signal. The electrode (fourth electrode) 2aSGN4 is a pad (electrode) for external interface which is electrically coupled to the circuit for command to receive the command signal. The electrodes (fifth electrodes) 2aVDD are pads (electrodes) which are electrically coupled to the circuit for power source potential to receive the power source potential. The electrodes (sixth electrodes) 2aGND are pads (electrodes) which are electrically coupled to the circuit for reference potential to receive the reference potential.

That is, the semiconductor chip 2 has the plural types of electrodes for signal (electrode pads for signal) 2aSGN1, 2aSGN2, 2aSGN3, and 2aSBN4, the electrodes for power source potential (electrode pads for power source potential) 2aVDD, and the electrodes for reference potential (electrode pads for reference potential) 2aGND. The plural electrodes for power source potential 2aVDD and the plural electrodes for reference potential 2aGND are provided, though the respective numbers thereof are not shown in detail. This allows reception of numerous power source potentials which are needed to operate the circuit, and further allows introduction of numerous reference potentials into the semiconductor integrated circuit SC1 of the semiconductor chip 2. As a result, it is possible to stably operate the semiconductor integrated circuit SC1.

<Wiring Substrate>

Next, a structure of the wiring substrate 3 will be described.

The wiring substrate (wiring substrate for package or package substrate) 3 serving as an interposer between the mounting substrate (motherboard corresponding to a wiring substrate 31 described later) and the semiconductor chip 2 has a base material layer (insulating substrate or core material) 11 impregnated with an insulating resin, and conductor layers (conductor patterns, conductor film patterns, or wiring layers) formed on the upper surface (first surface) and lower surface (second surface) of the base material layer 11. As shown in FIG. 7, the plan shape of the wiring substrate 3 intersecting the thickness direction is a rectangle, which is a square in the present embodiment. The size (outer dimension) of the wiring substrate 3 is, e.g., not less than □12 mm (square having sizes each measuring about 12 mm) in the present embodiment.

As the wiring substrate 3, there may be used a substrate in which conductor layers are formed on the upper and lower surfaces of a single insulating layer (base material layer 11) or a multilayer substrate (multilayer wiring substrate) in which a plurality of insulating layers (base material layers) and a plurality of conductor layers (wiring layers) are laminated. As the wiring substrate 3, a film- or a tape-type wiring substrate (tape substrate) having flexibility may also be used instead. For the base material layer 11 of the wiring substrate 3, a material such as, e.g., a resin material (e.g., a glass epoxy resin) obtained by impregnating glass fiber with resin or an organic polymer material can be used. Note that the thermal expansion coefficient (thermal expansivity) of the wiring substrate 3 used in Embodiment 1 is larger than the thermal expansion coefficient (thermal expansivity) of the semiconductor chip 2 made of silicon, and is in a range of, e.g., $11 \times 10^{-6}$ to $13 \times 10^{-6}$/K.

The conductor layers on the upper and lower surfaces of the base material layer 11 have been patterned, and can be formed of a conductive material such as a copper thin film formed by, e.g., a plating method. From the conductor layer on the upper surface of the base material layer 11, the plural bonding leads (electrodes, bonding pads, or pad electrodes) 14 for coupling to the bonding wires 4, and the plural wires 15 coupled (connected) thereto are formed on the upper surface 3a of the wiring substrate 3. The bonding leads 14 are parts of the wires 15, though not shown, and have widths larger than the widths of the wires 15. On the other hand, from the conductor layer on the lower surface of the base material layer 11, the plural conductive lands (electrodes, pads, or terminals) 16 for coupling to the solder balls 6 are formed on the lower surface (back surface or the main surface opposite to the upper surface 3a) 3b of the wiring substrate 3. As necessary, it is also possible to form solder resist layers SR1 and SR2 (which are not shown in FIG. 4, but are shown in FIGS. 8 and 9 described later) on the upper and lower surfaces 3a and 3b of the wiring substrate 3 (in that case, the solder layer SR1 is formed on the upper surface 3a of the wiring substrate 3, while the solder resist layer SR2 is formed on the lower surface 3b of the wiring substrate 3).

Figure 8:
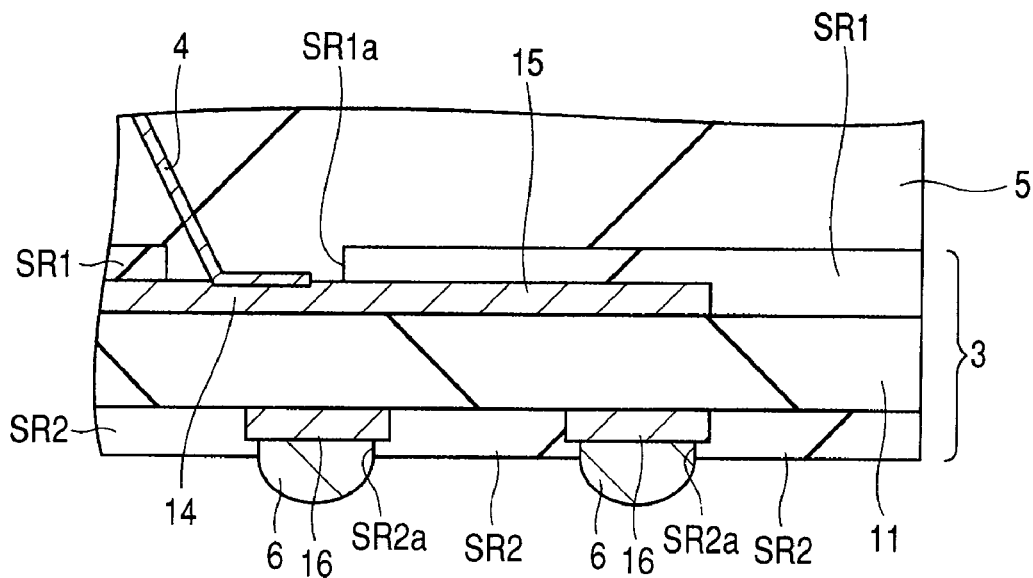
FIG. 8 is a partially enlarged cross-sectional view of FIG. 4.

In the present embodiment, as shown in FIG. 8, respective one surfaces of the bonding leads 14 and the lands 16 are exposed from the solder resist layers SR1 and SR2 (through openings SR1a and SR2a thereof), while the other conductor layers (such as the wires 15) are covered with the solder resist layers SR1 and SR2. FIG. 8 is an enlarged cross-sectional view (partially enlarged cross-sectional view) of the region R1 surrounded by the dotted line of FIG. 4. Preferably, the respective plan shapes of the lands 16 and the openings SR2a exposing the lands 16 are circles.

Figure 9:
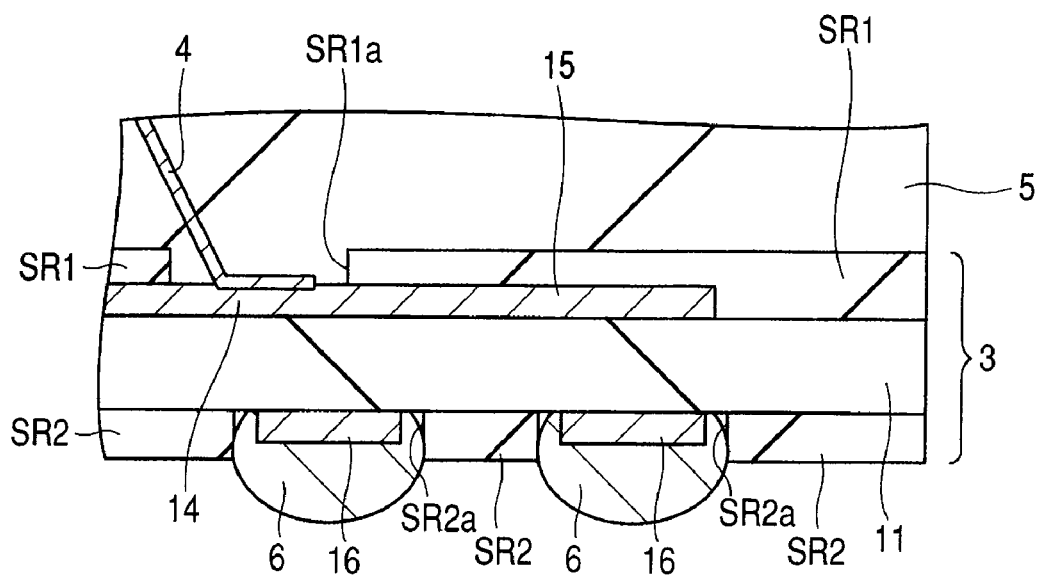
FIG. 9 is a partially enlarged cross-sectional view of FIG. 4.

Note that, instead of the structure of FIG. 8, each of the lands 16 may also have a structure in which not only one surface thereof, but also the side surfaces thereof are exposed, as shown in FIG. 9. Similarly to FIG. 8, FIG. 9 is an enlarged cross-sectional view (partially enlarged cross-sectional view) of the region R1 surrounded by the dotted line of FIG. 4. However, FIG. 9 corresponds to the case where the dimension (diameter) of each of the openings SR2a of the solder resist layer SR2 for exposing the lands 16 is set larger than the dimension (diameter) of each of the lands 16. As in FIG. 9, in the case where each of the lands 16 has the structure in which the side surfaces thereof are also exposed, a part of the solder ball 6 also wet-spreads over the side surfaces of the land 16. Accordingly, the radius (diameter) of the solder ball 6 formed on the land 16 shown in FIG. 9 is larger than the radius (diameter) of the solder ball 6 formed on the land 16 shown in FIG. 8.

As diagrammatically shown in FIG. 7, the plural bonding leads 14 exposed from the solder resist layer SR1 are formed (disposed) along the periphery of the semiconductor chip 2 mounted on the upper surface 3a of the wiring substrate 3, i.e., along each of the sides of the semiconductor chip 2.

As shown in FIG. 4, the bonding leads 14 on the upper surface 3a of the wiring substrate 3 are electrically coupled to the lands 16 on the lower surface 3b thereof via the wires 15, and via wires (conductors) 18 formed within vias (through holes) extending through the wiring substrate 3 from the upper surface 3a of the wiring substrate 3 (of the base material layer 11 thereof) toward the lower surface 3b thereof. Therefore, the plural electrodes 2a electrically coupled to the circuit element SC1 of the semiconductor chip 2 are electrically coupled to the plural bonding leads 14 of the wiring substrate 3 via the plural bonding wires (conductive members) 4 as the conductive members, and further electrically coupled to the plural lands 16 on the lower surface 3b of the wiring substrate 3 via the wires 15 of the wiring substrate 3, the conductors (via wires 18) within the through holes, and the like.

The plural lands 16 are arranged in an array configuration on the lower surface 3b of the wiring substrate 3. When described in detail, as shown in FIG. 2, the lands 16 include the first land group 56 arranged in a plurality of rows and arranged along the peripheral edge portion (each of the sides) of the lower surface 3b of the wiring substrate 3, and the second land group 57 arranged inside the first land group 56 (closer to the center portion of the lower surface (second surface) 3b of the wiring substrate 3 than the first land group 56) in the lower surface 3b of the wiring substrate 3.

Here, in FIG. 2, the dotted lines denoted by the reference numerals X, Y, and Z are virtual lines. The region enclosed by the dotted line denoted by the reference numeral X corresponds to the region where the first land group 56 (or the first solder ball group 51) is disposed. The region enclosed by the dotted line denoted by the reference numeral Y corresponds to the region where the second land group 57 (or the second solder ball group 52) is disposed. The region enclosed by the dotted line denoted by the reference numeral X corresponds to the region where terminals (lands) for testing 17 are disposed.

That is, in FIG. 2, the first land group 56 includes the lands 16 located within the region enclosed by the dotted line X. Therefore, those of the lands 16 belonging to the first land group 56 are referred to as lands 16a by giving the reference numeral 16a thereto, and also denoted by the reference numeral 16a in FIG. 2. On the other hand, in FIG. 2, the second land group 57 includes the lands 16 located within the region enclosed by the dotted line Y. Therefore, those of the lands 16 belonging to the second land group 57 are referred to as lands 16b by giving the reference numeral 16b thereto, and also denoted by the reference numeral 16b in FIG. 2.

At this time, as shown in FIG. 4, the second land group 57 (the lands 16b belonging thereto) is within a region which substantially two-dimensionally overlaps the semiconductor chip 2 mounted on the upper surface 3a of the wiring substrate 3. In the first land group 56, the lands 16 (which are the lands 16a herein) are arranged with the first pitch (first spacing corresponding to the pitch $P_1$ described later). On the other hand, in the second land group 57, the lands 16 (which are the lands 16b herein) are arranged with the second pitch (second spacing corresponding to the pitch $P_2$ described later) higher than the first pitch.

To the respective lands 16, the solder balls (ball electrodes, solder bumps, bump electrodes, or projecting electrodes) 6 serving as the external terminals are coupled (disposed thereon). Consequently, the plural solder balls 6 are arranged as solder bumps in an array configuration on the lower surface 3b of the wiring substrate 3, i.e., on the lower surface (main surface) of the semiconductor device 1. The lower surface of the semiconductor device 1 (i.e., the lower surface 3b of the wiring substrate 3) having the solder balls 6 disposed thereon serves as the mounting surface (main surface at which the semiconductor device 1 is mounted on the mounting substrate) of the semiconductor device 1. The solder balls 6 are made of a solder material, function as the bump electrodes (projecting electrodes or solder bumps) of the semiconductor device 1, and can function as the external terminals of the semiconductor device 1. The solder balls 6 can be considered as the solder bumps. The plural electrodes 2a of the semiconductor chip 2 are electrically coupled to the plural bonding leads 14 of the wiring substrate 3 via the plural bonding wires 4, and further electrically coupled to the plural lands 16 of the wiring substrate 3, and to the plural solder balls 6 coupled to the plural lands 16 via the wires 15, the conductors (via wires 18) within the through holes, and the like of the wiring substrate 3. The solder balls 6 which are not electrically coupled to the electrodes 2a of the semiconductor chip 2 can also be used for releasing heat.

In the vicinity of the center portion of the lower surface 3b of the wiring substrate 3 (at locations closer to the center portion of the lower surface 3b of the wiring substrate 3 than the second land group 57), the plural terminals (lands) for testing 17 are arranged. Note that, in FIG. 2, the terminals (lands) for testing 17 are located within the region enclosed by the dotted line Z. Each of the terminals 17 is formed of the land 16 which is not coupled to the solder ball 6. Thus, the plural lands 16 formed on the lower surface 3b of the wiring substrate 3 include the lands (i.e., the lands 16a and 16b) which are coupled to the solder balls 6, and the lands 16 serving as the terminals for testing 17 which are not coupled to the solder balls 6.

Similarly to the lands 16 which are coupled to the solder balls 6, the terminals for testing 17 are also electrically coupled to the electrodes 2a of the semiconductor chip 2 via the conductor layers (such as the conductors within the through holes, the wires 15, and the bonding leads 14) of the wiring substrate 3 and via the bonding wires 4. By applying probes for testing or the like to the terminals 17, the semiconductor device 1 can be tested (inspected). The testing (inspection) of the semiconductor device 1 using the terminals 17 is performed after the manufacturing of the semiconductor device 1 and prior to the mounting of the semiconductor device 1) (prior to the mounting thereof to, e.g., the wiring substrate 31 described later). The terminals 17 are terminals used for the testing (inspection) of the semiconductor device 1, and are therefore not used after the mounting of the semiconductor device 1 (after the mounting thereof to, e.g., the wiring substrate 31 described later). Hence, the terminals 17 of the semiconductor device 1 need not be electrically coupled to the terminals of the wiring substrate for mounting thereon the semiconductor device 1 (e.g., substrate terminals 32 of the wiring substrate 31 described later) so that the solder balls 6 are not coupled to the terminals 17. If the terminals for testing 17 are not needed, the formation thereof may also be omitted.

The mold resin (mold resin portion, molded portion, or molded body) 5 is made of, e.g., a resin material such as a thermosetting resin material, and can also contain a filler or the like. For example, the mold resin 5 can also be formed using an epoxy resin containing a filler or the like. The mold resin 5 is formed on the upper surface 3a of the wiring substrate 3 so as to cover the semiconductor chip 2 and the bonding wires 4. By the mold resin 5, the semiconductor chip 2 and the bonding wires 4 are molded and protected. Note that the thermal expansion coefficient of the mold resin 5 used in Embodiment 1 is smaller than the thermal expansion coefficient of the wiring substrate 3, but larger than the thermal expansion coefficient of the semiconductor chip 2 made of silicon. By forming such a mold resin 5 on the upper surface 3a of the wiring substrate 3, it is possible to reduce, to a certain degree, an expansion/contraction stress caused by the heat treatment step due to the difference between the thermal expansion coefficients of the semiconductor chip 2 and the wiring substrate 3.

Thus, the semiconductor device 1 of the present embodiment shown in FIGS. 1 to 4, and 7 is a semiconductor device (semiconductor package) in which the semiconductor chip 2 is mounted on the wiring substrate 3, and the solder balls 6 are bonded as the external terminals to the wiring substrate 3. The semiconductor device 1 is a semiconductor device in the form of a CSP (Chip Size Package) which is a small-size semiconductor package of about a size as large as or slightly larger than the semiconductor chip 2. The plan configuration of the semiconductor device 1 (wiring substrate 3) may be, e.g., a square having sides each measuring about 12 mm. The semiconductor device 1 has the solder balls 6 arranged in an array configuration, and can function as a semiconductor device in the form of the BGA package.

<Manufacturing Method of Semiconductor Device>

Figure 10:
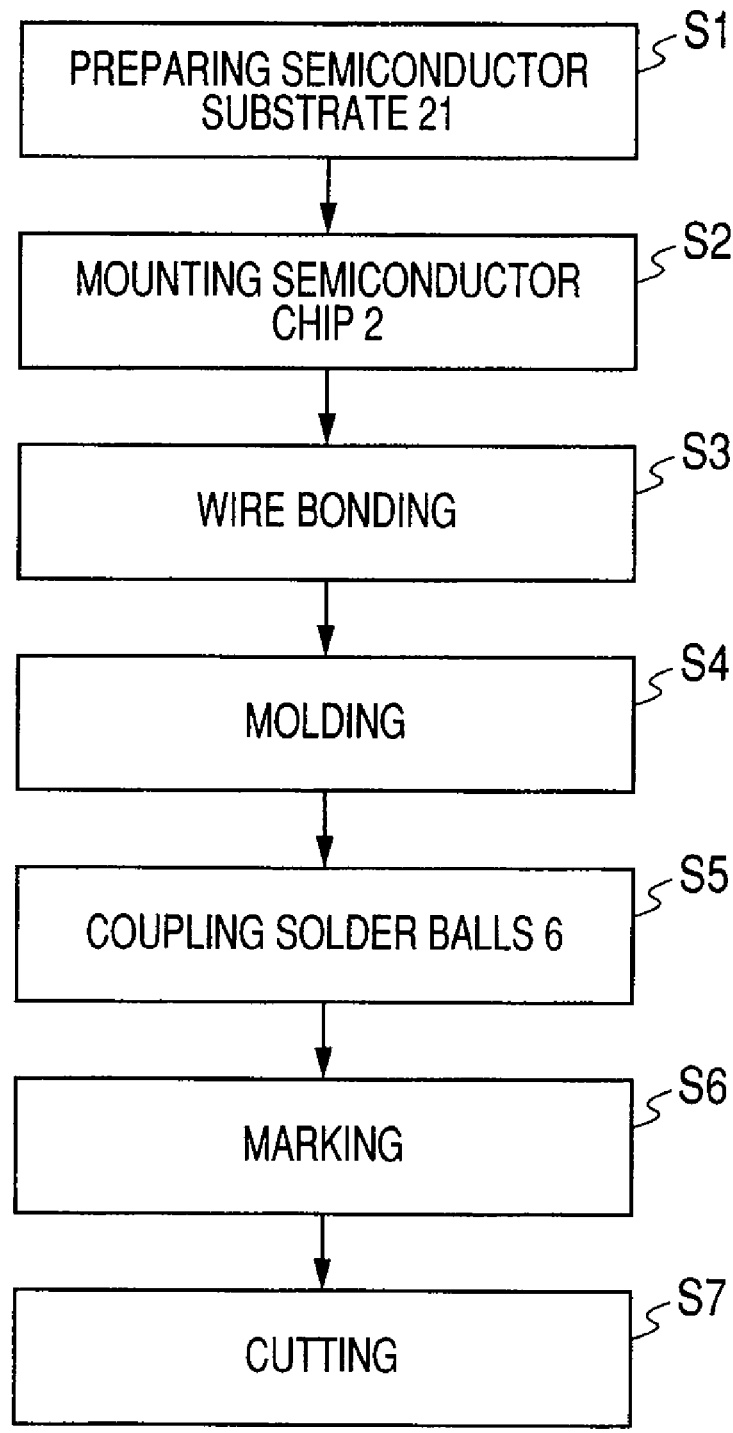
FIG. 10 is a process flow view showing the steps of manufacturing the semiconductor device of Embodiment 1.

Next, a manufacturing method of the semiconductor device 1 of the present embodiment will be described with reference to the drawings. FIG. 10 is a process flow view showing the steps of manufacturing the semiconductor device 1 of the present embodiment. FIGS. 11 to 15, and 22 are cross-sectional views of the semiconductor device 1 of the present embodiment in manufacturing steps thereof, each of which shows a cross section corresponding to FIG. 4 (cross section along the line A1-A1 of FIG. 2 described above) described above. FIGS. 16 to 21 are illustrative views (views for illustration) of a step of coupling the solder balls 6 in Step S5, which shows a cross section corresponding to the line B1-B1 of FIG. 2 described above.

In the present embodiment, a description will be given of a case where the individual semiconductor devices 1 are manufactured using a multi-piece wiring substrate (wiring substrate mother board) 21 in which the plural wiring substrates 3 are formed in connected relation in an array configuration.

Figure 11:
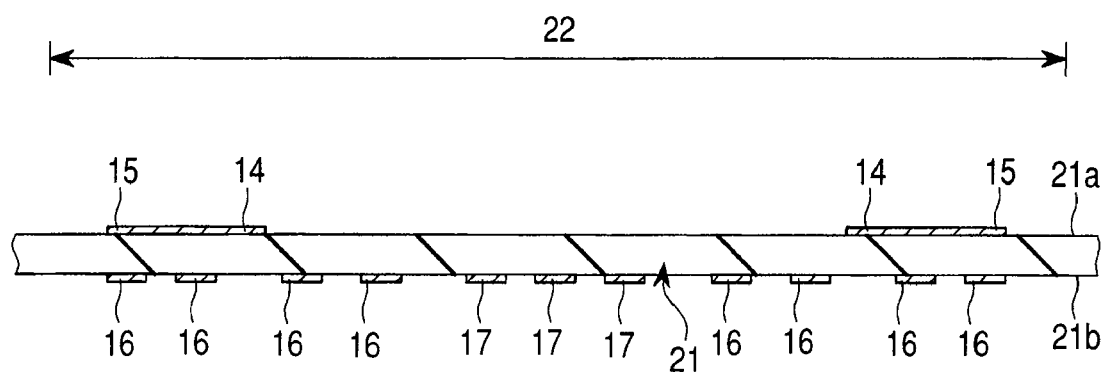
FIG. 11 is a cross-sectional view of the semiconductor device of Embodiment 1 in a manufacturing step thereof.

First, as shown in FIG. 11, the wiring substrate (interposer) 21 is prepared (Step S1). The wiring substrate 21 is the mother board of the wiring substrate 3 described above, and cut in a cutting step described later to be divided into individual separate pieces corresponding to individual semiconductor device regions (substrate regions or unit substrate regions) 22. Each of the semiconductor device regions 22 corresponds to the wiring substrate 3 of the semiconductor device 1. The wiring substrate 21 has a structure in which the plural semiconductor device regions 22, from each one of which one semiconductor device 1 is formed, are arranged in a matrix shape. Accordingly, each of the semiconductor device regions 22 of the upper surface 21a of the wiring substrate 21 is formed with the foregoing bonding leads 14 and the wires 15, and each of the semiconductor device regions 22 of the lower surface 21b of the wiring substrate 21 is formed with the foregoing lands 16 and the foregoing terminals for testing 17.

Figure 12:
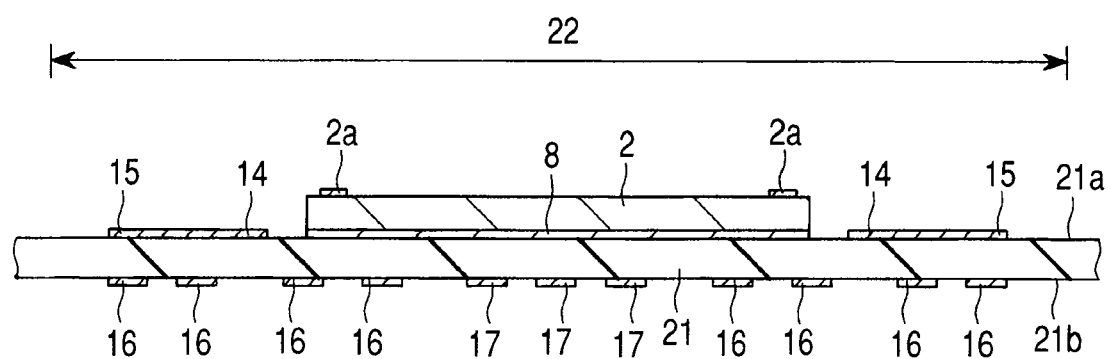
FIG. 12 is a cross-sectional view of the semiconductor device in a manufacturing step thereof, which is subsequent to FIG. 11.

Next, as shown in FIG. 12, the semiconductor chips 2 are bonded (die-bonded or chip-mounted) onto the respective semiconductor device regions 22 of the upper surface 21a of the wiring substrate 21 via the bonding material 8 (Step S2). Examples of the bonding material 8 include an insulating bonding material but, a conductive bonding material such as a silver paste can also be used. For example, the bonding material 8 is applied to a substantially center portion of each of the semiconductor device regions 22 of the upper surface 21a of the wiring substrate 21 to form an adhesive layer for chip fixation, the semiconductor chip 2 is placed on the adhesive material 8, and heating or the like is performed to enable the bonding of the upper surface 21a of the wiring substrate 21 to the back surface of the semiconductor chip 2 via the bonding material 8.

Figure 13:
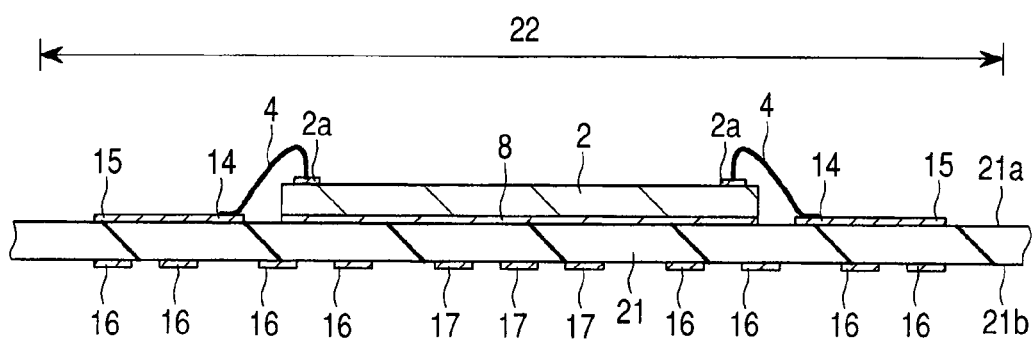
FIG. 13 is a cross-sectional view of the semiconductor device in a manufacturing step thereof, which is subsequent to FIG. 12.

Next, as shown in FIG. 13, the wire bonding step is performed to electrically couple the individual electrodes 2a of the semiconductor chip 2 to the bonding leads 14 corresponding thereto that have been formed on the wiring substrate 21 via the bonding wires 4 (Step S3). That is, the plural bonding leads 14 over each of the semiconductor device regions 22 of the upper surface 21a of the wiring substrate 21 are electrically coupled to the plural electrodes 2a of the semiconductor chip 2 bonded (mounted) onto the semiconductor device region 22 via the plural bonding wires 4.

Figure 14:
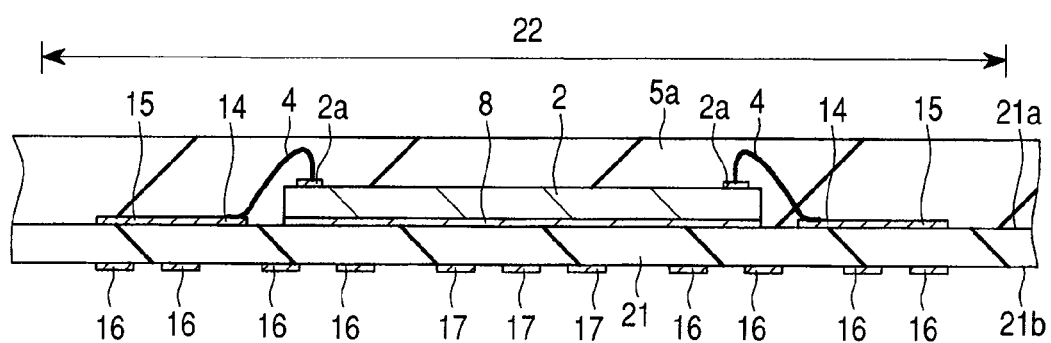
FIG. 14 is a cross-sectional view of the semiconductor device in a manufacturing step thereof, which is subsequent to FIG. 13.

After the wire bonding step, as shown in FIG. 14, resin molding is performed by a mold step (e.g., a transfer mold step) to form a mold resin 5a (molded portion), and mold (resin mold) the semiconductor chip 2 and the bonding wires 4 with the mold resin 5a (Step S4). In the molding step, simultaneous molding is performed which simultaneously molds the plural semiconductor device regions 22 of the upper surface 21a of the wiring substrate 21 with the mold resin 5a. That is, the mold resin 5a is formed so as to cover the semiconductor chips 2 and the bonding wires 4 over the plural semiconductor device regions 22 of the upper surface 21a of the wiring substrate 21. For this purpose, the mold resin 5a is formed so as to cover the plural semiconductor device regions 22 of the upper surface 21a of the wiring substrate 21. The mold resin 5a is made of, e.g., a resin material such a thermosetting resin material or the like, and can also contain a filler or the like. For example, the mold resin 5a can be formed using an epoxy resin containing a filler. For example, the mold resin 5a can be formed by injecting the mold resin material into a cavity of a mold die disposed over the wiring substrate 21, and curing the mold resin material by heating.

Figure 15:
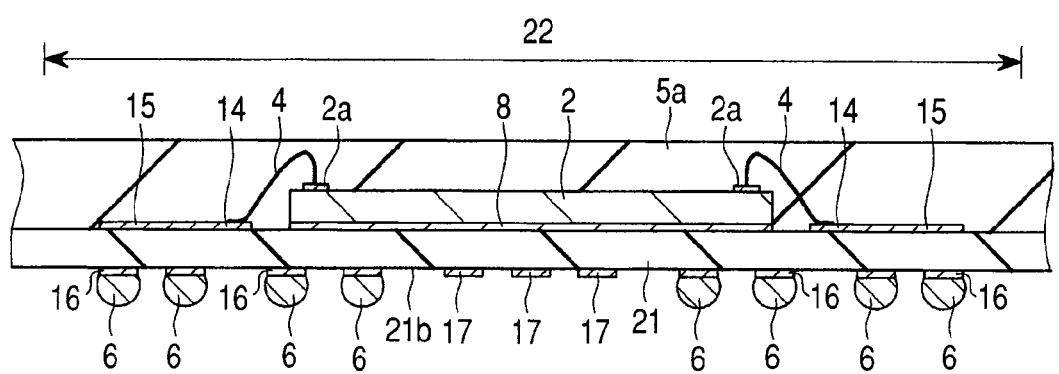
FIG. 15 is a cross-sectional view of the semiconductor device in a manufacturing step thereof, which is subsequent to FIG. 14.

Next, as shown in FIG. 15, the solder balls 6 are coupled (bonded) to the lands 16 on the lower surface 21b of the wiring substrate 21 (Step S5).

An example of the step of coupling the solder balls 6 in Step S5 will be described with reference to FIGS. 16 to 21.

Figure 16:
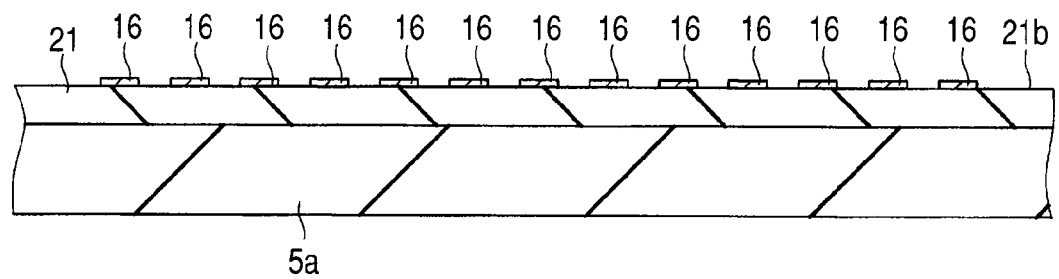
FIG. 16 is an illustrative view of a step of coupling solder balls.
Figure 17:
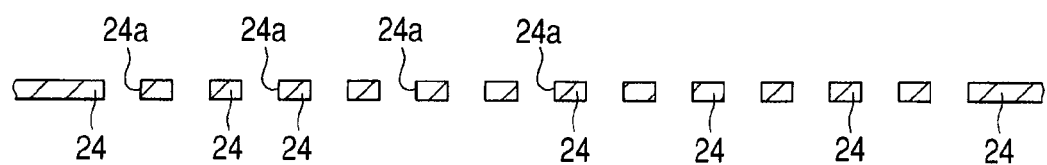
FIG. 17 is an illustrative view of the step of coupling the solder balls.

The wiring substrate 21 formed with the mold resin 5a is disposed such that the lower surface 21b of the wiring substrate 21 faces upward, as shown in FIG. 16. Aside from this, a mask 24 for attracting the solder balls by suction as shown FIG. 17 is prepared. The mask 24 has a structure in which, e.g., a plurality of holes (through holes 24a) are provided in a member having a flat plate shape. The arrangement (layout locations) of the plural holes 24a in the mask 24 corresponds to the arrangement (layout locations) of the lands 16 on the lower surface 21b of the wiring substrate 21, and corresponds to the arrangement of the solder balls 6 to be disposed on the lower surface 21b of the wiring substrate 21 (lower surface 3b of the wiring substrate 3).

Figure 18:
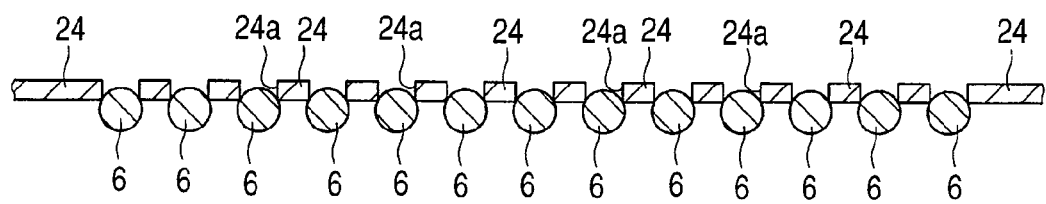
FIG. 18 is an illustrative view of the step of coupling the solder balls, which is subsequent to FIG. 17.

Then, as shown in FIG. 18, the solder balls 6 are attracted by suction to the respective holes 24a of the mask 24. By setting the diameters of the holes 24a smaller than the diameters of the solder balls 6, and bringing the mask 24 closer to the solder balls 6, while sucking in outer air through the holes 24a, the solder balls 6 can be attracted by suction to the respective holes 24a of the mask 24.

Figure 19:
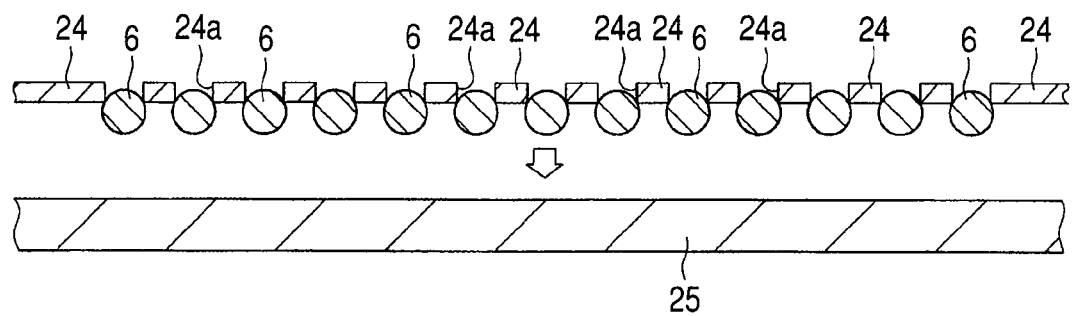
FIG. 19 is an illustrative view of the step of coupling the solder balls, which is subsequent to FIG. 18.

Next, as shown in FIG. 19, the solder balls 6 attracted by suction to the respective holes 24a of the mask 24 are dipped in a flux 25 so that the flux 25 is applied to each of the solder balls 6.

Figure 20:
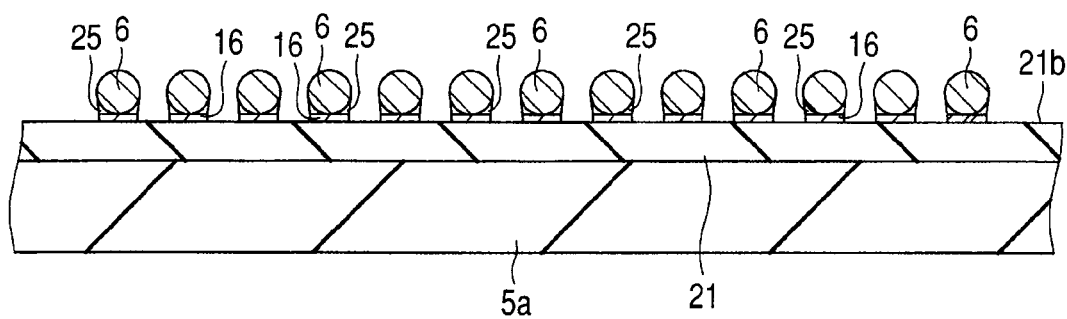
FIG. 20 is an illustrative view of the step of coupling the solder balls, which is subsequent to FIG. 19.
Figure 21:
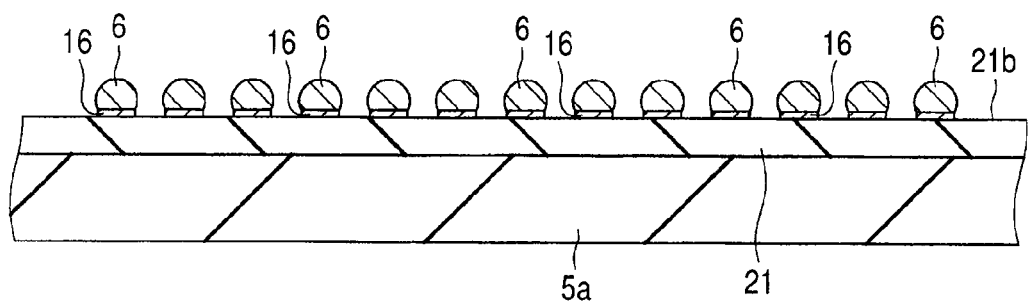
FIG. 21 is an illustrative view of the step of coupling the solder balls, which is subsequent to FIG. 20.

Next, as shown in FIG. 20, the solder balls 6 attracted by suction to the respective holes 24a are disposed on the lands 16 on the lower surface 21b of the wiring substrate 21. After the suction through the holes 24a is stopped, the mask 24 is pulled away from the solder balls 6. As a result, the plural solder balls 6 are disposed on the plural lands 16 on the lower surface 21b of the wiring substrate 21, and temporarily fixed with the flux 25. Thereafter, the solder is molten by performing a solder reflow process (reflow process or heat treatment) as a heat treatment, and resolidified to allow the solder balls 6 to be bonded, and electrically coupled to the lands 16 on the lower surface 21b of the wiring substrate 21. Thereafter, it is also possible to perform a cleaning step as necessary, and remove the flux 25 attached to the surfaces of the solder balls 6 or the like. Note that, in the mask 24, the holes 24a are not provided at positions corresponding to the terminals for testing 17, and therefore the solder balls 6 are not coupled onto the terminals for testing 17, but are coupled onto the lands 16 other than the terminals for testing 17, as shown in FIG. 15 described above.

Thus, in Step S5, the solder balls 6 serving as the external terminals of the semiconductor device 1 are boned to the lower surface 21b of the wiring substrate 21. The solder balls 6 bonded to the lower surface 21b of the wiring substrate 21 can be regarded as the solder bumps (bump electrodes). In the present embodiment, the description has been given of the case where the solder balls 6 are joined as the external terminals of the semiconductor device 1 to the lands 16, but the present invention is not limited thereto. It is also possible to, e.g., supply a solder onto the lands 16 by a printing method or the like, instead of bonding the solder balls 6, and thereby form solder bumps (bump electrodes) serving as the external terminals of the semiconductor device 1 on the lands 16 (corresponding to Embodiment 4 described later). As the material of the external terminals (which are the solder balls 6 herein) of the semiconductor device 1, either one of a lead-containing solder and a lead-free solder not containing lead can be used. However, when attention is focused on measures against the environmental pollution problem, it is more preferable to use a lead-free solder not containing lead (Pb). As the material of the lead-free solder, tin (Sn) only, or a tin (Sn) alloy layer made of a tin (Sn)-bismuth (Bi) alloy, a tin (Sn)-silver (Ag)-copper (Cu) alloy, or the like is preferred. In the case of using an alloy layer, the problem of whisker formation can be inhibited more reliably than in the case of using solder balls formed only of tin.

Next, marking is performed as necessary to give a mark such as a product number to the surface of the mold resin 5a (Step S6). For example, laser marking which performs marking with laser light can be performed, or ink marking which performs marking with ink can also be performed. It is also possible to change the order of the step of coupling the solder balls 6 in Step S5 and the marking step in Step S6, and thereby perform the marking step in Step S6, and then perform the step of coupling the solder balls 6 in Step S5. When unneeded, the marking step in Step S6 may also be omitted.

Figure 22:
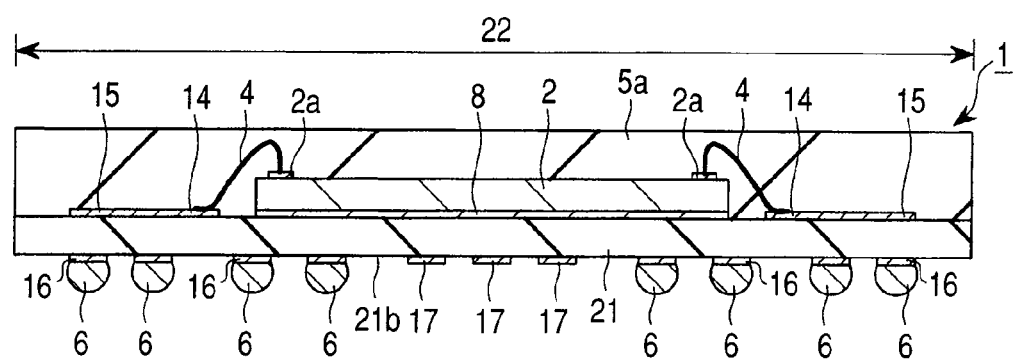
FIG. 22 is a cross-sectional view of the semiconductor device in a manufacturing step thereof, which is subsequent to FIG. 15.

Next, as shown in FIG. 22, the wiring substrate 21 and the mold resin 5a formed thereover are cut (by dicing) to be separated (divided) into the individual semiconductor device regions 22 (Step S7). By thus performing the cutting/singulation, the semiconductor devices 1 as shown in FIGS. 1 to 4, and 7 described above can be manufactured. The wiring substrate 21 after separated (divided) into the individual semiconductor device regions 22 corresponds to the wiring substrate 3, and the mold resin 5a after separated (divided) into the individual semiconductor device regions 22 corresponds to the mold resin 5.

After the manufacturing of the semiconductor devices 1, inspection (testing) of the semiconductor devices 1 can be performed by bringing a tester or the like into contact with the terminals for testing 17 on the lower surface 3b of the wiring substrate 3. A screening test for determining whether the semiconductor devices 1 are non-defective products or defective products can be performed. The semiconductor devices 1 sorted out as non-defective products are mounted on mounting substrates or the like, and used. Therefore, the inspection using the terminals for testing 17 is performed prior to a step of mounting the semiconductor device 1 described next.

<Manufacturing Method of Semiconductor Module>

Figure 23:
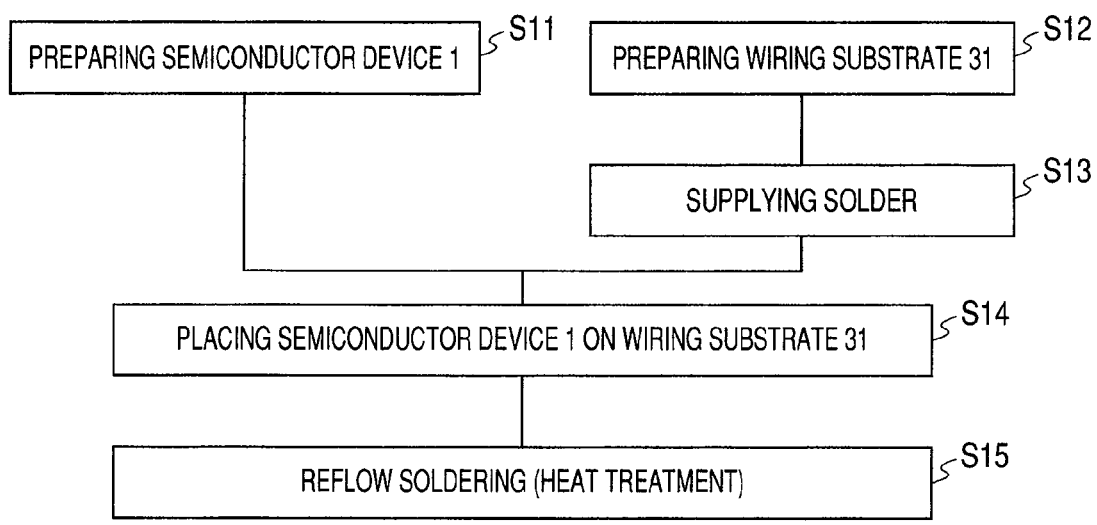
FIG. 23 is a process flow view showing a part of the steps of manufacturing a semiconductor module of Embodiment 1.
Figure 24:
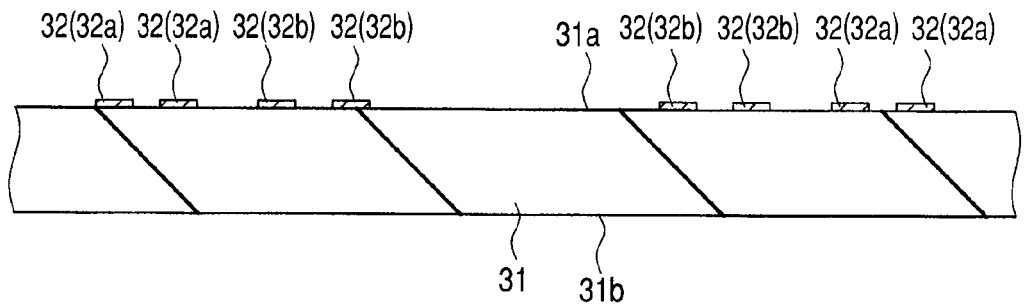
FIG. 24 is a cross-sectional view of a wiring substrate for mounting thereon the semiconductor device of Embodiment 1.
Figure 25:
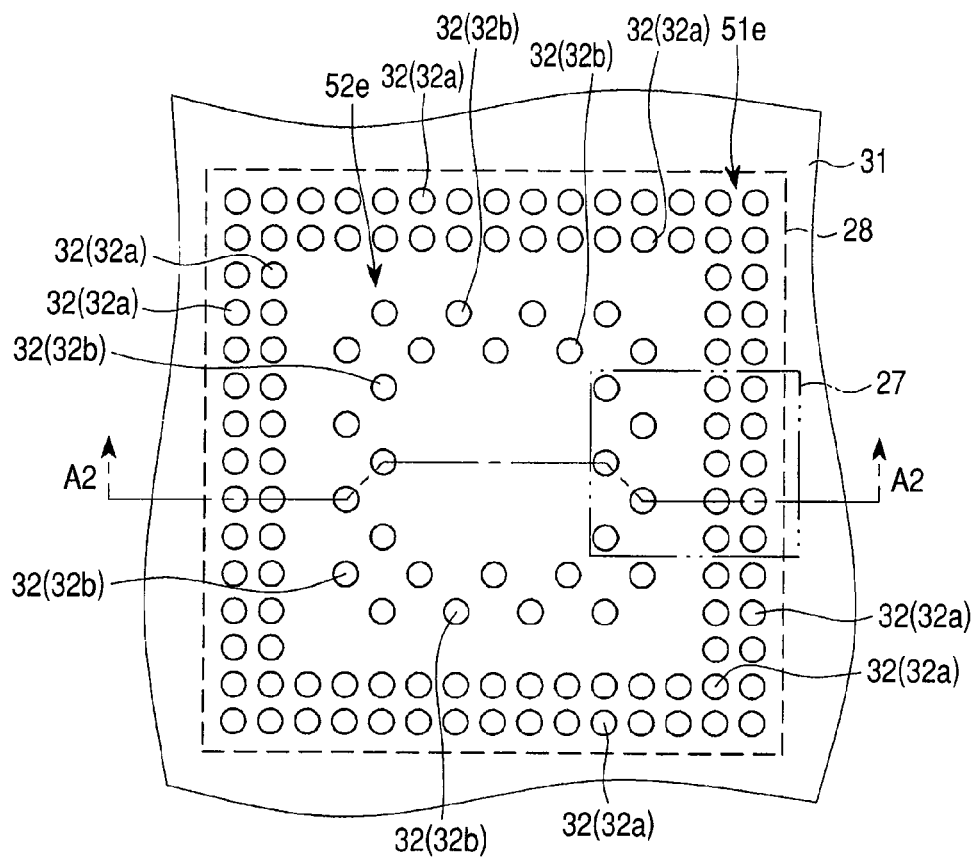
FIG. 25 is a plan view of the wiring substrate of FIG. 24.
Figure 26:
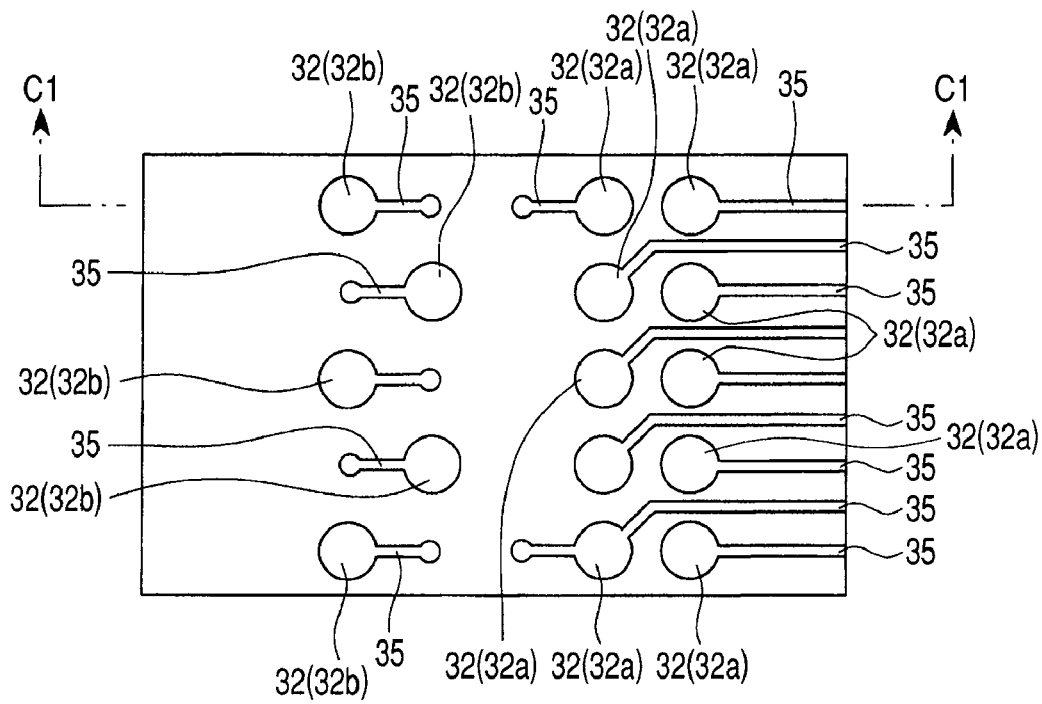
FIG. 26 is a partially enlarged plan view of the wiring substrate of FIG. 25.
Figure 27:
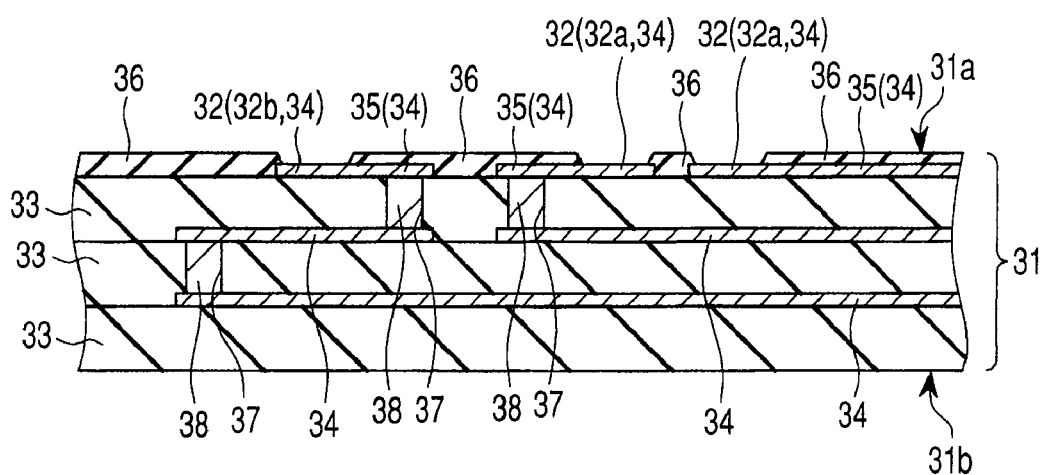
FIG. 27 is a partially enlarged cross-sectional view of the wiring substrate of FIG. 24.
Figure 28:
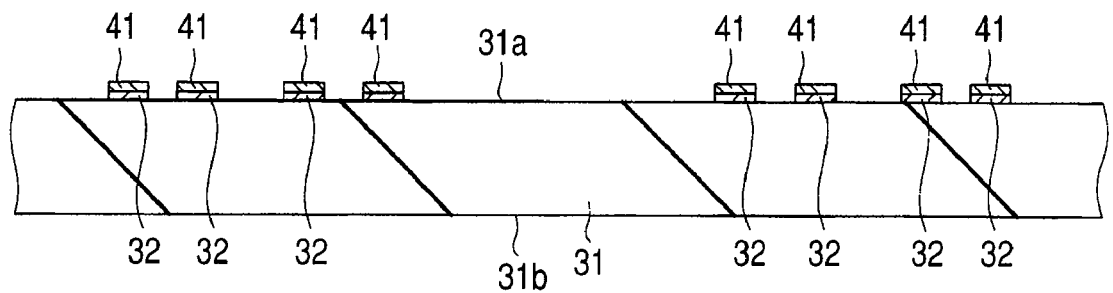
FIG. 28 is a cross-sectional view of the semiconductor module of Embodiment 1 in a manufacturing step thereof.
Figure 29:
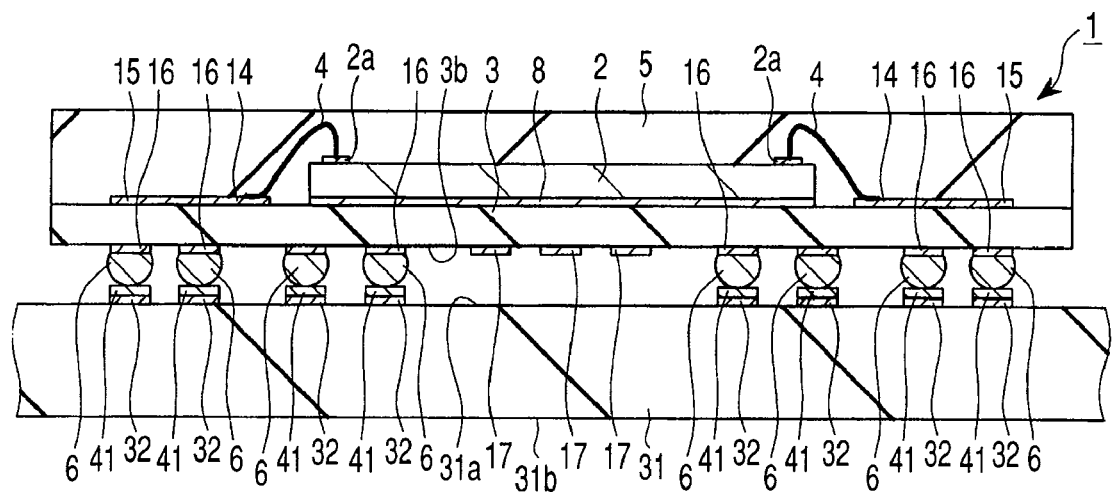
FIG. 29 is a cross-sectional view of the semiconductor module in a manufacturing step thereof, which is subsequent to FIG. 28.
Figure 30:
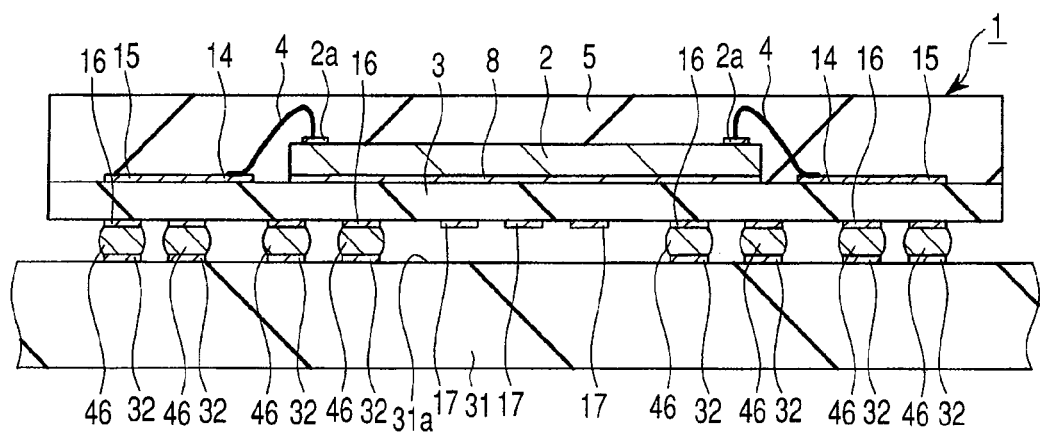
FIG. 30 is a cross-sectional view of the semiconductor module in a manufacturing step thereof, which is subsequent to FIG. 29.
Figure 31:
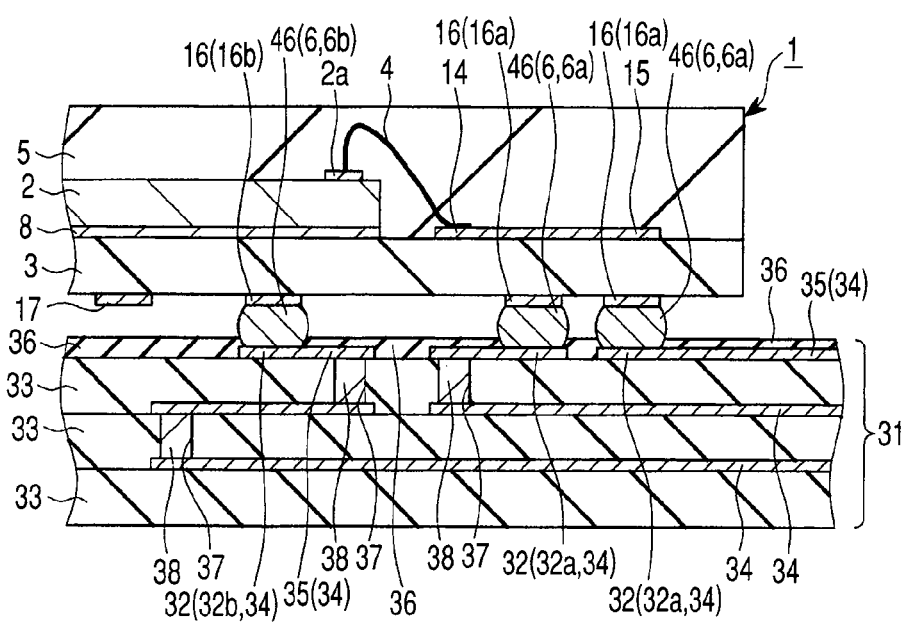
FIG. 31 is a partially enlarged cross-sectional view of FIG. 30.
Figure 32:
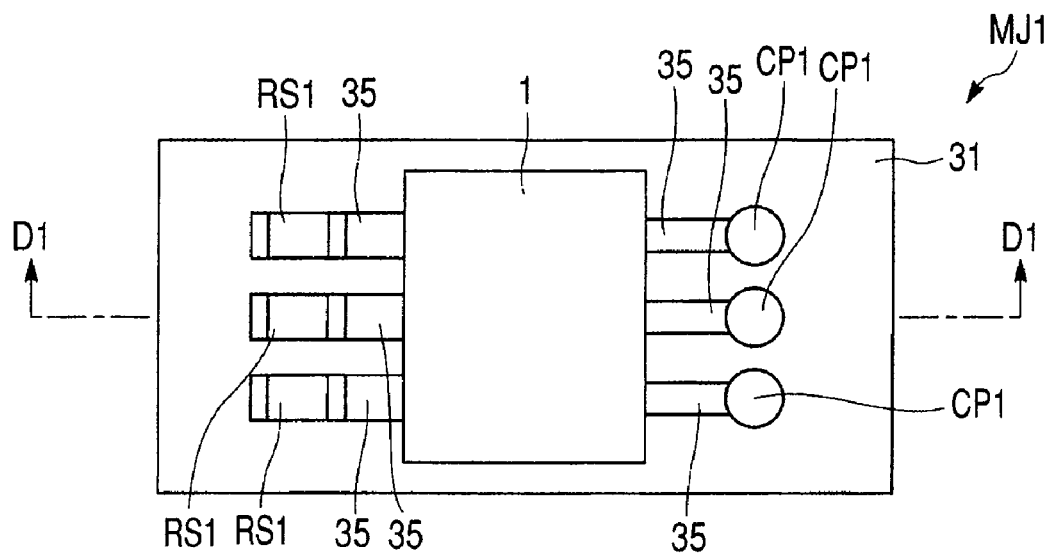
FIG. 32 is a plan view showing an example of the semiconductor module manufactured in Embodiment 1.
Figure 33:
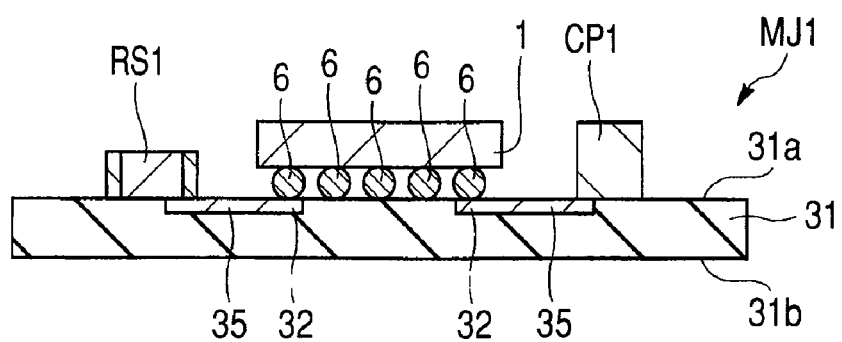
FIG. 33 is a cross-sectional view showing an example of the semiconductor module manufactured in Embodiment 1.

Next, a method of manufacturing a semiconductor module by mounting the semiconductor device 1 of the present embodiment on the mounting substrate (motherboard) will be described with reference to the drawings. FIG. 23 is a process flow view showing a part (the step of mounting the semiconductor device 1) of the steps of manufacturing the semiconductor module. FIG. 24 is a cross-sectional view (principal-portion cross-sectional view) of the wiring substrate 31 as the mounting substrate for mounting thereon the semiconductor device 1. FIG. 25 is a plan view (principal-portion plan view) of the wiring substrate 31. FIG. 26 is a partially enlarged plan view of FIG. 25. FIG. 27 is a partially enlarged cross-sectional view of the wiring substrate 31. Note that a cross-sectional view along the line A2-A2 of FIG. 25 substantially corresponds to FIG. 24, an enlarged view of a region 27 enclosed by the two-dot chain line of FIG. 25 substantially corresponds to FIG. 26, and a cross section along the line C1-C1 of FIG. 26 substantially corresponds to FIG. 27. For the sake of easier understanding, FIG. 26 shows the respective patterns of the substrate terminals 32 and lead-out wires 35 when viewed through the solder resist layer 36 of the wiring substrate 31. When the semiconductor device 1 is mounted on the wiring substrate 31, the A2-A2 line of FIG. 25 two-dimensionally coincides with the line A1-A1 of FIGS. 1 and 2 described above. In FIG. 25, a region (region where the semiconductor device 1 is mounted) 28 which is two-dimensionally overlapped by the semiconductor device 1 when the semiconductor device 1 is mounted on the wiring substrate 31 is also indicated by the dotted line. FIGS. 28 to 30 are cross-sectional views (principal-portion cross-sectional views) of the semiconductor module of the present embodiment in a manufacturing step (the step of mounting the semiconductor device) thereof, which show cross sections corresponding to FIG. 24 described above, i.e., the cross sections corresponding also to FIG. 4 described above. FIG. 31 is a partially enlarged cross-sectional view of FIG. 30. FIGS. 30 and 31 show a state where the semiconductor device 1 is mounted on the wiring substrate 31. FIGS. 32 and 33 are a plan view and a cross-sectional view each diagrammatically showing an example of a manufactured semiconductor module MJ1. A cross section along the line D1-D1 of FIG. 32 substantially corresponds to FIG. 33.

First, in the same manner as in Steps S1 to S7 described above, the semiconductor device 1 is prepared (Step S11), and the wiring substrate 31 as the mounting substrate for mounting thereon the semiconductor device 1 is prepared (Step S12). The preparation (manufacturing) of the wiring substrate 31 in Step S12 may be performed before, after, or simultaneously with the preparation (manufacturing) of the semiconductor device 1 in Step S11. The thermal expansion coefficient (thermal expansivity) of the wiring substrate 31 is in a range of, e.g., $14 \times 10^{-6}$ to $16 \times 10^{-6}$/K.

As shown in FIGS. 24 to 27, the wiring substrate (mounting substrate or motherboard) 31 has the plural substrate terminals (coupling terminals, electrodes, pad electrodes, or conductive lands) 32 for individually coupling the plural external terminals (which are the solder balls 6 herein) of the semiconductor device 1 on the upper surface (top surface or main surface) 31a as the mounting surface for mounting thereon the semiconductor device 1. Note that, in FIG. 24, the cross-sectional structure of the wiring substrate 31 is shown in a simplified manner but, when depicted in detail, the wiring substrate 31 has a cross-sectional structure as shown in FIG. 27.

Preferably, the wiring substrate 31 is a multilayer wiring substrate (multilayer substrate) in which a plurality of insulator layers (dielectric layers or insulating base material layers) 33 and a plurality of wiring layers (conductor layers or conductor pattern layers) 34 are integrally laminated. In FIG. 27, the three insulator layers are laminated to form the wiring substrate 31, but the number of the laminated insulator layers 33 is not limited thereto, and can be changed variously.

Also in FIG. 27, the wiring layers 34 are formed on the upper surface 31a of the wiring substrate 31 and between the insulator layers 33. However, if necessary, the wiring layer 34 can also be formed on the lower surface (back surface) 31b of the wiring substrate 31. Examples of a material for forming the insulator layers 33 of the wiring substrate 31 that can be used include a ceramic material such as alumina (aluminum oxide or $Al_2O_3$), a resin material (e.g., a glass epoxy resin), and the like.

From the uppermost wiring layer 34 of the wiring substrate 31, the plural substrate terminals 32 made of a conductor, and the lead-out wires 35 coupled to the respective substrate terminals 32 are formed on the upper surface 31a of the wiring substrate 31. The substrate terminals 32 are for coupling to the solder balls (bump electrodes) 6 serving as the external terminals of the semiconductor device 1. When the semiconductor device 1 is mounted on the upper surface 31a of the wiring substrate 31, the substrate terminals 32 are disposed at locations facing (two-dimensionally overlapping) the solder balls 6. Therefore, the plural substrate terminals 32 are formed on the region of the upper surface 31a of the wiring substrate 31 where the semiconductor device 1 is planned to be mounted. The arrangement of the plural substrate terminals 32 corresponds to the arrangement of the solder balls 6 on the lower surface of the semiconductor device 1 (i.e., on the lower surface 3b of the wiring substrate 3). That is, the plural substrate terminals 32 of the wiring substrate 31 are in the arrangement (the same as the arrangement of the solder balls 6) corresponding to the arrangement of the solder balls (bump electrodes) 6 serving as the external terminals of the semiconductor device 1. In addition, if necessary, other terminals (terminals other than the substrate terminals 32) can also be formed on the region of the upper surface 31a of the wiring substrate 31 other than the region thereof where the semiconductor device 1 is planned to be mounted, and an electronic component other than the semiconductor device 1 and the like can also be mounted thereon.

The substrate terminals 32 and the lead-out wires 35 coupled thereto are formed integrally from the same wiring layer 34 (the uppermost wiring layer 34 of the wiring substrate 31). That is, as shown in FIG. 26, the substrate terminals 32 are a part of the lead-out wires 35, and have widths larger than the widths of the lead-out wires 35. The lead-out wires 35 can function as wires for coupling the substrate terminals 32 to the other terminals of the wiring substrate 31. Further, the solder resist layer 36 is formed on the upper surface 31a of the wiring substrate 31 so as to expose each of the substrate terminals 32, and cover the other region, and the lead-out wires 35 are covered with the solder resist layer 36. As necessary, the wiring layers 34 forming the wiring substrate 31 are electrically coupled via the conductors within via holes (through holes or holes) 37 formed in the insulator layers 33 or via conductor films 38.

Next, as shown in FIG. 28, a solder paste (solder or cream solder) 41 is supplied (printed, given, applied, or disposed) onto the plural substrate terminals 32 of the wiring substrate 31 (Step S13). At this time, the solder paste 41 can be supplied onto the plural substrate terminals of the wiring substrate 31 by, e.g., a printing method using a mask (not shown) for solder printing.

Next, the semiconductor device 1 is mounted (disposed) on the wiring substrate 31 (Step S14).

In the step of mounting the semiconductor device 1 on the wiring substrate 31 in Step S14, as shown in FIG. 29, the semiconductor device 1 is disposed on the upper surface 31a of the wiring substrate 31 such that the main surface of the semiconductor device 1 where the solder balls 6 are formed (i.e., the lower surface 3b of the wiring substrate 3) faces the main surface of the wiring substrate 31 where the substrate terminals 32 are formed (i.e., the upper surface 31a of the wiring substrate 31). At this time, the semiconductor device 1 is aligned and mounted (disposed) on the upper surface 31a of the wiring substrate 31 such that the plural substrate terminals 32 of the wiring substrate 31 oppose the plural solder balls 6 of the semiconductor device via the solder (solder paste 41) supplied onto the substrate terminals 32 in Step S13. Consequently, the individual solder balls 6 of the semiconductor device 1 oppose the respective substrate terminals 32 of the wiring substrate 31 via the solder paste 41 provided on each of the substrate terminals 32 of the wiring substrate 31. It follows that, at this time, the solder balls 6 substantially two-dimensionally overlap the solder paste 41 and the substrate terminals 32. The adhesive property of the solder paste 41 on the substrate terminals 32 of the wiring substrate 31 allows the solder balls 6 of the semiconductor device 1 to be temporarily fixed to the substrate terminals 32 of the wiring substrate 31.

After the semiconductor device 1 is mounted (disposed) on the wiring substrate 31, the solder reflow process (reflow process or heat treatment) is performed as the heat treatment (Step S15). FIGS. 30 and 31 show a state after the solder reflow process in Step S15.

For example, the wiring substrate 31 (structure of FIG. 29) on which the semiconductor device 1 is mounted as described above is caused to pass through a reflow oven, which is not shown, or the like so that the solder (solder paste 41 and the solder balls 6) heated in the reflow oven melts to bond together the substrate terminals 32 of the wiring substrate 31 and the solder balls 6 of the semiconductor device 1. By the solder reflow process, the solder balls 6 of the semiconductor device 1 are integrated with the solder paste 41 supplied onto the substrate terminals 32 to which the solder balls 6 are to be coupled to form solder balls 46 after the mounting of the semiconductor device 1. As shown in FIGS. 30 and 31, the individual solder balls 46 of the semiconductor device 1 are bonded, and electrically coupled to the respective substrate terminals 32 of the wiring substrate 31. That is, the plural external terminals (which are the solder balls 6 herein) of the semiconductor device 1 are individually coupled to the plural substrate terminals 32 of the wiring substrate 31.

In this manner, the semiconductor device 1 is mounted (solder mounted) on the wiring substrate 31, whereby the semiconductor device or the semiconductor module (structures of FIGS. 30 and 31) in which the semiconductor device 1 is mounted (loaded) on the wiring substrate 31 is manufactured. As a result, the semiconductor device 1 is fixed to the wiring substrate 31, and the plural solder balls 46 (solder balls 6) serving as the external terminals of the semiconductor device 1 are electrically coupled to the plural substrate terminals 32 of the wiring substrate 31. Consequently, the plural electrodes 2a of the semiconductor chip 2 are electrically coupled to the plural substrate terminals 32 of the wiring substrate 31 via the plural bonding wires 4, via the plural bonding leads 14, the wires 15, the conductors within the through holes (not shown), and the lands 16 of the wiring substrate 3, and via the plural solder balls 46.

After the step of mounting the semiconductor device 1 onto the wiring substrate 31, prior to the mounting step or in the same mounting step, other electronic components and the like can also be mounted (loaded) on the wiring substrate 31. In the present embodiment, as shown in FIGS. 32 and 33, a capacitor CP1 and a resistor RS1, e.g., are mounted (loaded) as electronic components (external equipment) on the upper surface 31a of the wiring substrate 31 and around the semiconductor device 1, whereby the semiconductor module MJ1 is configured (manufactured).

After the solder paste 41 is supplied onto the plural substrate terminals 32 of the wiring substrate 31 in Step S13, Step S14 (the step of mounting the semiconductor device 1) and Step S15 (solder reflow step) are performed more preferably to facilitate the bonding of the solder balls 6 of the semiconductor device 1 to the substrate terminals 32 of the wiring substrate 31. However, Step S13 (the step of supplying the solder paste 41) can also be omitted. In the case where Step S13 (the step of supplying the solder paste 41) is omitted, when the semiconductor device 1 is mounted on the mounting substrate 31 in Step S14, the individual solder balls 6 of the semiconductor device 1 and the individual substrate terminals 32 of the wiring substrate 31 oppose each other without interposition of the solder paste 41 therebetween. Then, by performing the solder reflow process in Step S15, and heating and melting the solder balls 6, the substrate terminals 32 of the wiring substrate 31 can be bonded to the solder balls 6 of the semiconductor device 1. The solder balls 6 molten by the solder reflow process, and resolidified serve as the solder balls 46 after the mounting of the semiconductor device 1 described above.

<Arrangements of Lands and Solder Balls>

Next, a detailed description will be given of a manner in which the plural solder balls 6 (or lands 16) are arranged on the lower surface of the semiconductor device 1 of the present embodiment, i.e., on the lower surface 3b of the wiring substrate 3.

The semiconductor device 1 of the present embodiment has the plural solder balls 6 (and the plural lands 16) arranged on the lower surface 3b of the wiring substrate 3, as shown in FIG. 2 described above.

Since the solder balls 6 are disposed on the respective lands 16 (except for the terminals for testing 17) on the lower surface 3b of the wiring substrate 3, the arrangement of the lands 16 (except for the terminals for testing 17) at the lower surface 3b of the wiring substrate 3 is the same as the arrangement of the solder balls 6 at the lower surface 3b of the wiring substrate 3. Therefore, in FIG. 2, the lands are disposed at the same two-dimensional locations as those of the solder balls 6. That is, in FIG. 2, the lands 16a are disposed at the same two-dimensional locations as those of solder balls 6a, and the lands 16b are disposed at the same two-dimensional locations as those of solder balls 6b.

As can be seen from FIG. 2, in the semiconductor device of the present embodiment, the plural solder balls 6 (external terminals) are divided into a plurality of solder ball groups (external terminal groups or solder bump groups), which are the two solder ball groups (external terminal groups or solder bump groups) of a first solder ball group 51 and a second solder ball group 52 herein, and arranged on the lower surface 3b of the wiring substrate 3. Specifically, the plural solder balls 6 provided on the lower surface of the semiconductor device 1 (lower surface 3b of the wiring substrate 3) include the first solder ball group (first external terminal group or first solder bump group) 51 arranged in a plurality of rows (which are two rows herein) extending in a circulating pattern at the outer-peripheral-side portion of the lower surface 3b of the wiring substrate 3, and the second solder bump group (second external terminal group or second solder bump group) 52 arranged in a plurality of rows (which are two rows herein) extending in a circulating pattern at locations inward of the first solder ball group 51.

Of the plural solder balls 6, the solder balls 6 belonging to the first solder ball group (first external terminal group or first solder bump group) 51 are called the solder balls 6a by giving the reference numeral 6a thereto, and the solder balls 6 belonging to the second solder ball group (second external terminal group or second solder bump group) 52 are called the solder balls 6b by giving the reference numeral 6b thereto.

Here, the first solder ball group 51 includes the plural solder balls 6a disposed individually on the plural lands 16a including the first land group 56, and the second solder ball group 52 includes the plural solder balls 6b disposed individually on the plural lands 16b including the second land group 57. That is, on the respective lands 16a in the first land group 56, the solder balls 6a in the first solder ball group 51 are individually disposed and, on the respective lands 16b in the second land group 57, the solder balls 6b in the second solder ball group 52 are individually disposed. At the lower surface 3b of the wiring substrate 3, the manner in which the lands 16a in the first land group 56 are arranged is the same as the manner in which the solder balls 6a in the first solder ball group 51 are arranged, and the manner in which the lands 16b in the second land group 57 are arranged is the same as the manner in which the solder balls 6b in the second solder ball group 52 are arranged. On the other hand, at the lower surface 3b of the wiring substrate 3, the positional relationship between the first land group 56 and the second land group 57 is the same as the positional relationship between the first solder ball group 51 and the second solder ball group 52.

As described above, the plural lands 16 on the lower surface 3b of the wiring substrate 3 include the first land group 56 in which the lands 16 (i.e., the lands 16a) are arranged in the plural rows and arranged along the peripheral edge portion of the lower surface 3b of the wiring substrate 3, and the second land group 57 in which the lands 16 (i.e., the lands 16b) are arranged inside the first land group 56 in the lower surface 3b of the wiring substrate 3. Accordingly, the plural solder balls 6 (i.e., the external terminals) on the lower surface 3b of the wiring substrate 3 include the first solder ball group 51 in which the solder balls (i.e., the solder balls 6a) are arranged in a plurality of rows and arranged along the peripheral edge portion of the lower surface 3b of the wiring substrate 3, and the second solder ball group 52 in which the solder balls 6 (i.e., the solder balls 6b) are arranged inside the first solder ball group 51 on the lower surface 3b of the wiring substrate 3. That is, as described above, the solder balls 6a in the first solder ball group 51 are provided on the respective lands 16a in the first land group 56 which are arranged in the plural rows along the peripheral edge portion (each of the sides) of the lower surface 3b of the wiring substrate 3. On the other hand, the solder balls 6b in the second solder ball group 52 are provided on the respective lands 16b in the second land group 57 which are arranged at locations inward of the first land group 56 on the lower surface 3b of the wiring substrate 3.

Additionally, as described above, the lands 16 (i.e., the lands 16a) in the first land group 56 are arranged with the first pitch (first spacing corresponding to the pitch $P_1$ described later), while the lands 16 (i.e., the lands 16b) in the second land group 57 are arranged with the second pitch (second spacing corresponding to the pitch $P_2$ described later) higher than the first pitch. Accordingly, the solder balls 6 (i.e., the solder balls 6a) in the first solder ball group 51 are arranged with the first pitch (first spacing corresponding to the pitch $P_1$ described later), and the solder balls 6 (i.e., the solder balls 6b) in the second solder ball group 52 are arranged with the second pitch (second spacing corresponding to the pitch $P_2$ described later) higher than the first pitch.

As described above, the individual solder balls 6 are electrically coupled to the respective electrodes 2a of the semiconductor chip 2 via the conductor layers of the wiring substrate 3 and via the bonding wires, and the electrodes 2a of the semiconductor chip 2 include the electrodes for signal 2aSGN1, 2aSGN2, 2aSGN3, and 2aSGN4, the electrodes for power source potential 2aVDD, and the electrodes for reference potential 2aGND. In the present embodiment, as described above, the electrodes for signal 2aSGN1, 2aSGN2, 2aSGN3, and 2aSGN4 are preferentially coupled to the solder balls 6a in the first solder ball group 51 in consideration of electrical coupling to the external equipment (external LSIs). On the other hand, those of the electrodes for signal 2aSGN1, 2aSGN2, 2aSGN3, and 2aSGN4 which could not be disposed on the solder balls 6a in the first solder ball group 51, the electrodes for power source potential 2aVDD, and the electrodes for reference potential 2aGND are electrically coupled to the solder balls 6b in the second solder ball group 52. Note that, as described above, in the present embodiment, the terminals for testing 17 are collectively disposed on the center portion of the lower surface 3b of the wiring substrate 3. That is, the terminals for testing 17 which are needed to inspect the characteristics of the semiconductor device 1 the assembly (manufacturing) of which has been completed are positively disposed on the center portion of the lower surface 3b of the wiring substrate 3. Therefore, the solder balls 6 electrically coupled to the electrodes for signal 2aSGN1, 2aSGN2, 2aSGN3, and 2aSGN4 can be disposed on the peripheral-edge-side portion of the lower surface 3b of the wiring substrate 3.

Figure 34:
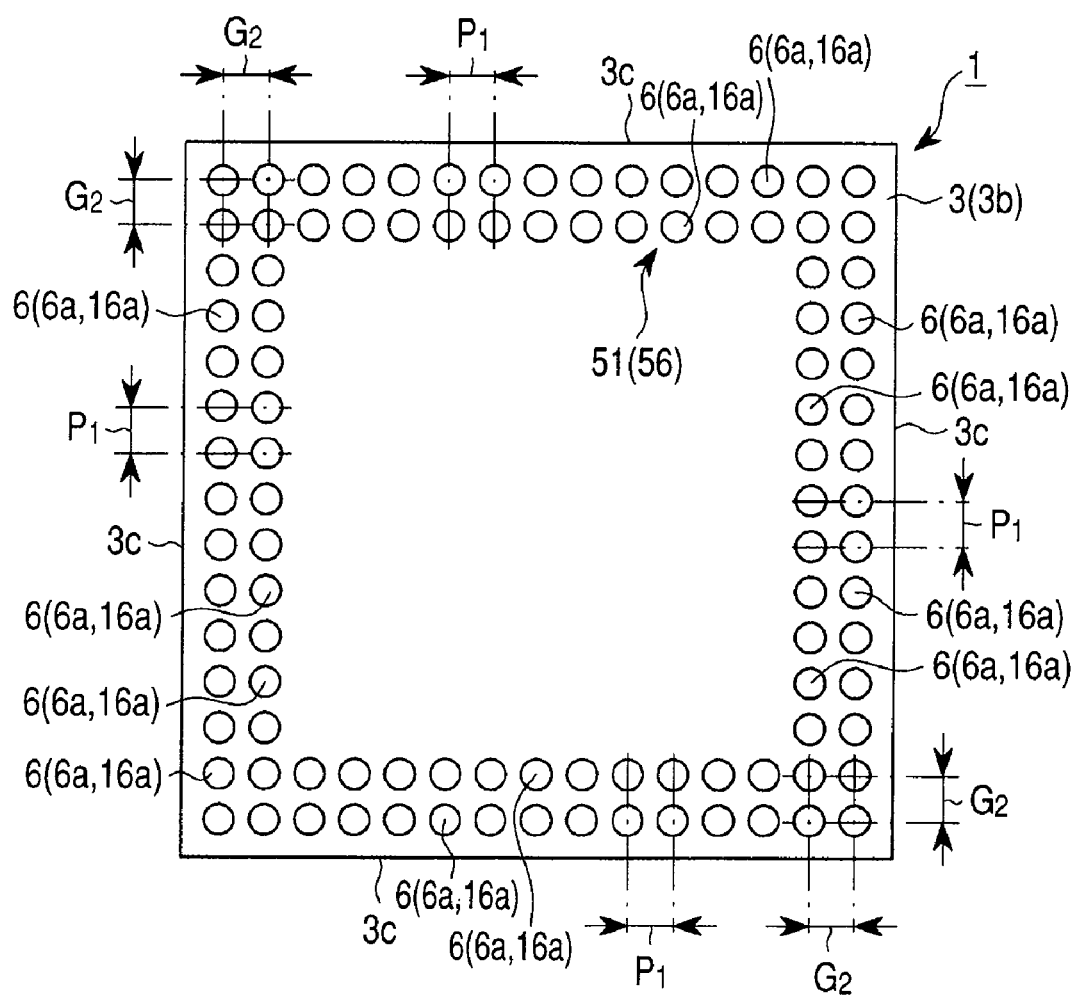
FIG. 34 is an illustrative view of the semiconductor device of Embodiment 1.
Figure 35:
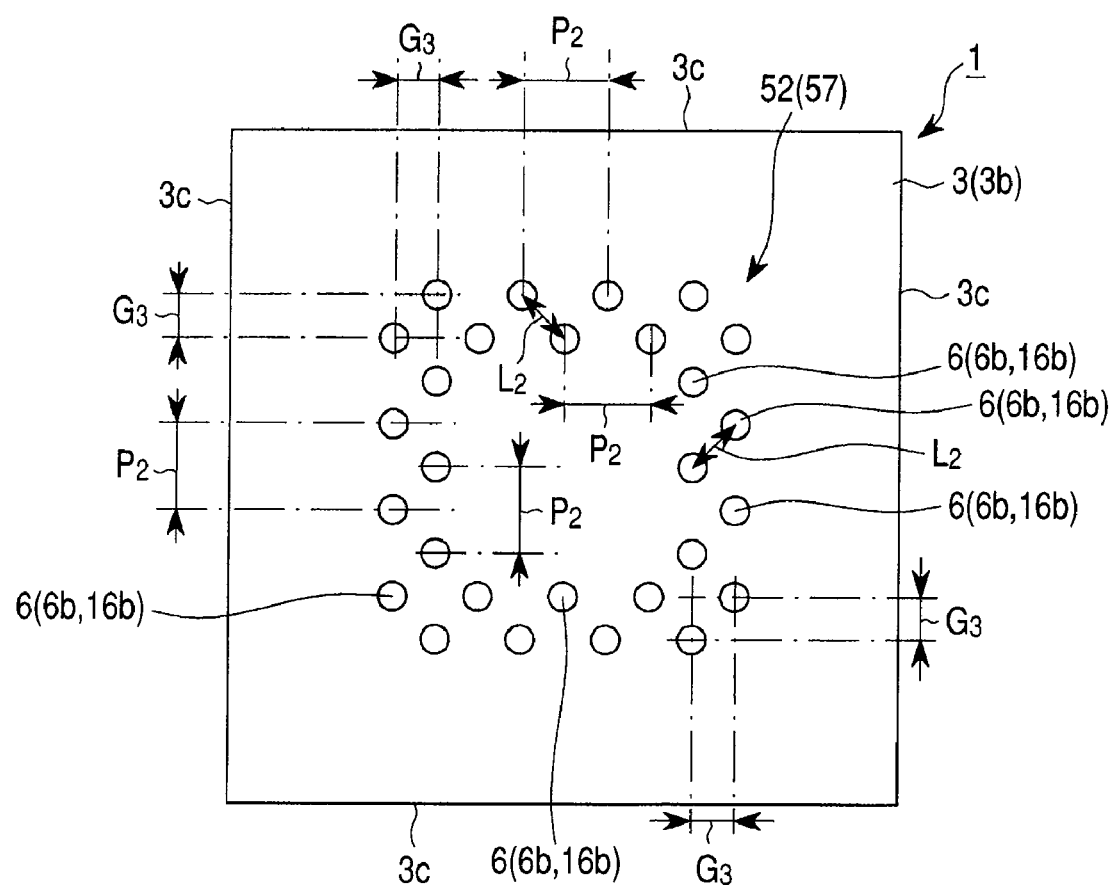
FIG. 35 is an illustrative view of the semiconductor device of Embodiment 1.
Figure 36:
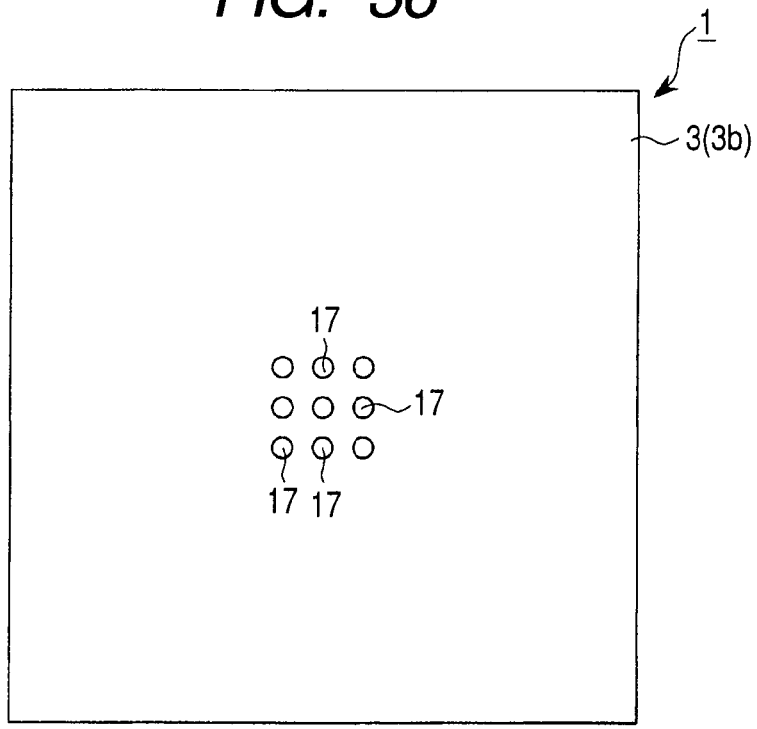
FIG. 36 is an illustrative view of the semiconductor device of Embodiment 1.
Figure 37:
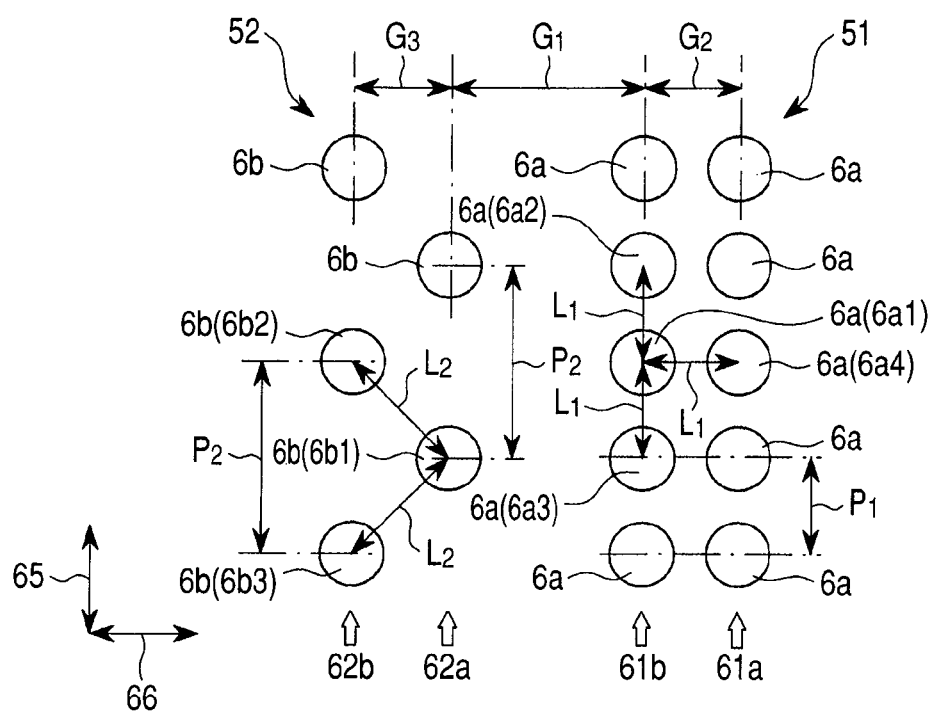
FIG. 37 is an illustrative view of the semiconductor device of Embodiment 1.

FIGS. 34 to 37 are illustrative views of the semiconductor device 1, of which FIG. 34 shows only the solder balls (i.e., the solder balls 6a) belonging to the first solder ball group (first external terminal group or first solder bump group) 51 on the lower surface 3b of the wiring substrate 3. FIG. 34 corresponds to a plan view in which the depiction of the solder balls 6 (i.e., the solder balls 6b) belonging to the second solder ball group (second external terminal group or second solder bump group) 52 and the terminals for testing 17 is omitted. FIG. 35 shows only the solder balls (i.e., the solder balls 6b) belonging to the second solder ball group (second external terminal group or second solder bump group) 52 on the lower surface 3b of the wiring substrate 3. FIG. 35 corresponds to a plan view in which the depiction of the solder balls 6 (i.e., the solder balls 6a) belonging to the first solder ball group (first external terminal group or first solder bump group) 51 and the terminals for testing 17 is omitted. FIG. 36 shows only the terminals for testing 17 on the lower surface 3b of the wiring substrate 3, and corresponds to a plan view in which the depiction of the solder balls 6 is omitted. By comparing FIG. 2 and FIGS. 34 to 36, it can be easily recognized to which one of the first solder ball group 51 and the second solder ball group 52 each of the solder balls 6 shown in FIG. 2 belongs. FIG. 37 is a partially enlarged view of the lower surface 3b of the wiring substrate 3. An enlarged view of a region 27a enclosed by the dotted line of FIG. 2 in which only the solder balls 6 (arrangements thereof) are shown substantially corresponds to FIG. 37. Note that, as described above, the arrangement of the lands 16 (except for the terminals for testing 17) on the lower surface 3b of the siring substrate 3 is the same as the arrangement of the solder balls 6 on the lower surface 3b of the wiring substrate 3. Therefore, in FIG. 34, the lands 16a are disposed at the same two-dimensional locations as those of the solder balls 6a and, in FIG. 35, the lands 16b are disposed at the same two-dimensional locations as those of the solder balls 6b. Also, in FIG. 37, the lands 16a are disposed at the same two-dimensional locations as those of the solder balls 6a, and the lands 16b are disposed at the same two-dimensional locations as those of the solder balls 6b, though the reference numerals 16a and 16b are not given thereto.

As can be seen from FIGS. 2, and 34 to 36, the solder balls 6a belonging to the first solder ball group 51 are regularly arranged in a plurality of rows (which are two rows herein) along the outer periphery of the lower surface 3b of the wiring substrate 3, and arranged in a circulating pattern generally parallel with each of the sides 3c of the rectangular wiring substrate 3. On the other hand, the solder balls 6b belonging to the second solder ball group 52 are regularly arranged in a plurality of rows (which are two rows herein) at locations closer to the center portion (center portion of the lower surface 3b of the wiring substrate 3) than the first solder ball group 51, and arranged in a circulating pattern generally parallel with each of the sides 3c of the rectangular wiring substrate 3.

A predetermined spacing $G_1$ (shown in FIG. 2) is provided between the first solder ball group 51 (first land group 56) and the second solder ball group 52 (second land group 57). The spacing (distance) $G_1$ between the first solder ball group 51 and the second solder ball group 52 is larger than a spacing (row-to-row distance or row pitch) $G_2$ (shown in FIG. 34)

between the rows in the first solder ball group 51, and than a spacing (row-to-row distance or row pitch) $G_3$ (shown in FIG. 35) between the rows in the second solder ball group 52 (i.e., $G_1 > G_2$ and $G_1 > G_3$). The spacing (distance) between the first land group 56 and the second land group 57 is the same as the spacing (distance) $G_1$ between the first solder ball group 51 and the second solder ball group 52. The spacing (row-to-row distance or row pitch) between the rows in the first land group 56 is the same as the spacing (row-to-row distance or row pitch) $G_2$ between the rows in the first solder ball group 51. The spacing (row-to-row distance or row pitch) between the rows in the second land group 57 is the same as the spacing (row-to-row distance or row pitch) $G_3$ between the rows in the second solder ball group 52. Therefore, it can also be said that the spacing (distance) $G_1$ between the first land group 56 and the second land group 57 is larger than the spacing (row-to-row distance or row pitch) $G_2$ between the rows in the first land group 56, and than the spacing (row-to-row distance or row pitch) $G_3$ between the rows in the second land group 57.

Figure 38:
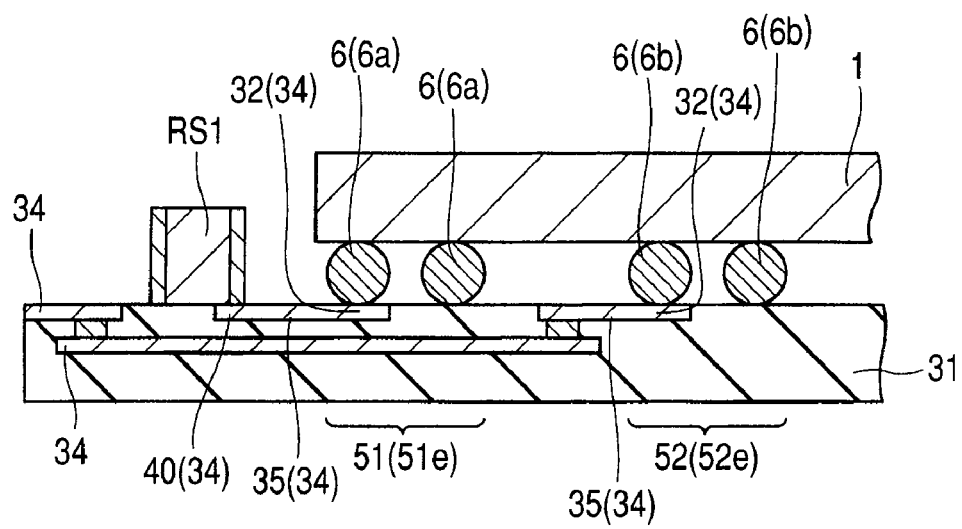
FIG. 38 is a principal-portion cross-sectional view of the semiconductor module of FIG. 33.
Figure 39:
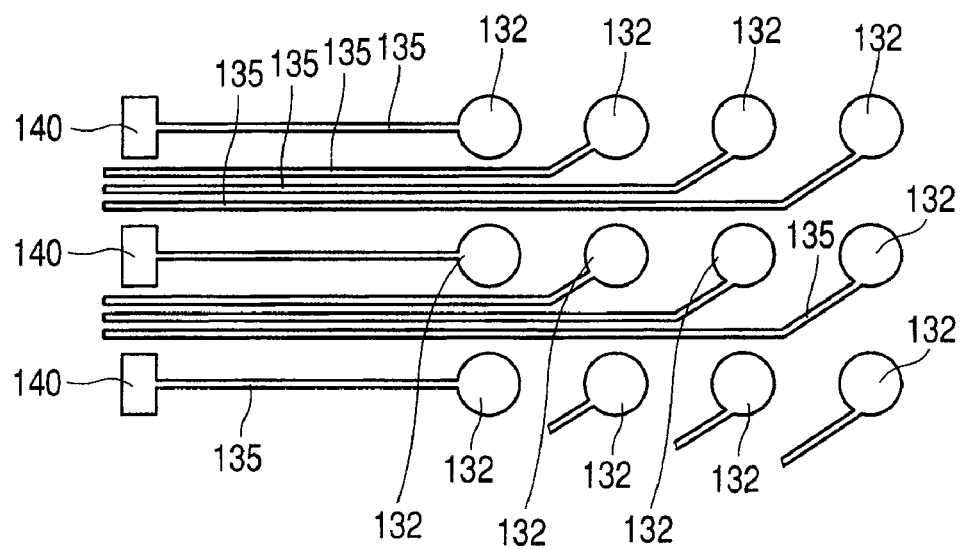
FIG. 39 is a principal-portion plan view of a mounting substrate for mounting thereon a BGA package.

By arranging the first solder ball group 51 (first land group 56) and the second solder ball group 52 (second land group 57) at such spacings, when the semiconductor device 1 is mounted on the mounting substrate 31, the region between the first solder ball group 51 and the second solder ball group 52 can be used as a region where the lead-out wires 35 are placed, as shown in FIG. 38. FIG. 38 is a principal-portion cross-sectional view (partially enlarged cross-sectional view) of the semiconductor module MJ1 of FIG. 33. The reference numeral 40 in FIG. 38 denotes each substrate terminal 40 for external equipment (for coupling to, e.g., the resistor RS1 or the capacitor CP1 described above) at the mounting substrate 31. That is, it is also possible not to adopt a configuration in which a plurality of lead-out wires 135 are placed between individual substrate terminals 132 of a mounting substrate 131 as shown in FIG. 39. FIG. 39 is a principal-portion plan view of the mounting substrate 131 for mounting thereon a BGA package (corresponding to a semiconductor device 101 described later in a comparative example), and shows the layout of the lead-out wires 135 for providing coupling between the substrate terminals 132 for coupling to the BGA package and substrate terminals 140 for coupling to external equipment at the mounting substrate 131.

In the present embodiment, the distance between the adjacent solder balls (solder bumps) 6 is set larger in the second solder ball group 52 (or in the second land group 57) than in the first solder ball group 51 (or in the first land group 56). That is, a distance (nearest neighbor distance or closest distance) $L_2$ between the adjacent solder balls (solder bumps) 6b in the second solder ball group 52 (or the second land group 57) is set larger than a distance (nearest neighbor distance or closest distance) $L_1$ between the adjacent solder balls (solder bumps) 6a in the first solder ball group 51 ($L_2 > L_1$).

Here, the adjacent solder balls 6 indicate the relationship between a certain solder ball 6 and another solder ball 6 located closest to the solder ball 6. Accordingly, the distance $L_1$ between the adjacent solder balls 6a in the first solder ball group 51 (or in the first land group 56) corresponds to the distance from each of the solder balls 6a in the first solder ball group 51 (or in the first land group 56) to another solder ball 6a located closest to the solder ball 6a. Likewise, the distance $L_2$ between the adjacent solder balls 6b in the second solder ball group 52 (or in the second land group 57) also corresponds to the distance from each of the solder balls 6b in the second solder ball group 52 (or in the second land group 57) to another solder ball 6b located closest to the solder ball 6b.

When the distance between the solder balls 6 disposed on the lower surface 3b of the wiring substrate 3 is mentioned, it is assumed that the distance therebetween indicates the distance from the center of each of the solder balls 6 to the center of another solder ball 6 when viewed in a plane parallel with the lower surface 3b of the wiring substrate 3. Since the solder balls 6 are formed on the lands 16 of the wiring substrate 3, the distance between the solder balls 6 disposed on the lower surface 3b of the wiring substrate 3 corresponds also to the distance between the respective centers of the lands 16 coupled to the solder balls 6.

<Effects Achieved by Present Embodiment>

As described above, in the solder reflow step during the mounting of the semiconductor device 1 onto the wiring substrate 31, the solder balls 6b in the second solder ball group 52 located closer to the center portion (center portion of the lower surface 3b of the wiring substrate 3) than the solder balls 6a in the first solder ball group 51 are more likely to be collapsed under pressure due to the warping of the semiconductor device 1. In particular, warping (warping entailing the protrusion of the center portion of the lower surface 3b of the wiring substrate 3 toward the mounting substrate (corresponding to the wiring substrate 31 described above)) is likely to occur when the thermal expansion coefficient of the semiconductor chip 2 is smaller than the thermal expansion coefficient of the wiring substrate 3, and further the size (outer dimension) of the semiconductor chip 2 is substantially the same as the size (outer dimension) of the wiring substrate 3.

However, in the present embodiment, the distance $L_2$ between the adjacent solder balls 6b is set larger than the distance $L_1$ between the adjacent solder balls 6a ($L_2 > L_1$). Thus, even when some of those of the solder balls 6 which are electrically coupled to the electrodes for signal 2aSGN1, 2aSGN2, 2aSGN3, and 2aSGN4 to serve as signal supply paths cannot be placed in the first solder ball group 51, and are placed in the second solder ball group 52, the distance $L_2$ between the adjacent solder balls 6b in the second solder ball group 52 is set larger than the distance $L_1$ between the adjacent solder balls 6a in the first solder ball group 51 ($L_2 > L_1$).

As a result, even when the solder ball 6b in the second solder ball group 52 is collapsed under pressure in the solder reflow step during the mounting of the semiconductor device 1 on the wiring substrate 31, since the distance (i.e., the distance $L_2$) between the collapsed solder ball 6b and another solder ball 6b closest thereto is large, it is possible to prevent the solder balls 6b from coming into contact with each other. Therefore, even when the solder balls (or lands) are divided into the plural solder ball groups (or land groups) for easy routing of the lead-out wires 35 over the mounting substrate (wiring substrate 31), it is possible to prevent a short circuit between the individual solder balls 6 (46) when the semiconductor device is mounted on the wiring substrate 31, and improve the yield of mounting the semiconductor device 1. It is also possible to improve the reliability (mounting reliability) of the semiconductor device 1.

Besides, in the solder reflow step during the mounting of the semiconductor device 1 onto the wiring substrate 31, the solder balls 6a in the first solder ball group 51 located closer to the outer peripheral portion (outer peripheral portion of the lower surface 3b of the wiring substrate 3) than the solder balls 6b in the second solder ball group 52 are less likely to be collapsed under pressure even when the semiconductor device 1 warps. Therefore, in the first solder ball group 51, it is possible to increase the arrangement density of the solder balls 6a in the first solder ball group 51 by reducing the distance $L_1$ between the adjacent solder balls 6a (to a value smaller than the distance $L_2$). As a result, the semiconductor device 1 having a larger number of terminals and a smaller size (smaller area) can be implemented.

In the present embodiment, in order to prevent a short-circuit failure between the solder balls 6 during the mounting of the semiconductor device 1, the distance $L_2$ between the adjacent solder balls 6b in the second solder ball group 52 has been set larger than the distance $L_1$ between the adjacent solder balls 6a in the first solder ball group 51. Aside from that, in order to efficiently arrange the solder balls 6 on the lower surface 3b of the wiring substrate 3, the present embodiment has also improved the manners in which the solder balls 6 are arranged in the first solder ball group 51, and in the second solder ball group 52 as follows.

As shown in FIG. 37, in each of the first solder ball group (first external terminal group) 51 and the second solder ball group (second external terminal group) 52, the solder balls 6 are regularly arranged (with an equal pitch or at equal spacings) in a plurality of rows (which are two rows therein). This allows an increase in the arrangement efficiency of the solder balls 6.

Consequently, the distance $L_1$ between the adjacent solder balls 6a in the first solder ball group 51 has substantially the same value for each of the plural solder balls 6a in the first solder ball group 51. That is, no matter which one of the solder balls 6a in the first solder ball group 51 is selected, the distance from the selected solder ball 6a to another solder ball 6a closest thereto becomes equal. This allows an increase in the arrangement efficiency (layout density) of the solder balls 6a.

Also, the distance L2 between the adjacent solder balls 6b in the second solder ball group 52 has substantially the same value for each of the plural solder balls 6b in the second solder ball group 52. That is, no matter which one of the solder balls 6b in the second solder ball group 52 is selected, the distance from the selected solder ball 6b to another solder ball 6b closest thereto becomes equal. This allows an increase in the arrangement efficiency (layout density) of the solder balls 6b, while maximizing the distance $L_2$ between the adjacent solder balls 6b.

Further, on the lower surface 3b of the wiring substrate 3, the solder balls 6a in the first solder ball group 51 are regularly arranged (with an equal pitch or at equal spacings) in a plurality of rows (which are the two rows 61a and 62b herein) extending in a circulating pattern along each of the sides 3c of the lower surface 3b of the wiring substrate 3, and the solder balls (solder balls 61a) in the adjacent rows are arranged in alignment with each other. Specifically, the solder balls 6a in the row 61a and the solder balls 6a in the row 61b shown in FIG. 37 are arranged in alignment with each other.

That is, in the first solder ball group 51, the solder balls 6a belonging to the adjacent rows overlap (are in alignment with) each other when viewed in a direction orthogonal to an extending direction of the rows. In the first solder ball group 51, the plural rows 61a and 61b extend in a circulating pattern in parallel with the sides 3c of the lower surface 3b of the wiring substrate 3 so that the extending direction of the rows is parallel with the sides 3c. Specifically, the solder balls 6a belonging to the row 61a and the solder balls 6a belonging to the row 6b, which are shown in FIG. 37, overlap (are in alignment with) each other when viewed in a direction (which is the direction 66 in FIG. 37) orthogonal to the extending direction of the rows (which is the direction 65 in FIG. 37).

Since the arrangement of the solder balls 6a in the first solder ball group 51 is the same as the arrangement of the lands 16a in the first land group 56, it can also be said that, in the first land group 56, the lands 16a are arranged in a plurality of rows (which are the two rows 61a and 61b herein), and the lands (lands 16a) in the adjacent rows are arranged in alignment with each other. That is, in the first land group 56, the lands 16a belonging to the adjacent rows overlap (are in alignment with) each other when viewed in a direction orthogonal to the extending direction of the rows.

In the first solder ball group 51, the solder balls in the adjacent rows are arranged in alignment with each other so that the pitch $P_1$ of the solder balls 6a is the same in each of the rows belonging to the first solder ball group 51. Specifically, the pitch $P_1$ of the solder balls 6a in the row 61a is the same as the pitch $P_1$ of the solder balls 6a in the row 61b. It is also possible to consider that, in the first solder ball group 51, the solder balls 6a are arranged in an array configuration.

In the first solder ball group 51, in order to increase the arrangement efficiency of the solder balls 6a, the spacing (row-to-row distance) $G_2$ between the rows is preferably substantially the same as the pitch (arrangement pitch or spacing) $P_1$ of the solder balls 6a in each of the rows (i.e., $P_1=G_2$). The spacing (row-to-row distance) $G_2$ between the rows and the pitch $P_1$ of the solder balls 6a in each of the rows in the first solder ball group 51 are shown in FIGS. 34 and 37. As can be also seen from FIGS. 34 and 37, it is assumed that the spacing $G_2$ and the pitch $P_1$ are each shown by the distance from the center of the solder ball 6a (or the land 16a coupled to the solder ball 6a) to the center of the solder ball 6a (or the land 16a coupled to the solder ball 6a).

In the first solder ball group 51 in which the solder balls (solder balls 6) in the adjacent rows 61a and 61b are arranged in alignment with each other, the distance $L_1$ between the adjacent solder balls 6a coincides with the pitch $P_1$ of the solder balls 6a in each of the rows or with the spacing (row-to-row distance) $G_2$ between the rows (the smaller one of the pitch $P_1$ and the spacing $G_2$ or either one of the pitch $P_1$ and the spacing $G_2$ when the pitch $P_1$ and the spacing $G_2$ are equal) ($L_1=\min(P_1, G_2)$). Here, the smaller one of A and B is represented as min (A, B), which also holds true hereinbelow. $L_1=\min(P_1, G_2)$ is established because, in the first solder ball group 51, another solder ball 6a located closest to a certain solder ball 6a (which is assumed to be the solder ball 6a1 of FIG. 37, and described as such herein) is either one of the solder balls 6a2 and 6a3 which are in the same row as that of the solder ball 6a1, and adjacent in the extending direction of the rows, or the solder ball 6a4 which is in a neighboring row, and adjacent in a direction (which is the direction 66 of FIG. 37) orthogonal to the extending direction of the rows. In the first solder ball group 51, when the pitch $P_1$ and the spacing $G_2$ are the same, $L_1=P_1=G_2$ is satisfied, which is most preferable if consideration is given to the arrangement efficiency of the solder balls 6a.

By contrast, on the lower surface 3b of the wiring substrate 3, the solder balls 6b in the second solder ball group 52 are regularly arranged (with an equal pitch or at equal spacings) in a plurality of rows (which are the two rows 62a and 62b) extending in a circulating pattern along each of the sides 3c of the lower surface 3b of the wiring substrate 3 at locations inward of the solder ball group 51. However, the solder balls (solder balls 6b) in the adjacent rows are arranged out of alignment or misalignment with each other.

That is, in the second solder ball group 52, the solder balls 6 belonging to the adjacent rows do not overlap (are misaligned or out of alignment with) each other when viewed in a direction orthogonal to the extending direction of the rows. In the second solder ball group 52, the plural rows 62a and 62b extend in a circulating pattern in parallel with the sides 3c of the lower surface 3b of the wiring substrate so that the extending direction of the rows is parallel with the sides 3c. Specifically, the solder balls 6b belonging to the row 62a and the solder balls 6b belonging to the row 62b, which are shown in FIG. 37, do not overlap (are misaligned or out of alignment with) each other in a direction (which is the direction 66 in FIG. 37) orthogonal to the extending direction of the rows (which is the direction 65 in FIG. 37).

In other words, in the second solder ball group 52, when viewed in the direction (which is the direction 66 in FIG. 37) orthogonal to the extending direction of the rows (which is the direction 65 in FIG. 37), between the solder balls 6*b* belonging to each of the rows (which is either one of the rows 62*a* and 62*b* herein), there are located the solder balls 6*b* belonging to the row (which is the other one of the rows 62*a* and 62*b*) adjacent to the row. Specifically, between the solder balls 6*b* in the row 62*a*, the solder balls 6*b* in the row 62*b* adjacent to the row 62*a* are located and, between the solder balls 6*b* in the row 62*b*, the solder balls 6*b* in the row 62*a* adjacent to the row 62*b* are located. Accordingly, it is also possible to consider that, in the second solder ball group 52, the solder balls 6*b* are arranged in a so-called staggered pattern.

Since the arrangement of the solder balls 6*b* in the second solder ball group 52 is the same as the arrangement of the lands 16*b* in the second land group 57, it can also be said that, in the second land group 57, the lands 16*b* are arranged in a plurality of rows (which are the two rows 62*a* and 62*b*), and the lands (lands 16*b*) in the adjacent rows are arranged out of alignment with each other. That is, in the second land group 57, the lands 16*b* belonging to the adjacent rows do not overlap (are misaligned or out of alignment with) each other when viewed in a direction orthogonal to the extending direction of the rows. In other words, in the second land group 57, when viewed in a direction orthogonal to the extending direction of the rows, between the lands 16*b* belonging to each of the rows, there are located the lands 16*b* belonging to the row adjacent to the row.

If consideration is given to the arrangement efficiency of the solder balls 6*b*, it is preferable that the pitch (arrangement pitch or spacing) $P_2$ of the solder balls 6*b* is the same in each of the rows belonging to the second solder ball group 52 (i.e., the pitch $P_2$ of the solder balls 6*b* in the row 62*a* is the same as the pitch $P_2$ of the solder balls 6*b* in the row 62*b*).

In the present embodiment, the pitch $P_2$ of the solder balls 6*b* in each of the rows (which are the rows 62*a* and 62*b*) in the second solder ball group 52 is set higher than the pitch $P_1$ of the solder balls 6*a* in each of the rows (which are the rows 61*a* and 61*b*) in the first solder ball group 51 (i.e., $P_2 > P_1$). The reason for this is that, when the pitch $P_2$ of the solder balls 6*b* is set smaller than the pitch $P_1$ of the solder balls 6*a* unlike in the present embodiment, the distance $L_2$ between the adjacent solder balls 6*b* is undesirably smaller than the distance $L_1$ between the adjacent solder balls 6*a*.

The pitch $P_2$ of the solder balls 6*b* in each of the rows in the second solder ball group 52 is shown in FIGS. 35 and 37. As can be also seen from FIGS. 35 and 37, it is assumed that the pitch $P_2$ is shown by the distance between the respective centers of the solder balls 6*b* (or the lands 16*b* coupled to the solder balls 6*b*) each belonging to the same row (which is the row 62*a* or the row 62*b* herein).

In the second solder ball group 52 in which the solder balls in the adjacent rows (which are the row 62*a* and the row 62*b*) are arranged out of alignment with each other, another solder ball 6*b* located closest to a certain solder ball 6*b* (which is assumed to be the solder ball 6*b*1 of FIG. 37, and described as such herein) is either one of solder balls 6*b*2 and 6*b*3 which belong to the row 62*b* adjacent to that of the solder ball 6*b*1, and are adjacent in a direction oblique to the extending direction of the rows (which is the row 65 in FIG. 37). Accordingly, the distance $L_2$ between the adjacent solder balls 6*b* in the second solder ball group 52 becomes the same as the smaller one of the distance between the solder balls 6*b*1 and 6*b*2 and the distance between the solder balls 6*b*1 and 6*b*3 (or either one of the distance between the solder balls 6*b*1 and 6*b*2 and the distance between the solder balls 6*b*1 and 6*b*3 when they are equal).

Therefore, in the second solder ball group 52, the distance $L_2$ between the adjacent solder balls 6*b* is larger than the spacing (row-to-row distance) $G_3$ between the rows in the second solder ball group 52 ($L_2 > G_3$). This is because, in the second solder ball group 52, the solder balls in the adjacent rows are arranged out of alignment with each other so that the direction in which the solder balls 6*b* are adjacent (the direction in which the solder balls 6*b* are in closest proximity) is neither the extending direction of the rows (which is the direction 65 in FIG. 37) nor the direction (which is the direction 66 in FIG. 37) orthogonal to the extending direction of the rows, but the diagonal direction between the two directions.

In the second solder ball group 52, the solder balls in the adjacent rows are preferably arranged to be misaligned by a ½ pitch (i.e., $P_2/2$). As a result, between the solder balls 6*b* in the row 62*a*, the solder balls 6*b* in the neighboring row 62*b* are located so that, e.g., the distance between the solder balls 6*b*1 and 6*b*2 becomes equal to the distance between the solder balls 6*b*1 and 6*b*3. Therefore, it is possible to maximize the distance $L_2$ between the adjacent solder balls 6*b* in the second solder ball group 52 without changing the number of the solder balls 6*b*.

In the present embodiment, the solder balls in the adjacent rows in the first solder ball group 51 are arranged in alignment with each other, while the solder balls in the adjacent rows in the second solder ball group 52 are arranged in misalignment with each other. This allows an increase in the layout density of the first solder balls 6*a* in the first solder ball group 51, and also allows an increase in the distance $L_2$ between the adjacent solder balls 6*b* in the second solder ball group 52.

Even in the case where the solder balls in the adjacent rows are arranged not in misalignment, but in alignment with each other not only in the first solder ball group 51, but also in the second solder ball group 52, the distance $L_2$ between the adjacent solder balls 6*b* in the second solder ball group 52 can be set larger than the distance $L_1$ between the adjacent solder balls 6*a* in the first solder ball group 51. This can be achieved by setting the pitch $P_2$ of the adjacent solder balls 6*b* in each of the rows in the second solder ball group 52 higher than the pitch $P_1$ of the solder balls 6*a* in each of the rows in the first solder ball group ($P_2 > P_1$), and setting the spacing $G_3$ between the rows in the second solder ball group 52 larger than the spacing $G_2$ between the rows in the first solder ball group 51 ($G_3 > G_2$).

However, in the second solder ball group 52, it is more preferable that the solder balls in the adjacent rows are arranged not in alignment, but in misalignment with each other. The reason for this is as follows.

That is, as the spacing $G_3$ between the rows in the second solder ball group 52 is increased, the locations of the solder balls 6*b* in the second solder ball group 52 get closer to the center portion of the lower surface 3*b* of the wiring substrate 3. As described above, as the locations of the solder balls 6*b* are closer to the center portion of the lower surface 3*b* of the wiring substrate 3, the solder balls 6*b* are more likely to be collapsed under pressure in the solder reflow step during the mounting of the semiconductor device 1 on the wiring substrate 31 due to the warping of the semiconductor device 1. Accordingly, when the spacing $G_3$ between the rows in the second solder ball group 52 is excessively increased, the locations of the solder balls 6*b* get closer to the center portion of the lower surface 3*b* of the wiring substrate 3, which may rather facilitate the collapse of the solder ball 6*b*. In terms of increasing the arrangement efficiency of the solder balls 6 on the lower surface 3*b* of the wiring substrate 3 to implement the semiconductor device 1 having a larger number of terminals and a smaller size (smaller area), it is preferable not to increase the spacing $G_3$ between the rows in the second solder ball group 52.

Therefore, as in the present embodiment, it is possible to increase the distance $L_2$ between the adjacent solder balls 6 in the second solder ball group 52 by arranging the solder balls in the adjacent rows not in alignment, but in misalignment with each other without increasing the spacing $G_3$ between the rows. As a result, by increasing the distance $L_2$ between the adjacent solder balls 6*b*, it is possible to not only prevent a short-circuit failure between the solder balls 6 (46) when the semiconductor device 1 is mounted on the wiring substrate 31, but also dispose the solder balls 6*b* at locations maximally distant from the center portion of the lower surface 3*b* of the wiring substrate 3. Therefore, it is possible to inhibit the phenomenon of collapse of the solder ball 6*b* during the mounting of the semiconductor device 1. This allows an improvement in the yield of mounting the semiconductor device 1. In addition, it is possible to improve the reliability (mounting reliability) of the semiconductor device 1. Moreover, since it is possible to increase the arrangement efficiency of the solder balls 6 on the lower surface 3*b* of the wiring substrate 3, the semiconductor device 1 having a larger number of terminals and a smaller size (smaller area) can be implemented.

If consideration is given to the foregoing problems encountered when the spacing $G_3$ is increased, the spacing $G_3$ between the rows in the second solder ball group 52 is preferably smaller than the pitch $P_2$ of the solder balls 6*b* in each of the rows in the second solder ball group 52 (i.e., $G_3 < P_2$), or more preferably substantially equal to or not more than the spacing $G_2$ between the rows in the first solder ball group 51 (i.e., $G_3 \leqq G_2$).

The spacing (row-to-row distance) $G_3$ between the rows in the second solder ball group 52 is shown in FIGS. 35 and 37. As can be also seen from FIGS. 35 and 37, it is assumed that the spacing $G_3$ is shown by the distance from the center of the row to the center of the neighboring row. The center of the row can be obtained from a straight line connecting the respective centers of the solder balls 6 belonging to the row or connecting the respective centers of the lands 16 coupled thereto. The spacing (row-to-row distance) $G_3$ between the rows in the second solder ball group 52 can also be regarded as the pitch of the rows in the second solder ball group 52. Likewise, the spacing (row-to-row distance) $G_2$ between the rows in the first solder ball group 51 can also be regarded as the pitch of the rows in the first solder ball group 51.

Figure 40:
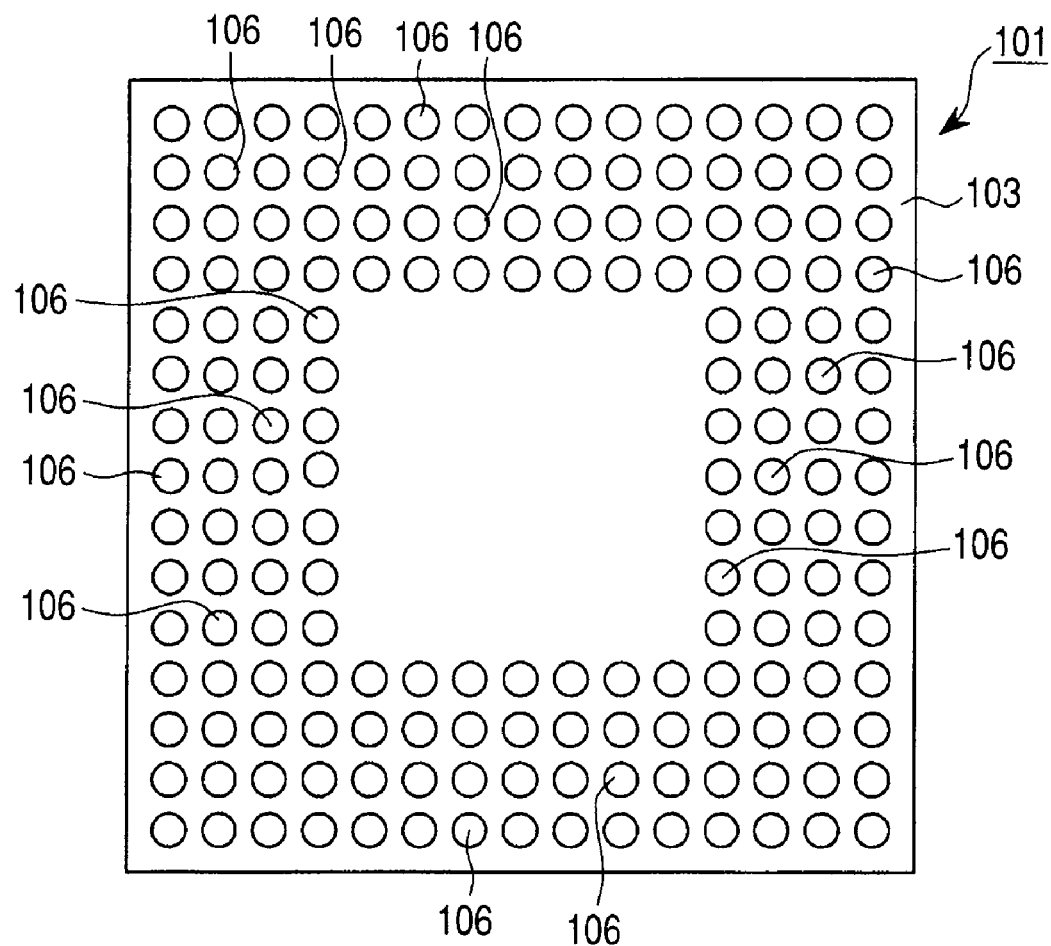
FIG. 40 is a bottom view of a semiconductor device of a comparative example.
Figure 41:
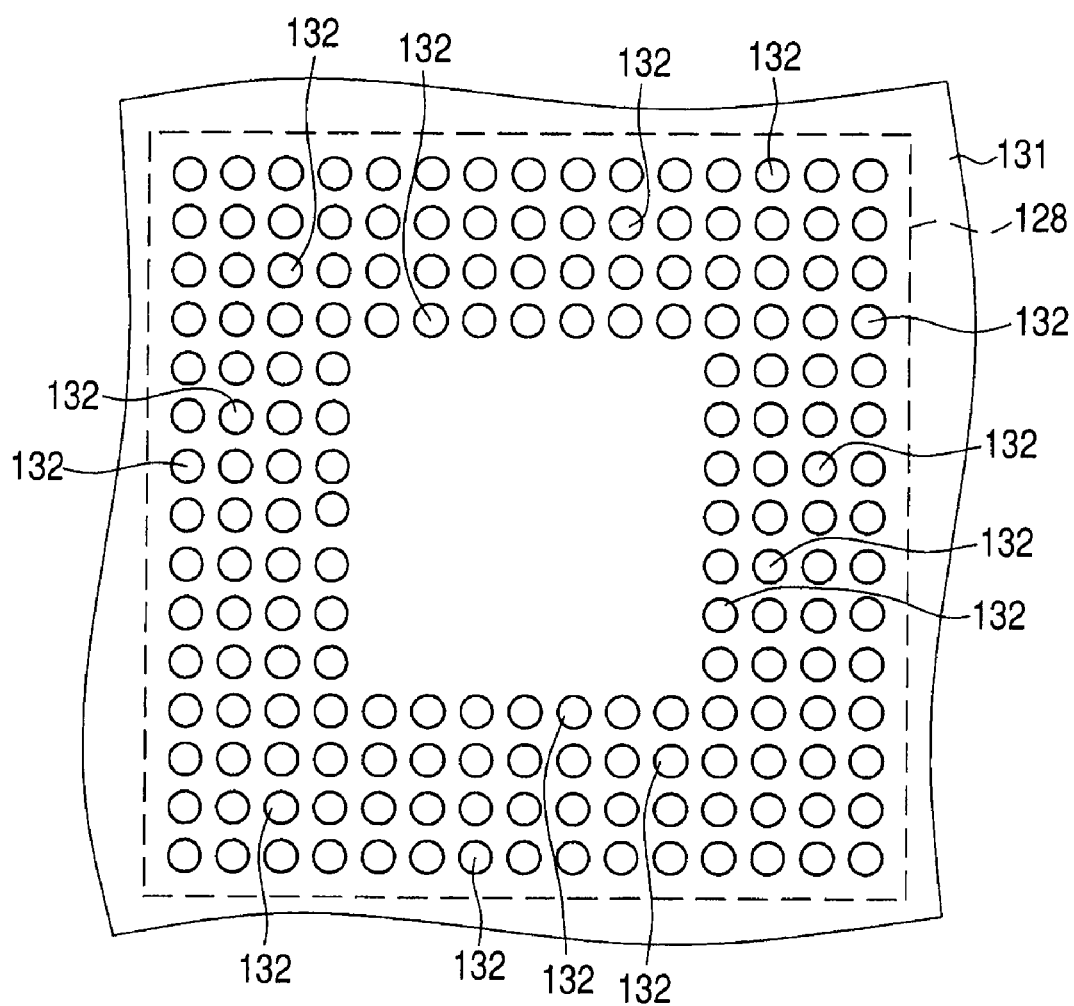
FIG. 41 is a top view of a mounting substrate for mounting thereon the semiconductor device of the comparative example.

As shown in FIGS. 40 and 41, in a semiconductor device 101 of the comparative example, solder balls 106 located at the peripheral edge portion of the lower surface of a wiring substrate 103 are arranged in a larger number of rows so that the substrate terminals 132 on the mounting substrate 131 are also arranged in a larger number of rows. As a result, as shown in FIG. 39 described above, it is more difficult to route the lead-out wires 135 over the mounting substrate 131. FIG. 40 is a bottom view of the semiconductor device 101 of the comparative example, and FIG. 41 is a top view of the mounting substrate 131 for mounting thereon the semiconductor device 101 of the comparative example, which respectively correspond to FIGS. 2 and 25 of the present embodiment each described above. Note that, in FIG. 41, a region 128 which is two-dimensionally overlapped by the semiconductor device 101 of the comparative example when the semiconductor device 101 is mounted on the mounting substrate 131 is indicated by the dotted line.

By contrast, in the present embodiment, as described above, the plural solder balls 6 are divided into a plurality of solder ball groups, which are the two solder ball groups of the first solder ball group 51 and the second solder ball group 52, and arranged on the lower surface 3*b* of the wiring substrate 3. In addition, the spacing between the plural solder ball groups (which are the first solder ball group 51 and the second solder ball group 52 herein) is set larger than the spacing between the rows (which is the spacing $G_2$ between the rows in the first solder ball group 51 or the spacing $G_3$ between the rows in the second solder ball group 52) in each of the solder ball group (which are the first solder ball group 51 and the second solder ball group 52 herein).

On the upper surface 31*a* of the wiring substrate (mounting substrate or motherboard) 31 for mounting thereon the semiconductor device 1, there are provided the substrate terminals 32 which are in the same arrangement as that of the solder balls 6 in the semiconductor device 1. Therefore, it follows that, as shown in FIGS. 25 and 26, the substrate terminals 32 of the wiring substrate 31 are included in a substrate terminal group (first substrate terminal group) 51*e* including substrate terminals 32*a* which are coupled to the solder balls 6*a* in the first solder ball group (first external terminal group or first solder bump group) 51, and in a substrate terminal group (second substrate terminal group) 52*e* including substrate terminals 32*b* which are coupled to the solder balls 6*b* in the second solder ball group (second external terminal group or second solder bump group) 52. As a result, of the upper surface 31*a* of the wiring substrate 31, the region between the substrate terminal group 51*e* (group of the substrate terminals 32*a*) and the substrate terminal group 52*e* (group of the substrate terminals 32*b*) can be used for the routing of the lead-out wires 35 which are coupled to the substrate terminals 32 or the like. Therefore, by applying the manners in which the solder balls 6 are arranged in the semiconductor device 1 of the present embodiment, the lead-out wires 35 coupled to the substrate terminals 32 of the wiring substrate 31 for mounting thereon the semiconductor device 1 are more easily formed on the wiring substrate 31 than in the case of the comparative example of FIGS. 40 and 41 described above. This allows a reduction in the number of layers of the multilayer wiring substrate forming the wiring substrate 31, and hence allows a reduction in the manufacturing cost of the wiring substrate 31.

The spacing $G_1$ between the first solder ball group 51 and the second solder ball group 52 is shown in FIGS. 2, 4, and 37. As can be also seen from FIGS. 2, 4, and 37, it is assumed that the spacing $G_1$ is shown by the distance between the innermost row 61*b* in the first solder ball group 51 and the outermost row 62*a* in the second solder ball group 52. That is, the distance from the center of the innermost row 61*b* in the first solder ball group 51 to the center of the outermost row 62*a* in the second solder ball group 52 corresponds to the spacing $G_1$ between the first solder ball group 51 and the second solder ball group 52.

Additionally, in the present embodiment, by controlling the distance between the adjacent solder balls 6, the solder balls are prevented from coming into contact with each other when the solder ball 6 is collapsed under pressure during the mounting of the semiconductor device. Accordingly, by adjusting the arrangement of the lands 16 preliminarily provided on the wiring substrate 21 and the arrangement of the holes 24*a* of the foregoing mask 24, it is possible to adjust the arrangement of the solder balls 6 on the lower surface of the semiconductor device 1 (lower surface 3*b* of the wiring substrate 3), and thereby control the distance between the adjacent solder balls 6. Therefore, in the present embodiment, it is preferable to equalize the sizes (dimensions or diameters) of the plural solder balls 6 provided on the lower surface of the semiconductor device 1 (lower surface 3*b* of the wiring substrate 3). By equalizing the sizes of the solder balls 6, it is possible to easily form the solder balls 6 on the wiring substrate 21 using, e.g., a method as described above with reference to FIGS. 16 to 21 described above. As a result, it is possible to simplify the steps of manufacturing the semiconductor device, and also reduce the manufacturing cost of the semiconductor device. This also holds true with regard to Embodiments 2 to 6, and 8 shown below.

As described above, the present embodiment can solve the problem resulting from the collapse of the solder ball 6 due to the warping of the semiconductor device 1. Therefore, the present embodiment achieves a great effect when applied to the case where the semiconductor device 1 is prone to warping. When the thermal expansion coefficient of the wiring substrate 3 is larger than the thermal expansion coefficient of the semiconductor chip 2, the warping of the semiconductor device 1 is likely to occur so that the effect obtained by applying the present embodiment is extremely great. The same shall apply with regard to Embodiments 2 to 8 shown below.

In the present embodiment, the solder balls 6 are coupled to the lands 16 on the lower surface 3*b* of the wiring substrate 3 (lower surface 21*b* of the wiring substrate 21). Accordingly, the manner in which the lands 16 are arranged on the lower surface 3*b* of the wiring substrate 3 (lower surface 21*b* of the wiring substrate 21) is the same as the manner in which the solder balls 6 are arranged as described above. Therefore, the description of the arrangement of the solder balls 6 given above in the present embodiment is also applicable to a description of the arrangement of the lands 16. It is appropriate to respectively replace the "solder balls 6", the "solder balls 6*a*", the "solder balls 6*b*", the "first solder ball group 51", and the "second solder ball group 52" with the "lands 16", the "lands 16*a*", the "lands 16*b*", the "first land group 56", and the "second land group 57". The same also holds true with regard to Embodiments 2 to 8 shown below. For example, in each of Embodiments 2 to 8 described later, the manner in which the lands 16 are arranged on the lower surface 3*b* of the wiring substrate 3 (lower surface 21*b* of the wiring substrate 21) is the same as the manner in which the solder balls 6 are arranged described later in Embodiments 2 to 8. Moreover, since the arrangement of the holes 24*a* in the foregoing mask 24 is the same as the arrangement of the lands 16 on the lower surface 21*b* of the wiring substrate 21, the manner in which the holes 24*a* are arranged in the foregoing mask 24 is the same as the manner in which the solder balls 6 are arranged.

In the present embodiment, the mask formed with the plural holes 24*a* is used in Step S5, and the solder balls 6 are attracted by vacuum suction via the holes 24*a* of the mask 24, and coupled to the lands 16 of the wiring substrate 21. Hereinbelow, a description will be given of the usability of this method (ball supply method).

In recent years, in order to respond to the demand for the miniaturization of a semiconductor device, not only the outer dimension of the wiring substrate 21, but also the diameters of the lands 16 formed on the lower surface 21*b* of the wiring substrate 21 tend to decrease. As a method for forming the solder balls 6 on the lands 16, there is a printing method besides the method (i.e., the ball supply method) described in the present embodiment. The printing method forms the solder balls 6 by supplying a solder material onto the lands 16 via a mask similarly formed with holes, and applying heat to the solder material supplied onto the lands 16. However, with the miniaturization of a semiconductor device, the diameters of the lands 16 are further reduced so that the diameters of the holes formed in the mask are also further reduced. The study conducted by the present inventors has proved that, due to the reduced diameters of the holes, it is difficult for the solder material supplied into the holes of the mask by the printing method to be transferred to the lands. Therefore, if the miniaturization of a semiconductor device further proceeds, it is preferable to adopt a so-called ball supply method in which the solder balls 6 preliminarily formed into ball shapes are attracted and held by vacuum suction via the holes 24*a* of the mask 24, and supplied and coupled to the respective lands 16.

When the BGA is mounted on the mounting substrate, the solder balls located closer to the center portion of the lower surface of the wiring substrate forming the BGA may be collapsed under pressure to come into contact with each other. To prevent this, it can be considered to use plural types of solder balls of different sizes, dispose the larger solder balls on the outer portion of the lower surface of the wiring substrate forming the BGA package, and dispose the smaller solder balls on the inner portion of the lower surface of the wiring substrate where the solder balls are prone to collapse. However, when the ball supply method is practiced in one session, the preliminarily formed solder balls are attracted and held by vacuum suction, and then supplied onto the lands. Accordingly, even when the plural solder balls of different sizes are desired to be used, it is difficult to selectively supply the solder balls of desired dimensions to desired positions. That is, in the case of using the ball supply method, it is difficult to dispose the larger solder balls on the lands on the outer portion of the lower surface of the wiring substrate forming the BGA package, and dispose the smaller solder balls on the lands on the inner portion of the lower surface of the wiring substrate.

By contrast, in the present embodiment, as described above, the distance between the lands (which are the lands 16 for coupling to the solder balls 6*b* in the second solder ball group 52) located at the inner portion of the lower surface 3*b* of the wiring substrate 3 is set larger than the distance between the lands (which are the lands 16 for coupling to the solder balls 6*a* in the first solder ball group 51) located at the outer portion of the lower surface 3*b* of the wiring substrate 3. Therefore, even when the solder balls 6 of the same size are used, a contact between the individual solder balls 6 can be inhibited. As a result, it is possible to apply the ball supply method which is advantageous in miniaturizing a semiconductor device.

<Variation>

In the present embodiment, it has been described that, in the second land group 57 formed on the lower surface 3*b* of the wiring substrate 3 of FIG. 2, the lands 16 are arranged with the second pitch higher than the first pitch in the first land group 56. However, the arrangement of the lands 16 in the second land group 57 is not limited thereto.

Figure 42:
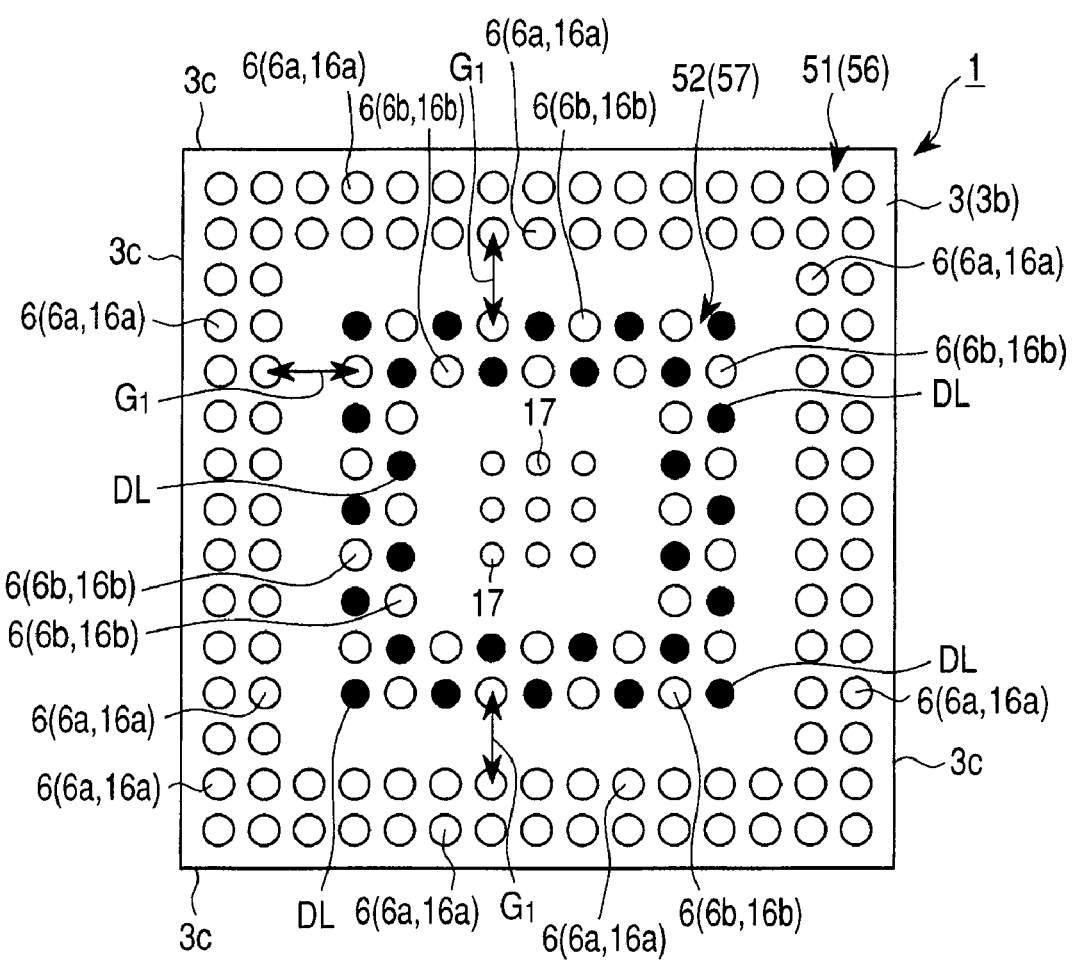
FIG. 42 is a bottom view showing Variation of the semiconductor device of Embodiment 1.

For example, as shown in FIG. 42, if the lands 16 are lands (dummy lands DL) which are not electrically coupled to the electrode pads (electrodes 2*a*) of the semiconductor chip 2, the lands (dummy lands DL) may also be disposed on a portion where the lands 16*b* in the second land group 57 are not disposed. FIG. 42 is a bottom view showing Variation of the semiconductor device 1, which corresponds to FIG. 2 described above. In FIG. 42, for clear illustration of the drawings, the dummy lands DL are indicated by the sold circles. The dummy lands DL shown in FIG. 42 are the lands 16 which are not electrically coupled to the electrodes 2a of the semiconductor chip 2. The lands 16 (16a and 16b) other than the dummy lands DL are electrically coupled to the electrodes 2a of the semiconductor chip 2.

As a result, even when the lands in the second land group 57 (a combination of the lands 16b and the dummy lands DL) disposed on the center-side portion of the lower surface 3b of the wiring substrate 3 are arranged with the same pitch as the pitch (first pitch) of the lands 16a in the first land group 56 located at the peripheral-edge-side portion thereof, the problem of a short-circuit failure can be inhibited.

It is preferable that the solder balls 6 are not disposed on the dummy lands DL. The reason for this is as follows. Even when the solder ball 6 disposed on any of the dummy lands DL comes into contact with the solder ball 6 disposed on the land 16b adjacent to the dummy land DL, an electric failure does not occur. However, there is a risk that, via the solder ball 6 disposed on the dummy land DL, a short circuit may occur between the solder balls 6 which are disposed on both sides of the dummy land DL to serve as supply paths for mutually different signals (or potentials).

(Embodiment 2)

A semiconductor device of Embodiment 2 of the present invention will be described with reference to the drawings.

Figure 43:
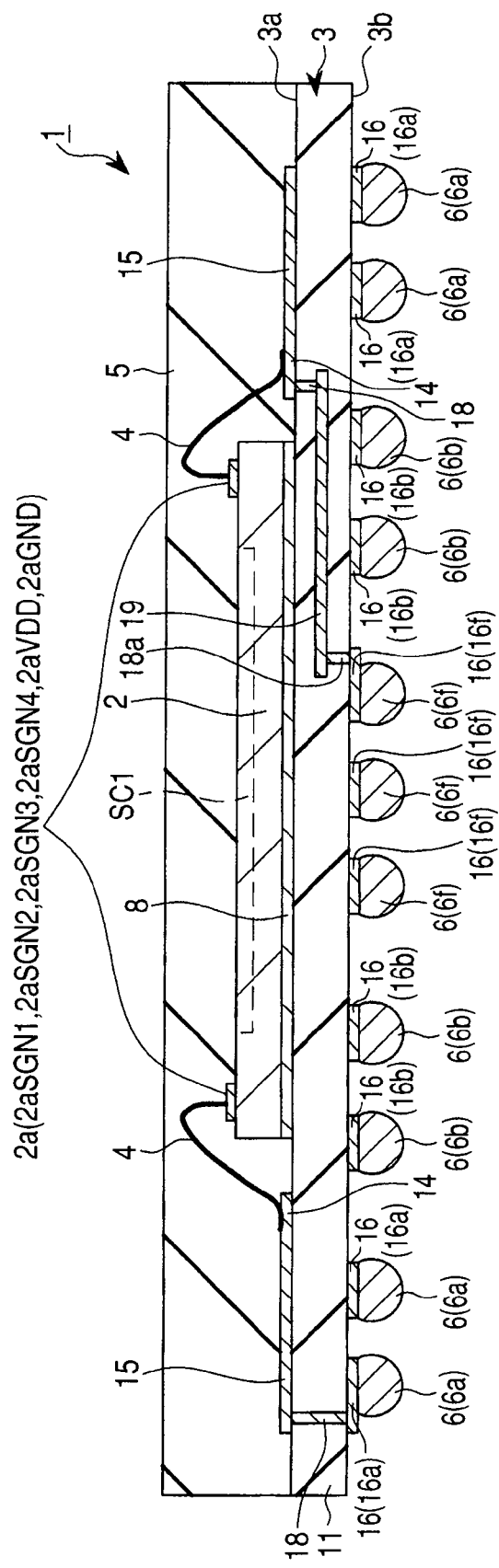
FIG. 43 is a cross-sectional view of a semiconductor device of Embodiment 2 of the present invention.

FIG. 43 is a cross-sectional view (side cross-sectional view) of the semiconductor device 1 according to Embodiment 2, which corresponds to FIG. 4 described above.

In the semiconductor device 1 of FIGS. 1 to 4 described above, the plural terminals for testing 17 are arranged in the vicinity of the center of the lower surface 3b of the wiring substrate 3. However, the present embodiment and Embodiments 3 to 8 shown below are not limited thereto.

For example, in a case where the number of the solder balls 6 serving as signal supply paths further increases as a semiconductor device becomes higher in functionality, and all the solder balls 6a and 6b in the first solder ball group 51, and in the second solder ball group 52 are used exclusively as the solder balls 6 serving as the signal supply paths, solder balls 6f (or lands 16f for coupling to the solder balls 6f) serving as the solder balls 6 for power source potential or reference potential may also be disposed on the near-center portion of the lower surface 3b of the wiring substrate 3. Here, the solder balls 6 serving as the signal supply paths described above are the solder balls 6 electrically coupled to the electrodes for signal 2aSGN1, 2aSGN2, 2aSGN3, and 2aSGN4 of the semiconductor chip 2 via the conductor layers of the wiring substrate 3 and via the bonding wires 4. The near-center portion of the lower surface 3b of the wiring substrate 3 corresponds to the locations at which the terminals for testing 17 are disposed in the semiconductor device 1 of FIGS. 1 to 4 described above. The foregoing solder balls 6f disposed on the near-center portion of the lower surface 3b of the wiring substrate 3 are electrically coupled to the electrodes for power source potential 2aVDD, and to the electrodes for reference potential 2aGND via the conductor layers (such as, e.g., the conductor layer 19 and via wires 18a of FIG. 43) and via the bonding wires 4 as the conductive members.

At the near-center portion of the lower surface 3b of the wiring substrate 3, the distance between a mounting substrate and the lower surface 3b of the wiring substrate 3 becomes minimum when the semiconductor device is mounted on the mounting substrate (corresponding to the wiring substrate described above), and a reflow process is performed. Therefore, when the solder balls 6 are disposed on the near-center portion of the lower surface 3b of the wiring substrate 3, a short circuit is likely to occur between the solder balls 6 on the near-center portion. However, even when a short circuit occurs between the solder balls for power source potential 6f or between the solder balls for reference potential 6f, it does not particularly present a problem associated with circuit operation.

For this reason, as in the semiconductor device 1 of FIG. 43, the solder balls 6 serving as the signal supply paths (which are the solder balls 6 electrically coupled to the electrodes for signal 2aSGN1, 2aSGN2, 2aSBN3, and 2aSGN 4) are disposed (disposed as the first and second solder ball groups 51 and 52 herein) on the portion of the lower surface 3b of the wiring substrate 3 other than the near-center portion thereof, while the solder balls 6 for power source potential and the solder balls 6 for reference potential, i.e., the solder balls 6f are disposed on the near-center portion of the lower surface 3b of the wiring substrate 3. As a result, even when the number of the solder balls 6 further increases, the numerous solder balls 6 can be efficiently disposed on the lower surface 3b of the wiring substrate 3 without causing the problem of a short circuit between the solder balls, and provides adaptability to higher functionality of the semiconductor device (to a larger number of pins thereof). The same also holds true with regard to Embodiments 3 to 8 shown below.

(Embodiment 3)

A semiconductor device of Embodiment 3 of the present invention will be described with reference to the drawings.

Figure 44:
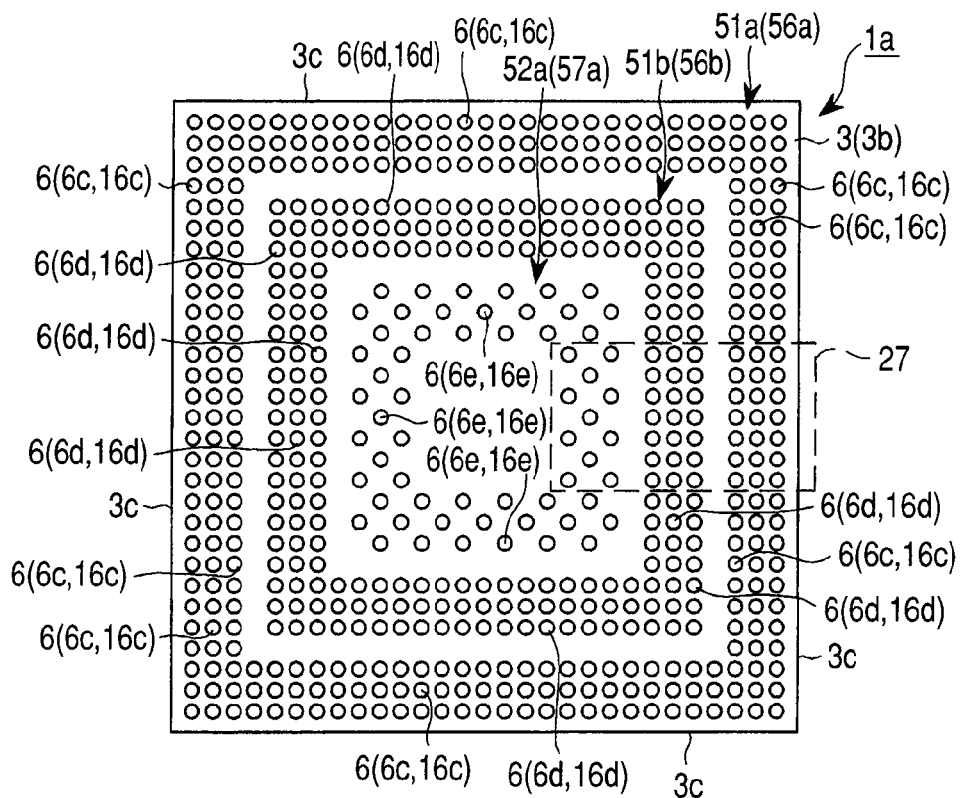
FIG. 44 is a bottom view of a semiconductor device of Embodiment 3 of the present invention.
Figure 45:
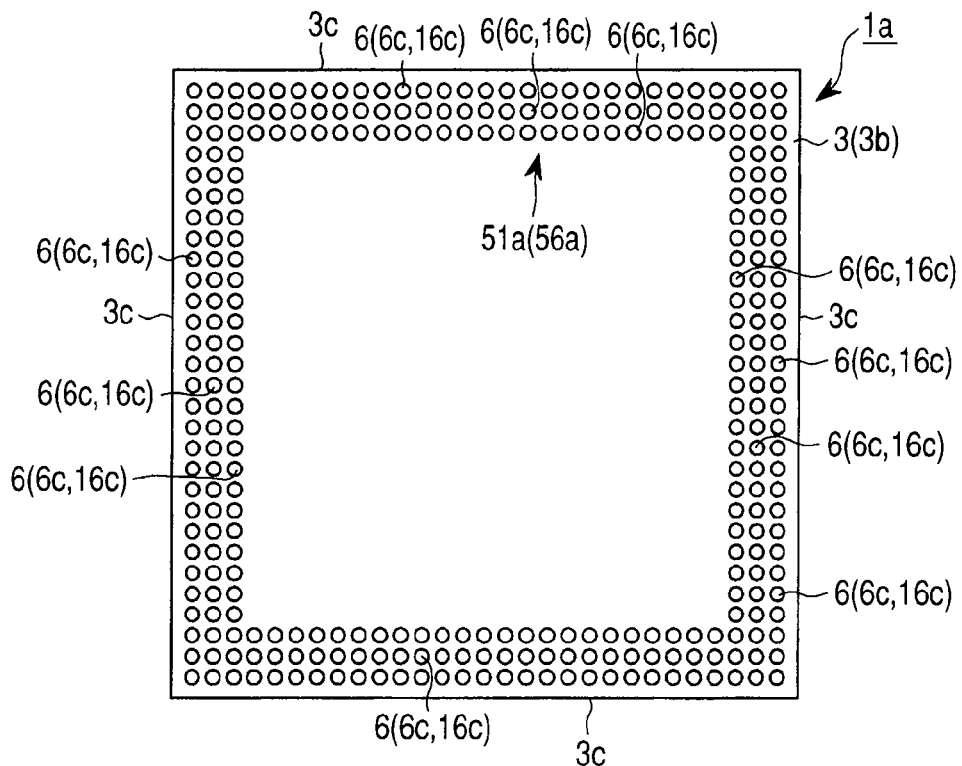
FIG. 45 is an illustrative view of the semiconductor device of Embodiment 3.
Figure 46:
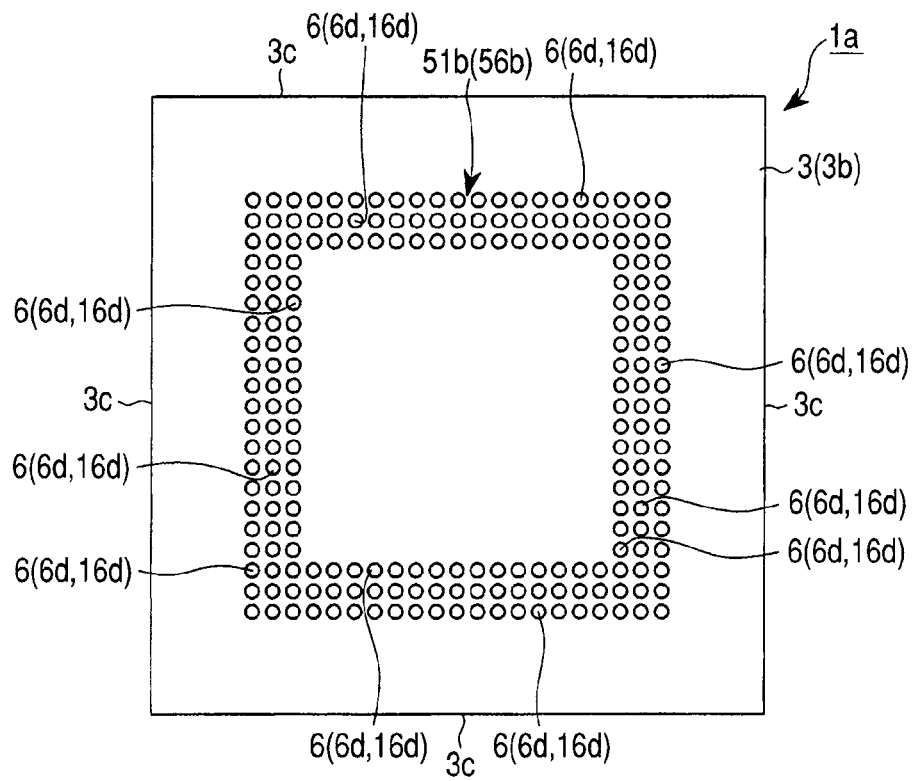
FIG. 46 is an illustrative view of the semiconductor device of Embodiment 3.
Figure 47:
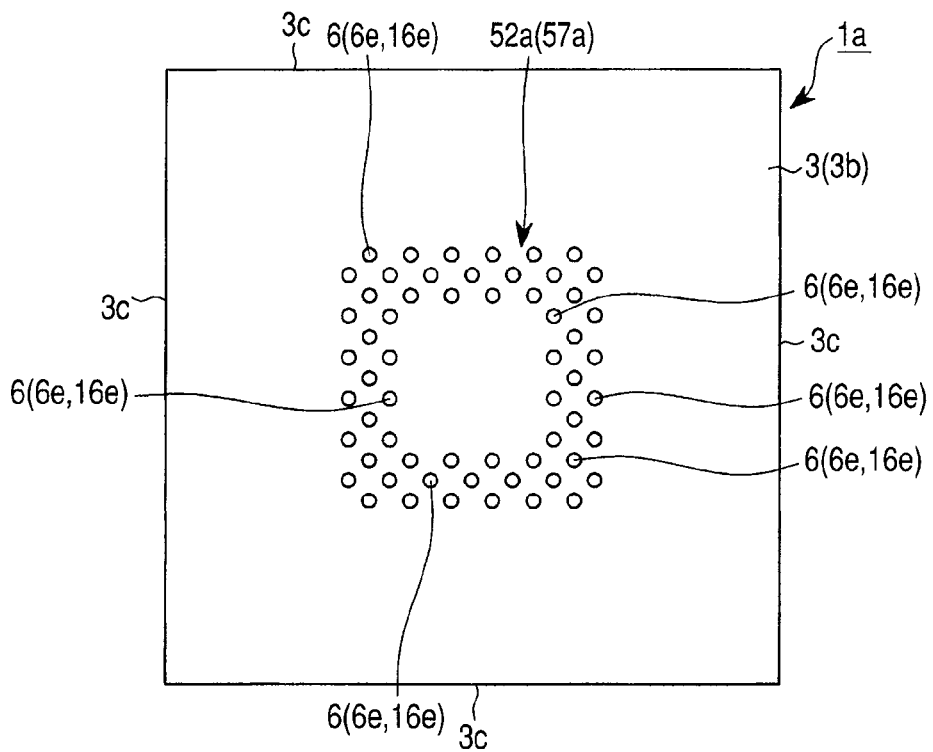
FIG. 47 is an illustrative view of the semiconductor device of Embodiment 3.
Figure 48:
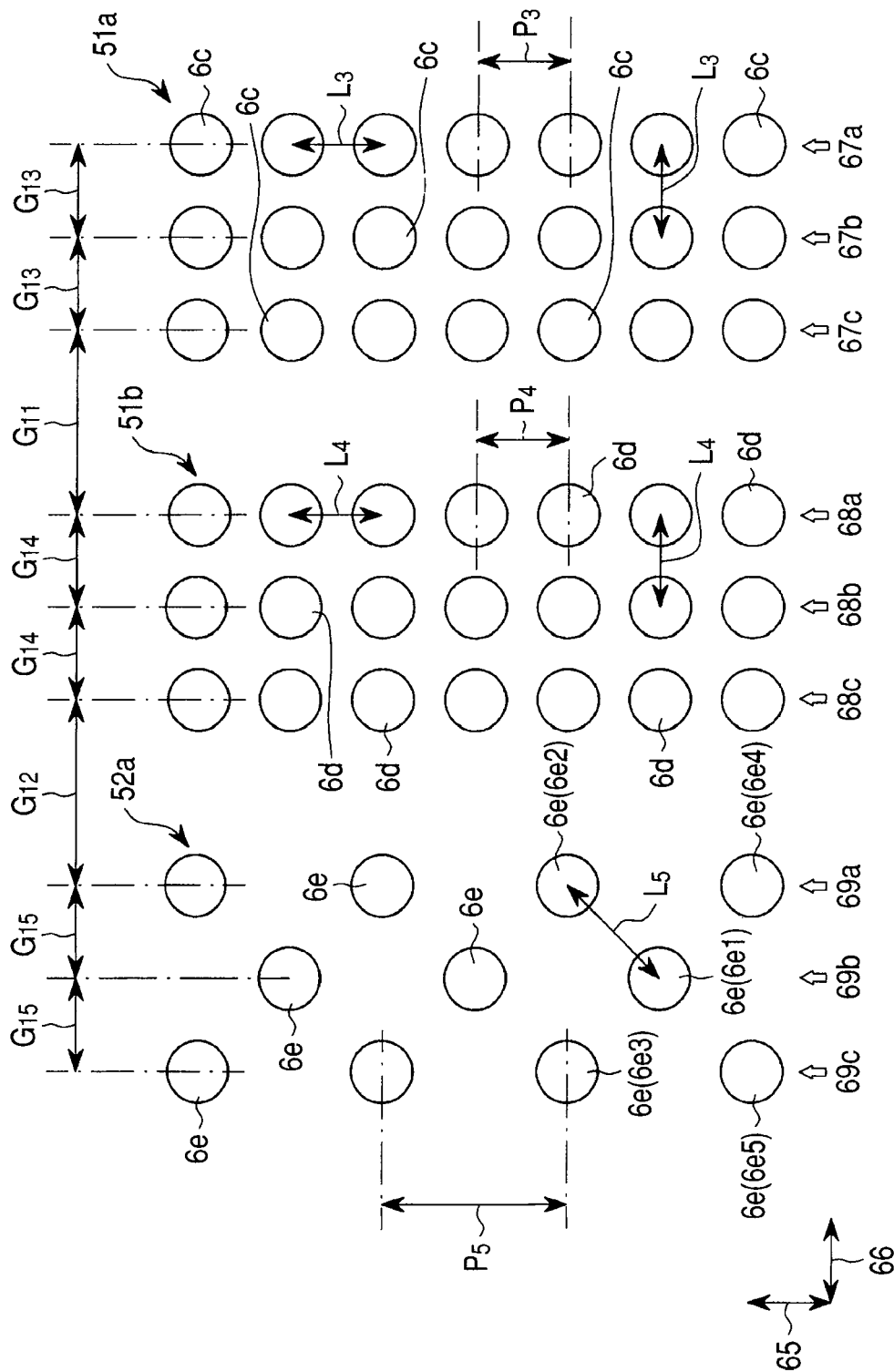
FIG. 48 is an illustrative view of the semiconductor device of Embodiment 3.

FIG. 44 is a bottom view (bottom surface view, back surface view, or plan view) of a semiconductor device 1a of the present embodiment, which corresponds to FIG. 2 of Embodiment 1 described above. FIGS. 45 to 48 are illustrative views of the semiconductor device 1a, in which FIG. 45 shows only the solder balls 6 (i.e., solder balls 6c) belonging to a solder ball group 51a at the lower surface 3b of the wiring substrate 3 of the semiconductor device 1a, and corresponds to a plan view in which the depiction of the solder balls 6 belonging to solder ball groups 51a and 52a is omitted. FIG. 46 shows only the solder balls 6 (i.e., solder balls 6d) belonging to the solder ball group 51b at the lower surface 3b of the wiring substrate 3 of the semiconductor device 1a, and corresponds to a plan view in which the depiction of the solder balls 6 belonging to the solder ball group 51a, and to a solder ball group 52a is omitted. FIG. 47 shows only the solder balls 6 (i.e., solder balls 6e) belonging to the solder ball group 52a at the lower surface 3b of the wiring substrate 3 of the semiconductor device 1a, and corresponds to a plan view in which the depiction of the solder balls 6 belonging to the solder ball groups 51a and 52a is omitted. By comparing FIGS. 44 to 47, it can be easily recognized to which one of the solder ball groups 51a, 51b, and 52a each of the solder balls 6 shown in FIG. 44 belongs. FIG. 48 is a partially enlarged view of the lower surface 3b of the wiring substrate 3 of the semiconductor device 1a. An enlarged view of a region 27b enclosed by the dotted line of FIG. 44 in which only the solder balls 6 (arrangements thereof) are shown substantially corresponds to FIG. 48. As described above in Embodiment 1, in the present embodiment also, the arrangement of the lands 16 on the lower surface 3b of the wiring substrate 3 is the same as the arrangement of the solder balls 6 on the lower surface 3b of the wiring substrate 3 so that, in FIG. 44, the lands 16 are disposed at the same two-dimensional locations as those of the solder balls 6. That is, lands 16c are disposed at the same two-dimensional locations as those of the solder balls 6c in FIGS. 44 and 45, lands 16d are disposed at the same two-dimensional locations as those of the solder balls 6d in FIGS. 44 and 46, and lands 16e are disposed at the same two-dimensional locations as those of the solder balls 6e in FIGS. 44 and 47. In FIG. 48, the lands 16c are disposed at the same two-dimensional locations as those of the solder balls 6c, the lands 16d are disposed at the same two-dimensional locations as those of the solder balls 6d, and the lands 16e are disposed at the same two-dimensional locations as those of the solder balls 6e, though the reference numerals 16c, 16d, and 16e are not given.

The semiconductor device 1a of the present embodiment has substantially the same structure as that of the semiconductor device 1 of Embodiment 1 described above except that the foregoing terminals for testing 17 are not provided on the lower surface 3b of the wiring substrate 3, and the solder balls 6 (or the lands 16) are arranged in a different manner on the lower surface 3b of the wiring substrate 3. Therefore, in the present embodiment, a description will be given of the manner in which the solder balls 6 are arranged on the lower surface 3b of the wiring substrate 3 of the semiconductor device 1a, and a description of the other components of the semiconductor device 1a is omitted. If necessary, it is also possible to provide equivalent for the foregoing terminals for testing 17 on the center portion of the lower surface 3b of the wiring substrate 3 in the present embodiment.

In Embodiment 1 described above and the present embodiment, the plural solder balls 6 (external terminals) provided on the lower surface 3b of the wiring substrate 3 are divided into the plural solder ball groups (external terminal groups or solder bump groups), and arranged. However, in the present embodiment, the plural solder balls 6 are divided into the three solder ball groups (external terminal groups or solder bump groups) 51a, 51b, and 51c, and arranged while, in Embodiment 1, described above, the plural solder balls 6 are divided into the two solder ball groups (51 and 52), and arranged. In the same manner as in Embodiment 1 described above, in the present embodiment also, the solder balls 6 are disposed individually on the lands 16 on the lower surface 3b of the wiring substrate 3. Therefore, the arrangement of the solder balls 6 on the lower surface 3b of the wiring substrate 3 is the same as the arrangement of the lands 16 on the lower surface 3b of the wiring substrate 3. As a result, the plural lands 16 provided on the lower surface 3b of the wiring substrate 3 are also divided into three land groups 56a, 56b, and 57a, similarly to the solder balls in the solder ball groups 51a, 51b, and 52a.

Specifically, the plural solder balls 6 provided on the lower surface of the semiconductor device 1a include the solder ball group 51a in which the solder balls 6 are arranged in a plurality of rows extending in a circulating pattern at the outer-peripheral-side portion of the lower surface 3b of the wiring substrate 3, the solder ball group 51b in which the solder balls 6 are arranged in a plurality of rows extending in a circulating pattern at the portion of the lower surface 3b of the wiring substrate 3 which is closer to the center portion thereof than (inward of) the solder ball group 51a, and the solder ball group 52a in which the solder balls 6 are arranged in a plurality of rows extending in a circulating pattern at the portion of the lower surface 3b of the wiring substrate 3 which is closer to the center portion thereof than (inward of) the solder ball group 51b. Accordingly, it can also be said that the plural lands 16 provided on the lower surface of the semiconductor device 1a include the land group 56a in which the lands 16 are arranged in a plurality of rows extending in a circulating pattern at the outer-peripheral-side portion of the lower surface 3b of the wiring substrate 3, the land group 56b in which the lands 16 are arranged in a plurality of rows extending in a circulating pattern at the portion of the lower surface 3b of the wiring substrate 3 which is closer to the center portion thereof than (inward of) the land group 56a, and the land group 57a in which the lands 16 are arranged in a plurality of rows extending in a circulating pattern at the portion of the lower surface 3b of the wiring substrate 3 which is closer to the center portion thereof than (inward of) the solder ball group 56b. Among the solder ball groups 51a, 51b, and 52a (land groups 56a, 56b, and 57a), the solder ball group 52a (land group 57a) is located at the innermost portion (closest to the center portion) of the lower surface 3b of the wiring substrate 3, the solder ball group 51a (land group 56a) is located at the outermost portion (closest to the outer periphery) of the lower surface 3b of the wiring substrate 3, and the solder ball group 51b (land group 56b) is located between the solder ball group 51a and the solder ball group 52a.

Among the plural solder balls 6 provided on the lower surface 3b of the wiring substrate 3 of the semiconductor device 1a, the solder balls 6 belonging to the solder ball group 51a are called the solder balls 6c by giving the reference numeral 6c thereto, the solder balls 6 belonging to the solder ball group 51b are called the solder balls 6d by giving the reference numeral 6d thereto, and the solder balls belonging to the solder ball group 52a are called the solder balls 6e by giving the reference numeral 6e thereto. Among the plural lands 16 provided on the lower surface 3b of the wiring substrate 3 of the semiconductor device 1a, the lands 16 belonging to the land group 56a are called the lands 16c by giving the reference numeral 16c thereto, the lands 16 belonging to the land group 56b are called the lands 16d by giving the reference numeral 16d thereto, and the lands 16 belonging to the land group 57a are called the lands 16e by giving the reference numeral 16e thereto.

Here, the solder ball group 51a includes the plural solder balls 6c disposed individually on the plural lands 16c including the land group 56a. The solder ball group 51b includes the plural solder balls 6d disposed individually on the plural lands 16d including in the land group 56b. The solder ball group 52a includes the plural solder balls 6e disposed individually on the plural lands 16e including the land group 57a. That is, the individual solder balls 6c in the solder ball group 51a are disposed on the respective lands 16c in the land group 56a. The individual solder balls 6d in the solder ball group 51b are disposed on the respective lands 16d in the land group 56b. The individual solder balls 6e in the solder ball group 52a are disposed on the respective lands 16e in the land group 57a. At the lower surface 3b of the wiring substrate 3, the manner in which the lands 16c in the land group 56a are arranged is the same manner as the manner in which the solder balls 6c in the solder ball group 51a are arranged, the manner in which the lands 16d in the land group 56b are arranged is the same as the manner in which the solder balls 6d in the solder ball group 51b are arranged, and the manner in which the lands 16e in the land group 57a are arranged is the same as the manner in which the solder balls 6e in the solder ball group 52a are arranged. At the lower surface 3b of the wiring substrate 3, the positional relations among the land group 56a, the land group 56b, and the land group 57a are the same as the positional relations between the solder ball group 51a, the solder ball group 51b, and the solder ball group 52a.

In the present embodiment, the manner in which the solder balls 6 (lands 16) are arranged in the solder ball groups 51a and 51b (land groups 56a and 56b) is substantially the same as the manner in which the solder balls 6 (lands 16) are arranged in the first solder ball group 51 (first land group 56) described above in Embodiment 1, except that the number of rows is different. Also, the manner in which the solder balls 6 (lands 16) are arranged in the solder ball group 52a (land group 57a) is substantially the same as the manner in which the solder balls 6 (lands 16) are arranged in the second solder ball group 52 (second land group 57) described above in Embodiment 1, except that the number of rows is different.

That is, in the present embodiment, the plural lands 16 on the lower surface 3b of the wiring substrate 3 include the land group 56a in which the lands 16c are arranged in a plurality of rows along the peripheral edge portion of the lower surface 3b of the wiring substrate 3, the land group 56b in which the lands 16d are arranged inside the land group 56a in the lower surface 3b of the wiring substrate 3, and the land group 57a in which the lands 16e are arranged inside the land group 56b on the lower surface 3b of the wiring substrate 3. Likewise, the plural solder balls 6 on the lower surface 3b of the wiring substrate 3 include the solder ball group 51a in which the solder balls 6c are arranged in a plurality of rows and arranged along the peripheral edge portion of the lower surface 3b of the wiring substrate 3, the solder ball group 51b in which the solder balls 6d are arranged inside the solder ball group 51a on the lower surface 3b of the wiring substrate 3, and the solder ball group 52a in which the solder balls 6e are arranged inside the solder ball group 51b in the lower surface 3b of the wiring substrate 3. In other words, the solder balls 6c in the solder ball group 51a are provided individually on the lands 16c in the land group 56a which are arranged in the plural rows along the peripheral edge portion (each of the sides) of the lower surface 3b of the wiring substrate 3. Also, the solder balls 6d in the solder ball group 51b are disposed individually on the lands 16d in the land group 56b which are arranged in the plural rows at locations inward of the land group 56a on the lower surface 3b of the wiring substrate 3. Also, the solder balls 6e in the solder ball group 52a are disposed individually on the lands 16e in the land group 57a which are arranged in the plural rows at locations inward of the land group 56b on the lower surface 3b of the wiring substrate 3.

In the land groups 56a and 56b, the lands 16 (i.e., the lands 16c and 16d) are arranged with the first pitch (first spacing corresponding to each of pitches $P_3$ and $P_4$ described later). In the land group 57a, the lands 16 (i.e., the lands 16e) are arranged with the second pitch (second spacing corresponding to a pitch $P_5$ described later). Likewise, in the solder ball groups 51a and 51b, the solder balls 6 (i.e., the solder balls 6c and 6d) are arranged with the first pitch (first spacing corresponding to each of the pitches $P_3$ and $P_4$ described later). In the solder ball group 52a, the solder balls 6 (i.e., the solder balls 6e) are arranged with the second pitch (second spacing corresponding to the pitch $P_5$ described later).

In the same manner as described above in Embodiment 1, in the present embodiment also, the solder balls 6 are coupled to the lands 16 on the lower surface 3b of the wiring substrate 3, so that the manner in which the lands 16 are arranged on the lower surface 3b of the wiring substrate 3 is the same as the manner in which the solder balls 6 are arranged on the lower surface 3b of the wiring substrate 3, which will be described hereinbelow in detail. Therefore, the description of the arrangement of the solder balls 6 given in the present embodiment is also applicable to a description of the arrangement of the lands 16. In this case, it is appropriate to respectively replace the "solder balls 6", the "solder balls 6c", the "solder balls 6d", the "solder balls 6e", the "solder ball group 51a", the "solder ball group 51b", and the "solder ball group 52a" with the "lands 16", the "lands 16c", the "lands 16d", the "lands 16e", the "land group 56a", "land group 56b", and the "land group 57a".

The solder balls 6c belonging to the solder ball group 51a are regularly arranged in a plurality of rows (which are three rows herein) along the outer periphery of the lower surface 3b of the wiring substrate 3, and arranged in a circulating pattern generally parallel with each of the sides 3c of the rectangular wiring substrate 3. The solder balls 6d belonging to the solder ball group 51b are regularly arranged in a plurality of rows (which are three rows herein) at locations closer to the center portion (center portion of the lower surface 3b of the wiring substrate 3) than the solder ball group 51a, and arranged in a circulating pattern generally parallel with each of the sides 3c of the rectangular wiring substrate 3. The solder balls 6e belonging to the solder ball group 52a are regularly arranged in a plurality of rows (which are three rows herein) at locations closer to the center portion (center portion of the lower surface 3b of the wiring substrate 3) than the solder ball group 51b, and arranged in a circulating pattern generally parallel with each of the sides 3c of the rectangular wiring substrate 3.

The solder ball groups 51a, 51b, and 52a are apart from each other with predetermined spacings (larger than the spacings between the rows in the solder ball groups 51a, 51b, and 52a) being provided therebetween. A spacing (distance) $G_{11}$ between the solder ball groups 51a and 51b, and a spacing (distance) $G_{12}$ between the solder ball groups 51b and 52a are larger than a spacing (row-to-row distance or row pitch) $G_{13}$ between the rows in the solder ball group 51a, than a spacing (row-to-row distance or row pitch) $G_{14}$ between the rows in the solder ball group 51b, and than a spacing (row-to-row distance or row pitch) $G_{15}$ between the rows in the solder ball group 52a. That is, $G_{11}$, $G_{12} > G_{13}$, $G_{14}$, $G_{15}$ is established.

Here, each of the respective spacings $G_{11}$ and $G_{12}$ between the solder ball groups 51a and 51b and between the solder ball groups 51b and 52a corresponds to the spacing $G_1$ between the first and second solder ball groups 51 and 52 described above in Embodiment 1. Therefore, it is assumed that the spacing $G_{11}$ between the solder ball group 51a and the solder ball group 51b is shown by the distance between the innermost row 67c in the solder ball group 51a and the outermost row 68a in the solder ball group 51b. It is also assumed that the spacing $G_{12}$ between the solder ball group 51b and the solder ball group 52a is shown by the distance between the innermost row 68c in the solder ball group 51b and the outermost row 69a in the solder ball group 52a.

Each of the spacings $G_{13}$ and $G_{14}$ between the rows in the solder ball groups 51a and 51b corresponds to the spacing $G_2$ between the rows in the first solder ball group 51 described above in Embodiment 1, and similarly defined. On the other hand, the spacing $G_{15}$ between the rows in the solder ball group 52a corresponds to the spacing $G_3$ between the rows in the second solder ball group 52 described above in Embodiment 1, and similarly defined.

The arrangement of the solder balls 6c in the solder ball group 51a is the same as the arrangement of the solder balls 6a in the first solder ball group 51 described above in Embodiment 1, except that the number of rows is larger by one. As a result, at the lower surface 3b of the wiring substrate 3, the solder balls 6c in the solder ball group 51a are regularly arranged (with an equal pitch or at equal spacings) in a plurality of rows (which are the three rows 67a, 67b, and 67c) extending in a circulating pattern along each of the sides 3c of the lower surface 3b of the wiring substrate 3, and the solder balls (solder balls 6c) in the adjacent rows 67a, 67b, and 67c are arranged in alignment with each other.

That is, in the solder ball group 51a, the solder balls 6c belonging to the adjacent rows overlap (are in alignment with) each other when viewed in a direction orthogonal to the extending direction of the rows. In the solder ball group 51a, the plural rows 67a, 67b, and 67c extend in a circulating pattern in parallel with the sides 3c of the lower surface 3b of the wiring substrate 3 so that the extending direction of the rows are in parallel with the sides 3c. Specifically, the solder balls 6c belonging to the row 67a, the solder balls 6c belonging to the row 67b, and the solder balls 6c belonging to the row 67c, which are shown in FIG. 48, overlap (are in alignment with) each other when viewed in a direction (which is the direction 66 in FIG. 48) orthogonal to the extending direction of the rows (which is the direction 65 in FIG. 48).

Here, since the arrangement of the solder balls 6c in the solder ball group 51a is the same as the arrangement of the lands 16c in the land group 56a, it can also be said that, in the land group 56a, the lands 16c are arranged in a plurality of rows (which are the three rows 67a, 67b, and 67c herein), and the lands 16 (lands 16c) in the adjacent rows are arranged in alignment with each other. That is, in the land group 56a, the lands 16c belonging to the adjacent rows overlap (are in alignment with) each other when viewed in a direction orthogonal to the extending direction of the rows.

The manner in which the solder balls 6d are arranged in the solder ball group 51b is the same as the manner in which the solder balls 6c are arranged in the solder ball group 51a. That is, at the lower surface 3b of the wiring substrate 3, the solder balls 6d in the solder ball group 51b are regularly arranged (with an equal pitch or at equal spacings) in a plurality of rows (which are the three rows 68a, 68b, and 68c herein) extending in a circulating pattern along each of the sides 3c of the lower surface 3b of the wiring substrate 3 and inwardly of the solder ball group 51a, and the solder balls (solder balls 6d) in the adjacent rows 68a, 68b, and 68c) are arranged in alignment with each other.

As a result, in the solder ball group 51b, the solder balls 6d belonging to the adjacent rows overlap (in alignment with) each other when viewed in a direction orthogonal to the extending direction of the rows. In the solder ball group 51b, the plural rows 68a, 68b, and 68c extend in a circulating pattern in parallel with the sides 3c of the lower surface 3b of the wiring substrate 3 so that the extending direction of the rows is parallel with the sides 3c. Specifically, the solder balls 6d belonging to the row 68a, the solder balls 6d belonging to the row 68b, and the solder balls 6d belonging to the row 68c, which are shown in FIG. 48, overlap (are in alignment with) each other when viewed in a direction (which is the direction 66 in FIG. 48) orthogonal to the extending direction of the rows (which is the direction 65 in FIG. 48).

Here, since the arrangement of the solder balls 6d in the solder ball group 51b is the same as the arrangement of the lands 16d in the land group 56b, it can also be said that, in the land group 56b, the lands 16d are arranged in a plurality of rows (which are the three rows 68a, 68b, and 68c herein), and the lands 16 (lands 16d) in the adjacent rows are arranged in alignment with each other. That is, in the land group 56b, the lands 16d belonging to the adjacent rows overlap (are in alignment with) each other when viewed in a direction orthogonal to the extending direction of the rows.

In the solder ball group 51a, the solder balls in the adjacent rows 67a, 67b, and 67c are arranged in alignment with each other so that the pitch $P_3$ of the solder balls 6c in the row 67a, the pitch $P_3$ of the solder balls 6c in the row 67b, and the pitch $P_3$ of the solder balls 6c in the row 67c are the same. Likewise, in the solder ball group 51b, the solder balls in the adjacent rows 68a, 68b, and 68c are arranged in alignment with each other so that the pitch $P_4$ of the solder balls 6d in the row 68a, the pitch $P_4$ of the solder balls 6d in the row 68b, and the pitch $P_4$ of the solder balls 6d in the row 68c are the same. It is also possible to consider that, in the solder ball groups 51a and 51b, the solder balls 6 are arranged in an array configuration.

As can be also seen from FIG. 48, it is assumed that the pitch $P_3$ of the solder balls 6c in each of the rows in the solder ball group 51a is shown by the distance between the respective centers of the solder balls 6c (or the lands 16c coupled to the solder balls 6c) each belonging to the same row (which is the row 67a, the row 67b, or the row 67c herein). As can be also seen from FIG. 48, it is assumed that the pitch $P_4$ of the solder balls 6d in each of the rows in the solder ball group 51b is shown by the distance between the respective centers of the solder balls 6d (or the lands 16d coupled to the solder balls 6d) each belonging to the same row (which is the row 68a, the row 68b, or the row 68c herein).

In order to increase the arrangement efficiency of the solder balls 6c in the solder ball group 51a, the spacing (row-to-row distance) $G_{13}$ between the rows is preferably the same for each of the rows 67a, 67b, and 67c. That is, the spacing (row-to-row distance) $G_{13}$ between the rows 67a and 67b and the spacing (row-to-row distance) $G_{13}$ between the rows 67b and 67c are preferably the same. Likewise, in order to increase the arrangement efficiency of the solder balls 6d in the solder ball group 51b, the spacing (row-to-row distance) $G_{14}$ between the rows is preferably the same for each of the rows 68a, 68b, and 68c. That is, the spacing (row-to-row distance) $G_{14}$ between the rows 68a and 68b and the spacing (row-to-row distance) $G_{14}$ between the rows 68b and 68c are preferably the same. Also, in order to increase the arrangement efficiency of the solder balls 6c in the solder ball group 51a, the spacing (row-to-row distance) $G_{13}$ between the rows and the pitch (arrangement pitch or spacing) $P_3$ of the solder balls 6c in each of the rows are preferably substantially the same (i.e., $P_3=G_{13}$). Likewise, in order to increase the arrangement efficiency of the solder balls 6d in the solder ball group 51b, the spacing (row-to-row distance) $G_{14}$ between the rows and the pitch (arrangement pitch or spacing) $P_4$ of the solder balls 6d in each of the rows are preferably substantially the same (i.e., $P_4=G_{14}$). Also, in order to increase the arrangement efficiency of the solder balls 6 in the solder ball groups 51a and 51b, the arrangement pitch $P_3$ in the solder ball group 51a and the arrangement pitch $P_4$ in the solder ball group 51b are preferably substantially the same (i.e., $P_3=P_4$), and the spacing $G_{13}$ between the rows in the solder ball group 51a and the spacing $G_{14}$ between the rows in the solder ball group 51b are preferably substantially the same (i.e., $G_{13}=G_{14}$).

In the solder ball group 51a in which the solder balls in the adjacent rows 67a, 67b, and 67c are arranged in alignment with each other, a distance $L_3$ between the adjacent solder balls 6c coincides with the pitch $P_3$ of the solder balls 6c in each of the rows or with the spacing $G_{13}$ between the rows (the smaller one of the pitch $P_3$ and the spacing $G_{13}$ or either one of the pitch $P_3$ and the spacing $G_{13}$ when the pitch $P_3$ and the spacing $G_{13}$ are equal) (i.e., $L_3=\min(P_3, G_{13})$). Likewise, in the solder ball group 51b in which the solder balls in the adjacent rows 68a, 68b, and 68c are arranged in alignment with each other, a distance $L_4$ between the adjacent solder balls 6d coincides with the pitch $P_4$ of the solder balls 6d in each of the rows or with the spacing $G_{14}$ between the rows (the smaller one of the pitch $P_4$ and the spacing $G_{14}$ or either one of the pitch $P_4$ and the spacing $G_{14}$ when the pitch $P_4$ and the spacing $G_{14}$ are equal) (i.e., $L_4=\min(P_4, G_{14})$). This is because, in the same manner as in the first solder ball group 51 described above, another solder ball 6 located closest to a certain solder ball 6 in the solder ball groups 51a and 51b is either another solder ball 6 belonging to the same row as that of the solder ball 6, and adjacent to the solder ball 6 in the extending direction of the row (which is the direction 65 in FIG. 48), or another solder ball 66 belonging to a neighboring row, and adjacent to the solder ball 6 in a direction (which is the direction 66 in FIG. 48) orthogonal to the extending direction of the row.

When $P_3=P_4$ and $G_{13}=G_{14}$ are set as described above, the distance $L_3$ between the adjacent solder balls 6c in the solder ball group 51a and the distance $L_4$ between the adjacent solder balls 6d in the solder ball group 51b are the same (i.e., $L_3=L_4$). When $P_3=P_4=G_{13}=G_{14}$ is set in the solder ball groups 51a and 51b, $L_3=L_4=P_3=P_4=G_{13}=G_{14}$ is established, which is most preferable if consideration is given to the arrangement efficiency of the solder balls 6c and 6d.

On the other hand, the arrangement of the solder balls 6e in the solder ball group 52a is the same as the arrangement of the solder balls 6b in the second solder ball group 52 described above in Embodiment 1, except that the number of rows is larger by one. As a result, at the lower surface 3b of the wiring substrate 3, the solder balls 6e in the solder ball group 52a are regularly arranged (with an equal pitch or at equal spacings) in a plurality of rows (which are the three rows 69a, 69b, and 69c) extending in a circulating pattern along each of the sides 3c of the lower surface 3b of the wiring substrate 3 and inwardly of the solder ball group 51b, but the solder balls (solder balls 6e) in the adjacent rows 69a, 69b, and 69c are arranged out of alignment with each other.

That is, in the solder ball group 52a, the solder balls 6e belonging to the adjacent rows do not overlap (are misaligned or out of alignment with) each other when viewed in a direction orthogonal to the extending direction of the rows. In the solder ball group 52a, the plural rows 69a, 69b, and 69c extend in a circulating pattern in parallel with the sides 3c of the lower surface 3b of the wiring substrate 3 so that the extending direction of the rows are parallel with the sides 3c. Specifically, the solder balls 6e belonging to the row 69a and the solder balls 6e belonging to the row 69b, which are shown in FIG. 48, do not overlap (are misaligned or out of alignment with) each other when viewed in a direction (which is the direction 66 in FIG. 48) orthogonal to the extending direction of the rows (which is the direction 65 in FIG. 48). Likewise, the solder balls 6e belonging to the row 69b and the solder balls 6e belonging to the row 69c, which are shown in FIG. 48, do not overlap (are misaligned or out of alignment with) each other when viewed in a direction (which is the direction 66 in FIG. 48) orthogonal to the extending direction of the rows (which is the direction 65 in FIG. 48). In other words, in the solder ball group 52a, between the solder balls 6e in the row 69a, the solder balls 6e in the row 69b adjacent to the row 69a are located and, between the solder balls 6e in the row 69b, the solder balls 6e in the row 69c adjacent to the row 69b are located. Accordingly, it is also possible to consider that, in the solder ball group 52a, the solder balls 6e are arranged in a so-called staggered pattern.

Here, since the arrangement of the solder balls 6e in the solder ball group 52a is the same as the arrangement of the lands 16e in the land group 57a, it can also be said that, in the land group 57a, the lands 16e are arranged in a plurality of rows (which are the three rows 69a, 69b, and 69c), and the lands 16 (lands 16e) in the adjacent rows are arranged out of alignment with each other. That is, in the land group 57a, the lands 16e belonging to the adjacent rows do not overlap (are misaligned or out of alignment with) each other when viewed in a direction orthogonal to the extending direction of the rows. In other words, in the land group 57a, between the lands 16e belonging to each of the rows, the lands 16e belonging to a row adjacent thereto is located when viewed in a direction orthogonal to the extending direction of the rows.

If consideration is given to the arrangement efficiency of the solder balls 6e, the pitch (arrangement pitch or spacing) $P_5$ of the solder balls 6e is preferably the same for each of the rows 69a, 69b, and 69c belonging to the solder ball group 52a, i.e., the pitch $P_5$ of the solder balls 6e in the row 69a, the pitch $P_5$ of the solder balls 6e in the row 69b, and the pitch $P_5$ of the solder balls 6e in the row 69c are preferably the same. Also, in order to increase the arrangement efficiency of the solder balls 6e in the solder ball group 52a, the spacing (row-to-row distance) $G_{15}$ between the rows is preferably the same for each of the rows 69a, 69b, and 69c. That is, the spacing (row-to-row distance) $G_{15}$ between the rows 69a and 69b and the spacing (row-to-row distance) $G_{15}$ between the rows 69b and 69c are preferably the same. Also, in order to increase the arrangement efficiency of the solder balls 6e in the solder ball group 52a, the pitch $P_5$ of the solder balls 6e in the row 69a, the pitch $P_5$ of the solder balls 6e in the row 69b, and the pitch $P_5$ of the solder balls 6e in the row 69c are preferably the same.

As can be also seen from FIG. 48, it is assumed that the pitch $P_5$ of the solder balls 6e in each of the rows in the solder ball group 52a is shown by the distance between the respective centers of the solder balls 6e (or the lands 16e coupled to the solder balls 6e) each belonging to the same row (which is the row 69a, the row 69b, or the row 69c herein).

In addition, the pitch $P_5$ of the solder balls 6e in each of the rows 69a, 69b, and 69c in the solder ball group 52a is set higher than the pitch $P_3$ of the solder balls 6c in each of the rows 67a, 67b, and 67c in the solder ball group 51a, and than the pitch $P_4$ of the solder balls 6d in each of the rows 68a, 68b, and 68c in the solder ball group 51b (i.e., $P_5>P_3$, $P_4$). The reason for the setting is that, when the pitch $P_5$ of the solder balls 6e is set lower than the pitches $P_3$ and $P_4$ of the solder balls 6c and 6d unlike in the present embodiment, a distance $L_5$ between the adjacent solder balls 6e is undesirably lower than the distance $L_3$ between the adjacent solder balls 6c or the distance $L_4$ between the adjacent solder balls 6e.

In the solder ball group 52a in which the solder balls in the adjacent rows 69a, 69b, and 69c are arranged out of alignment with each other, another solder ball 6e located closest to a certain solder ball 6e (which is assumed to be the solder ball 6e1 of FIG. 48, and described as such herein) is any one of solder balls 6e2, 6e3, 6e4, and 6e5 which belong to the rows 69a and 69c adjacent to the row of the solder ball 6e1, and are adjacent to the solder ball 6e1 in directions orthogonal to the extending direction of the rows (which is the direction 65 in FIG. 48). Accordingly, the distance $L_5$ between the adjacent solder balls 6e in the solder ball group 52a is the same as the smallest one of the respective distances between the solder ball 6e1 and the solder balls 6e2, 6e3, 6e4, and 6e5.

As a result, in the solder ball group 52a, the distance $L_5$ between the adjacent solder balls 6e is larger than the spacing (row-to-row distance) $G_{15}$ between the rows in the solder ball group 52a ($L_5>G_{15}$). This is because, in the solder ball group 52a, the solder balls in the adjacent rows are arranged out of alignment with each other so that the direction in which the solder balls 6e are adjacent (the direction in which the solder balls 6b are in closest proximity) is neither the extending direction 65 of the rows nor the direction 66 orthogonal to the extending direction of the rows, but the diagonal direction between the two directions.

In the solder ball group 52a, the solder balls in the adjacent rows are preferably arranged to be misaligned by a ½ pitch (i.e., $P_5/2$). As a result, between the solder balls 6e in the row 69a, the solder balls 6e in the neighboring row 69b are located and, between the solder balls 6e in the row 69b, the solder balls 6e in the neighboring row 69c are located. Therefore, it is possible to maximize the distance $L_5$ between the adjacent solder balls 6e in the solder ball group 52a. This is because, e.g., the solder balls 6e2, 6e3, 6e4, and 6e5 become equidistant from the solder ball 6e1. Note that, in the solder ball group 52a, when the solder balls 6e in the adjacent rows are arranged to be misaligned by a ½ pitch (i.e., $P_5/2$), the solder balls 6e in the adjacent rows 69a and 69b are arranged in misalignment with each other, and the solder balls 6e in the adjacent rows 69b and 69c are arranged in misalignment with each other. However, the solder balls 6e in the rows 69a and 69c, which are not adjacent to each other, are arranged in alignment with each other.

In the present embodiment, the plural solder balls 6 are provided on the lower surface 3b of the wiring substrate 3 of the semiconductor device 1a, and the plural solder balls 6 include the plural solder ball groups 51a, 51b, and 52a. In the solder ball group 52a which is located closest to the center portion of the lower surface 3b of the wiring substrate 3 among the plural solder ball groups 51a, 51b, and 52a, the distance between the adjacent solder balls 6 is set larger than in the solder ball groups 51a and 51b other than the solder ball group 52a. That is, the distance $L_5$ between the adjacent solder balls 6 in the solder ball group 52a which is located closest to the center portion (center portion of the lower surface 3b of the wiring substrate 3) among the plural solder ball groups 51a, 51b, and 52a is set larger than the distances $L_3$ and $L_4$ between the adjacent solder balls 6 in the solder ball groups 51a and 51b other than the solder ball group 52a (i.e., $L_5 > L_3, L_4$).

As described above in Embodiment 1, in the solder reflow step during the mounting of the semiconductor device 1a, the solder ball 6 located closer to the center portion of the lower surface 3b of the wiring substrate 3 is more likely to be collapsed under pressure due to the warping of the semiconductor device 1a. Therefore, of the solder balls 6e in the solder ball groups 51a, 51b, and 52a, the solder balls 6e in the solder ball group 52a are most likely to be collapsed under pressure in the solder reflow step during the mounting of the semiconductor device 1a.

In view of this, in the present embodiment, the distance $L_5$ between the adjacent solder balls 6e in the solder ball group 52a is set larger than the distances $L_3$ and $L_4$ between the adjacent solder balls 6 in the solder ball groups 51a and 51b ($L_5 > L_3, L_4$). As a result, even when the solder ball 6e is collapsed under pressure during the mounting of the semiconductor device 1a, it is possible to prevent the solder balls 6e from coming into contact with each other. This is due to the large distance (i.e., distance $L_5$) between the collapsed solder ball 6e and another solder ball 6e closest to the collapsed solder ball 6e. Therefore, when the semiconductor device 1a is mounted on the wiring substrate 31, a short circuit between the solder balls 6 (46) can be prevented, and the yield of mounting the semiconductor device 1a can be improved. In addition, the reliability (mounting reliability) of the semiconductor device 1a can also be improved.

On the other hand, among the solder ball groups 51a, 51b, and 52a, the solder ball groups 51a and 51b other than the solder ball group 52a are more distant from the center portion of the lower surface 3b of the wiring substrate 3 than the solder ball group 52a so that the solder balls therein are less likely to be collapsed under pressure in the solder reflow step during the mounting of the semiconductor device 1a. Therefore, in the solder ball groups 51a and 51b other than the solder ball group 52a, the layout density of the solder balls 6 can be increased by reducing the distances $L_3$ and $L_4$ between the adjacent solder balls 6 in the solder ball groups 51a and 51b (to values smaller than the distance $L_5$). This allows the implementation of the semiconductor device 1a having a larger number of terminals and a smaller size (smaller area).

Further, in the present embodiment, the solder balls 6 provided on the lower surface of the semiconductor device 1a (lower surface 3b of the wiring substrate 3) include the plural solder ball groups 51a, 51b, and 52a. Among them, in the solder ball group 52a, the solder balls in the adjacent rows are arranged out of alignment with each other while, in the solder ball groups 51a and 51b, the solder balls in the adjacent rows are arranged in alignment with each other. This allows an increase in the layout density of the solder balls 6 in the solder ball groups 51a and 51b, and also allows an increase in the distance $L_5$ between the adjacent solder balls 6e without increasing the spacing $G_{15}$ between the rows, in the same manner as in the second solder ball group 52 described above in Embodiment 1. Thus, by increasing the distance $L_5$ between the adjacent solder balls 6e, it is possible to not only prevent a short-circuit failure between the solder balls 6 (46) when the semiconductor device 1a is mounted on the wiring substrate 31, but also dispose the solder balls 6e at locations maximally distant from the center portion of the lower surface 3b of the wiring substrate 3. As a result, the phenomenon of collapse of the solder ball 6e during the mounting of the semiconductor device 1a can be inhibited. This allows an improvement in the yield of mounting the semiconductor device 1a, and also allows an improvement in the reliability (mounting reliability) of the semiconductor device 1a. In addition, since the arrangement efficiency of the solder balls 6 at the lower surface 3b of the wiring substrate 3 can be increased, it is possible to implement the semiconductor device 1 having a larger number of terminals and a smaller size (smaller area). In the same manner as in Embodiment 1 described above, the spacing $G_{15}$ between the rows in the solder ball group 52a is preferably smaller than the pitch $P_5$ of the solder balls 6e in each of the rows in the solder ball group 52a (i.e., $G_{15} < P_5$), or more preferably substantially the same as or not more than the spacings $G_{13}$ and $G_{14}$ between the rows in the solder ball groups 51a and 51b (i.e., $G_{15} \leq G_{13}, G_{14}$).

In the present embodiment, the solder balls 6 provided on the lower surface of the semiconductor device 1 (lower surface 3b of the wiring substrate 3) are divided into the plural solder ball groups 51a, 51b, and 52a. Therefore, for the same reason as given above in Embodiment 1, the lead-out wires 35 coupled to the substrate terminals 32 of the wiring substrate 31 for mounting thereon the semiconductor device 1a are easily formed on the wiring substrate 31. This allows a reduction in the number of layers of the multilayer wiring substrate forming the wiring substrate 31, and hence allows a reduction in the manufacturing cost of the wiring substrate 31. Note that, when the semiconductor device 1a is mounted on the wiring substrate 31, the substrate terminals 32 of the wiring substrate 31 are in an arrangement corresponding to the arrangement of the solder balls 6 at the lower surface of the semiconductor device 1a (lower surface 3b of the wiring substrate 3).

(Embodiment 4)

A semiconductor device of the present embodiment will be described with reference to the drawings.

Figure 49:
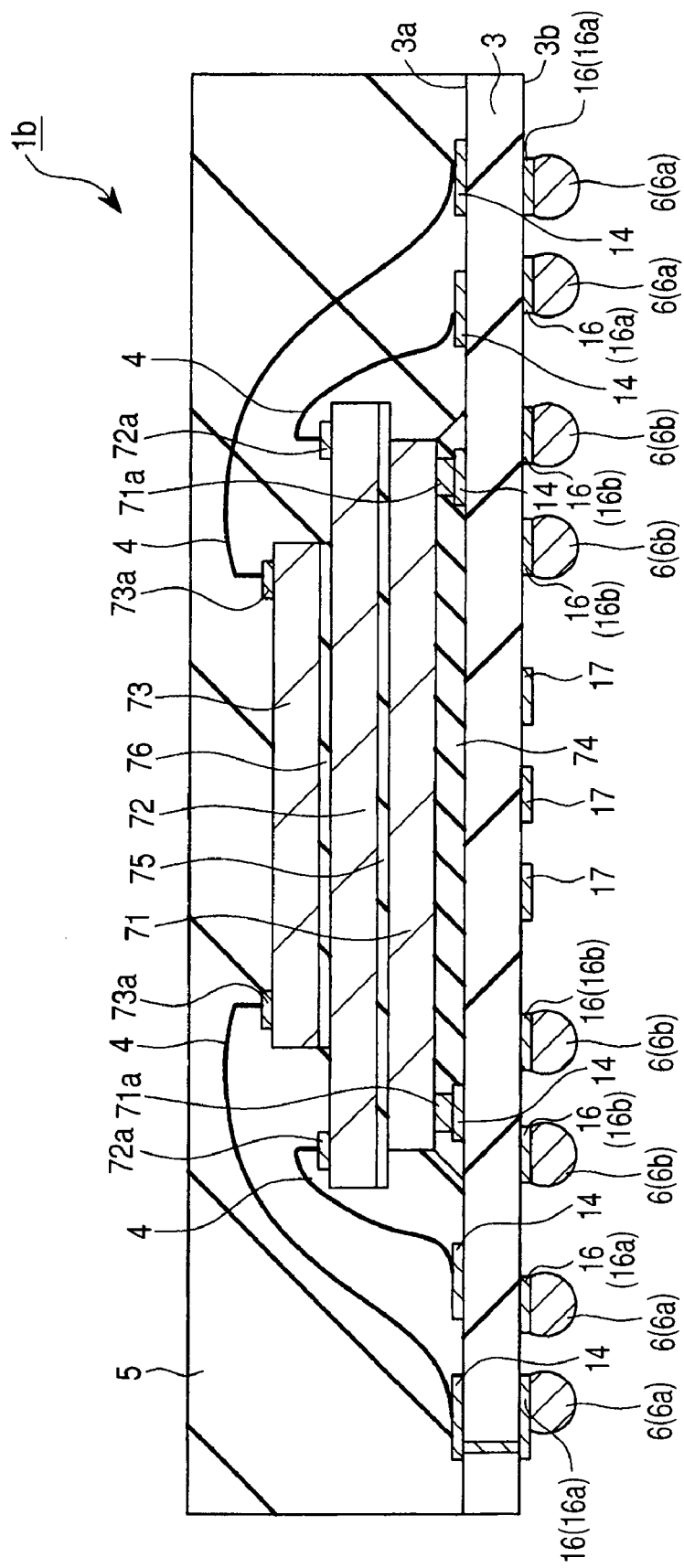
FIG. 49 is a cross-sectional view of a semiconductor device of Embodiment 4 of the present invention.
Figure 50:
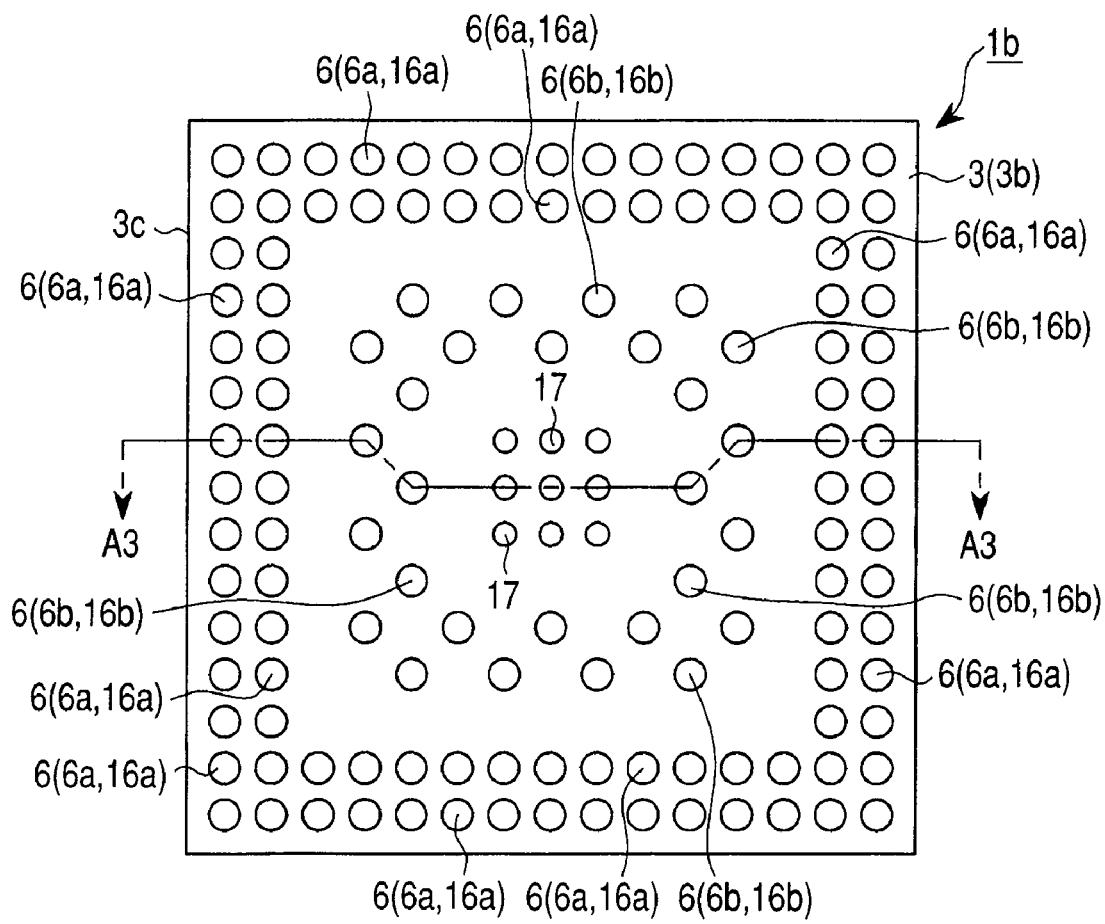
FIG. 50 is a bottom view of the semiconductor device of Embodiment 4.
Figure 51:
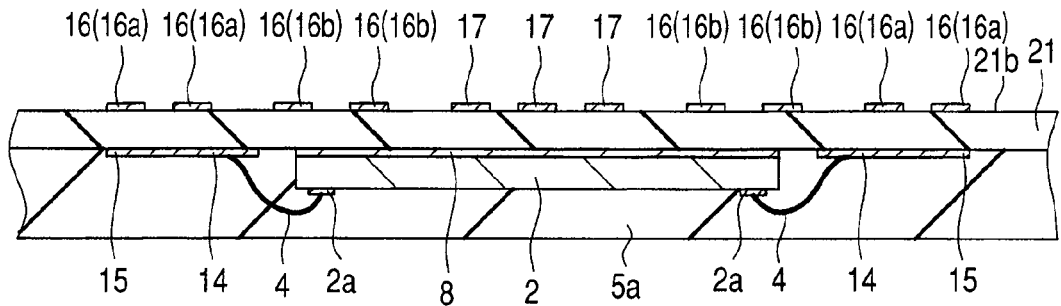
FIG. 51 is a cross-sectional view of a semiconductor device of Embodiment 5 of the present invention in a manufacturing step thereof.

FIG. 49 is a cross-sectional view (side cross-sectional view) of a semiconductor device 1b of the present embodiment. FIG. 50 is a bottom view (bottom surface view, back surface view, or plan view) of the semiconductor device 1b. A cross section along the line A3-A3 of FIG. 50 substantially corresponds to FIG. 49. Note that FIG. 49 corresponds to FIG. 4 of Embodiment 1 described above, and FIG. 50 corresponds to FIG. 2 of Embodiment 1 described above The semiconductor device 1b shown in FIGS. 49 and 50 has the wiring substrate 3, a plurality of semiconductor chips 71, 72, and 73 mounted on the upper surface 3a of the wiring substrate 3, the plural bonding wires 4 electrically coupling a plurality of electrodes 72a and 73a to the plural bonding leads 14 of the wiring substrate 3 corresponding thereto, and a mold resin 5 covering the upper surface 3a of the wiring substrate 3 including the semiconductor chips 71, 72, and 73 and the bonding wires 4. On the lower surface 3b of the wiring substrate 3 corresponding to the lower surface of the semiconductor device 1b, the plural solder balls 6 are provided as the external terminals (terminals for external coupling).

Each of the semiconductor chips 71, 72, and 73 has been manufactured by, e.g., forming various semiconductor elements or semiconductor integrated circuits on the main surface of a semiconductor substrate (semiconductor wafer) made of single-crystal silicon or the like, polishing the back surface of the semiconductor substrate as necessary, and dividing the semiconductor substrate into the individual separate semiconductor chips by dicing or the like. For example, the semiconductor chip 71 is a memory chip formed with a nonvolatile memory such as a DRAM, the semiconductor chip 72 is a memory chip (flash memory chip) formed with a nonvolatile memory, and the semiconductor chip 73 is a chip for control (microcomputer) formed with a control circuit for controlling the semiconductor chips 71 and 72 (the memories thereof). Therefore, the semiconductor device 1b can be regarded as a semiconductor device of SIP (System In Package) type in which the plural semiconductor chips 71, 72, and 73 formed with the respective integrated circuits having different functions are mounted on the wiring substrate 3 to form one system.

It is assumed that, in the semiconductor chips 71, 72, and 73, the main surfaces on which electrodes 71a and the electrodes 72a and 73a are formed are called the top surfaces of the semiconductor chips 71, 72, and 73, and the main surfaces opposite to the main surfaces (i.e., top surfaces) on which the electrodes 71a, 72a, and 73a are formed are called the back surfaces of the semiconductor chips 71, 72, and 73. The electrodes 71a are electrically coupled to the semiconductor element or the semiconductor integrated circuit formed within the semiconductor chip 71 or in the surface layer portion thereof. The electrodes 72a are electrically coupled to the semiconductor element or the semiconductor integrated circuit formed within the semiconductor chip 72 or in the surface layer portion thereof. The electrodes 73a are electrically coupled to the semiconductor element or the semiconductor integrated circuit formed within the semiconductor chip 73 or in the surface layer portion thereof.

The semiconductor chip 71 has been face-down bonded (flip-chip coupled) to the upper surface 3a of the wiring substrate 3. That is, the semiconductor chip 71 is mounted on the upper surface 3a of the wiring substrate 3 such that the top surface of the semiconductor chip 71 opposes the upper surface 3a of the wiring substrate 3. The electrodes 71a as bump electrodes formed on the top surface of the semiconductor chip 71 are bonded and electrically coupled to the bonding leads 14 on the upper surface 3a of the wiring substrate 3. The space between the upper surface 3a of the wiring substrate 3 and the semiconductor chip 71 has been filled with an underfill resin 74.

The semiconductor chip 72 has been mounted (disposed) on the back surface of the semiconductor chip 71 via an adhesive material (bonding material or adhesive material layer) 75. The back surface of the semiconductor chip 72 has been adhered and fixed to the back surface of the semiconductor chip 71 by the adhesive material 75. Examples of the adhesive material 75 that can be used include a film-type adhesive material such as a die attach film.

The semiconductor chip 73 has been mounted (disposed) on the top surface of the semiconductor chip 72 via an adhesive material (bonding material or adhesive material layer) 76. The back surface of the semiconductor chip 73 has been adhered and fixed to the top surface of the semiconductor chip 72 by the adhesive material 76. Examples of the adhesive material 76 that can be used include a film-type adhesive material such as a die attach film.

Thus, on the upper surface 3a of the wiring substrate 3, the semiconductor chip 71, the semiconductor chip 72, and the semiconductor chip 73 are stacked in this order in an ascending direction. The respective electrodes 72a and 73a of the semiconductor chips 72 and 73 are electrically coupled to the bonding leads 14 on the upper surface 3a of the wiring substrate 3 via the bonding wires 4.

The structure of the wiring substrate 3 is substantially the same as described above in Embodiment 1. On the lower surface 3b of the wiring substrate 3, the plural lands 16 are formed, and the solder balls 6 are coupled to the respective lands 16. It is also possible to provide the terminals for testing 17 on the lower surface 3b of the wiring substrate 3 using the lands which are not coupled to the solder balls 6. The respective electrodes 71a, 72a, and 73a of the semiconductor chips 71, 72, and 73 are electrically coupled to the lands 16 on the lower surface 3b of the wiring substrate 3, and to the solder balls 6 coupled to the lands 16 via the bonding wires 4, the conductor layers of the wiring substrate 3, and the like.

The mold resin 5 is formed on the upper surface 3a of the wiring substrate 3 so as to cover the semiconductor chips 71, 72, and 73 and the bonding wires 4. By the mold resin 5, the semiconductor chips 71, 72, and 73 and the bonding wires 4 are molded and protected.

Since the manner in which the lands 16 and the solder balls 6 are arranged on the lower surface of the semiconductor device 1b (lower surface 3b of the wiring substrate 3) of the present embodiment is the same as in the semiconductor device 1 of Embodiment 1 described above, a description thereof is omitted herein. In the semiconductor device 1b of the present embodiment, the lands 16 and the solder balls 6 can also be arranged on the lower surface thereof (lower surface 3b of the wiring substrate 3) in the same manner as in the semiconductor device 1a of Embodiment 3 described above.

In the present embodiment also, by arranging the lands and the solder balls 6 in the same manner as in Embodiments 1 to 3 described above, it is possible to obtain substantially the same effects as obtained in Embodiments 1 to 3 described above.

In the present embodiment, the plural semiconductor chips 71, 72, and 73 are disposed in stacked relation on the upper surface 3a of the wiring substrate 3, and molded with the mold resin 5. In the case where the plural semiconductor chips are stacked, the thickness of the mold resin 5 is larger than in a case where the plural semiconductor chips are not stacked. As the thickness of the mold resin 5 is larger, the semiconductor device is more prone to warping, and the solder balls 6 are more likely to be collapsed under pressure in the solder reflow step during the mounting of the semiconductor device. As described above in Embodiments 1 to 3, by improving the manner in which the lands 16 and the solder balls 6 are arranged, it is possible to solve the problem encountered when the semiconductor device warps, and the solder balls 6 are collapsed under pressure in the solder reflow step during the mounting of the semiconductor device. Accordingly, if the manner in which the lands 16 and the solder balls 6 are arranged described above in Embodiments 1 to 3 is applied to the case where the thickness of the mold resin 5 is large, great effects are achieved. Therefore, if the manner in which the lands 16 and the solder balls 6 are arranged described above in Embodiments 1 to 3 is applied to the semiconductor device 1b in which the plural semiconductor chips are stacked as in the present embodiment, the achieved effects are extremely great.

(Embodiment 5)

In the present embodiment, another manufacturing method of the semiconductor device 1 of Embodiment 1 described above will be described with reference to the drawings. In the present embodiment, the solder balls 6 described above are formed by a printing method.

Figure 52:
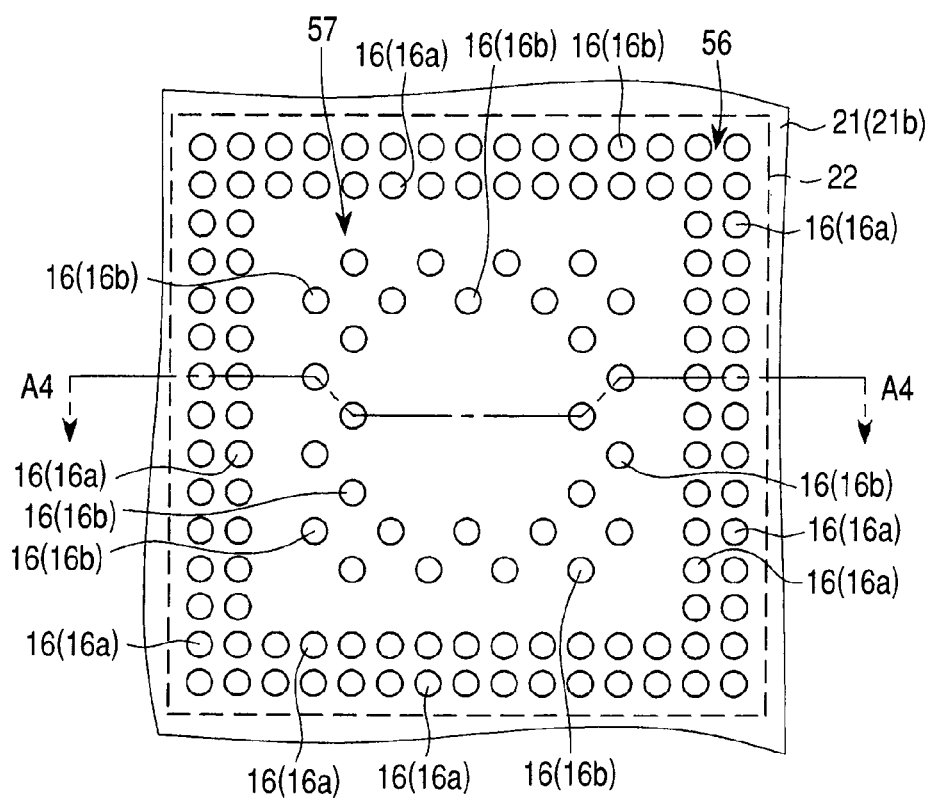
FIG. 52 is a plan view of the semiconductor device in the same manufacturing step as that of FIG. 51.
Figure 53:
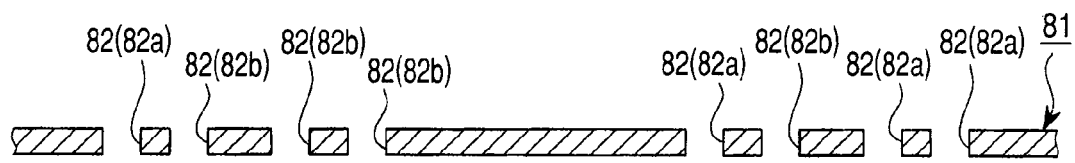
FIG. 53 is a cross-sectional view of a mask for printing, which is used in a manufacturing step of the semiconductor device of Embodiment 5.
Figure 54:
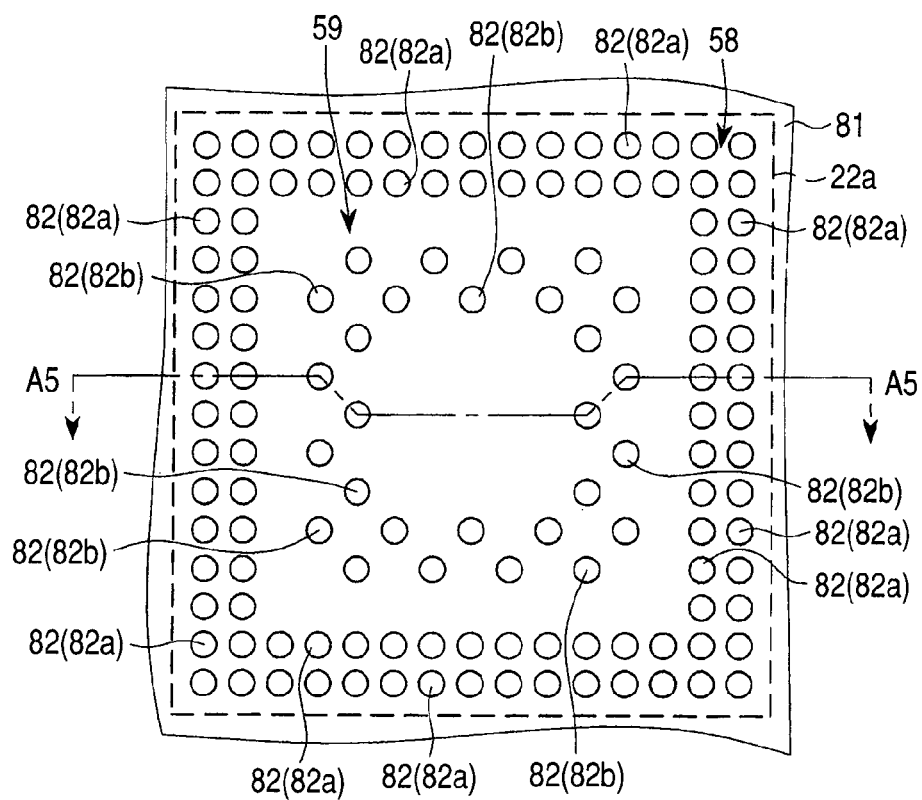
FIG. 54 is a plan view of the mask of FIG. 53.

FIGS. 51, and 55 to 58 are cross-sectional views of the semiconductor device 1 of the present embodiment in manufacturing steps thereof, which show cross sections corresponding to FIG. 4 described above. FIG. 52 is a plan view of the semiconductor device 1 in the same manufacturing step as that of FIG. 51. A cross section along the line A4-A4 of FIG. 52 substantially corresponds to FIG. 51, and the line A4-A4 indicates a position corresponding to the line A1-A1 of FIG. 2 described above. FIG. 53 is a cross-sectional view (side cross-sectional view) of a mask 81 for printing, which is used in the manufacturing step of the semiconductor device 1 of the present embodiment. FIG. 54 is a plan view of the mask 81 for printing. A cross section along the line A5-A5 of FIG. 54 substantially corresponds to FIG. 53, and the line A5-A5 indicates a position corresponding to the line A4-A4 of FIG. 52 described above. For the sake of easier understanding, in FIG. 52, the range of one semiconductor device region 22 in the wiring substrate 21 is indicated by the dotted line and, in FIG. 54, a region 22a which overlaps the semiconductor device region 22 of FIG. 52 when the mask is superimposed on the wiring substrate 21 for solder printing is indicated by the dotted line.

The manufacturing steps of the semiconductor device of the present embodiment are the same as in Embodiment 1 described above except for those subsequent to the step (Step S4) of FIG. 14 described above, so that a description thereof is omitted herein, and a description will be given of the steps subsequent to the step (Step S4) of FIG. 14.

That is, by performing Steps S1 to S4 in the same manner as in Embodiment 1 described above, the structure of FIGS. 51 and 52 corresponding to FIG. 14 described above is obtained.

In the present embodiment, the solder balls 6 described in the foregoing embodiments are formed using a printing method, but the manner in which the formed solder balls 6 are arranged is as described above in Embodiment 1. Since the solder balls 6 are formed on the lands 16 on the lower surface 21b of the wiring substrate 21, the manner in which the lands 16 are arranged on the lower surface 21b of the wiring substrate 21 (lower surface 3b of the wiring substrate 3) is the same as the above-mentioned manner in which the solder balls 6 are arranged.

As also described above in Embodiment 1, it is assumed that, among the plural lands 16 provided on the lower surface 21b of the wiring substrate 21 (lower surface 3b of the wiring substrate 3), the lands 16 on which the foregoing solder balls 6a are to be formed are called the lands 16a by giving the reference numeral 16a thereto, and the lands 16 on which the foregoing solder balls 6b are to be formed are called the lands 16b by giving the reference numeral 16b thereto. As described above, since the solder balls 6 have been divided into the first solder ball group 51 and the second solder ball group 52, the lands 16 on the lower surface 21b of the wiring substrate 21 (lower surface 3b of the wiring substrate 3) include the first land group 56 corresponding to the first solder ball group 51 described above and the second land group 57 corresponding to the second solder ball group 52 described above. The first land group 56 includes the plural lands 16a, and the second land group 57 includes the plural lands 16b. The manner in which the lands 16a are arranged in the first land group 56 is the same as the above-mentioned manner in which the solder balls 6a are arranged in the first solder ball group 51. The manner in which the lands 16b are arranged in the second land group 57 is the same as the above-mentioned manner in which the solder balls 6b are arranged in the second solder ball group 52. The positional relationship between the first land group 56 and the second land group 57 is the same as the foregoing positional relationship between the first solder ball group 51 and the second solder ball group 52, so that a description thereof is omitted herein.

FIGS. 53 and 54 show the mask for printing (metal mask or solder printing mask) 81 used in the present embodiment. Examples of the mask 81 that can be used include a metal mask made of a metal plate or the like. The mask 81 includes a plurality of openings 82 in an arrangement corresponding to the arrangement of solder bumps (which are solder bumps 84 described later, and correspond to the solder balls 6 described above in Embodiment 1). The openings 82 are for exposing the lands 16 of the wiring substrate 21, and supplying a solder paste 83 onto the lands 16. Therefore, as can be seen from a comparison between FIGS. 52 and 54, the arrangement of the openings 82 in the mask 81 corresponds to the arrangement of the lands 16 on the lower surface 21b of the wiring substrate 21 (lower surface 3b of the wiring substrate 3). That is, the arrangement of the openings 82 in the mask 81 corresponds also to the arrangement of the solder balls 6 on the lower surface of the semiconductor device 1 (lower surface 3b of the wiring substrate 3). The openings of the mask 81 can be formed in substantially the same shapes (e.g., circular shapes) as those of, e.g., the lands 16 on the semiconductor substrate 21. The openings 82 of the mask 81 can also be formed in dimensions equal to or smaller than the dimensions of the lands 16 on the wiring substrate 21. As a result, it is possible to prevent the solder paste 83 described later from being printed on the region of the wiring substrate 21 other than the lands 16.

Of the plural openings 82 provided in the mask 81, the openings 82 (i.e., the openings in which the foregoing solder balls 6a are to be formed) through which the solder paste 83 should be supplied onto the lands 16a are called openings 82a by giving the reference numeral 82a thereto, and the openings 82 (i.e., the openings in which the foregoing solder balls 6b are to be formed) through which the solder paste 83 should be supplied onto the lands 16b are called openings 82b by giving the reference numeral 82b thereto.

As described above, since the solder balls 6 have been divided into the first solder ball group 51 and the second solder ball group 52, the lands 16 on the wiring substrate 21 include the first land group 56 and the second land group 57, and the openings 82 of the mask 81 include a first opening group 58 corresponding to the first land group 56 (i.e., corresponding also to the first solder ball group 51), and a second opening group 59 corresponding to the second land group 57 (i.e., corresponding also to the second solder ball group 52). The first opening group 58 includes the plural openings 82a, and the second opening group 59 includes the plural openings 82b. The manner in which the openings 82a are arranged in the first opening group 58 is the same as the above-mentioned manner in which the solder balls 6a are arranged in the first solder ball group 51. The manner in which the openings 82b are arranged in the second opening group 59 is the same as the above-mentioned manner in which the solder balls 6b are arranged in the second solder ball group 52. The positional relationship between the first opening group 58 and the second opening group 59 is the same as the foregoing positional relationship between the first solder ball group 51 and the second solder ball group 52, so that a description thereof is omitted herein.

Figure 55:
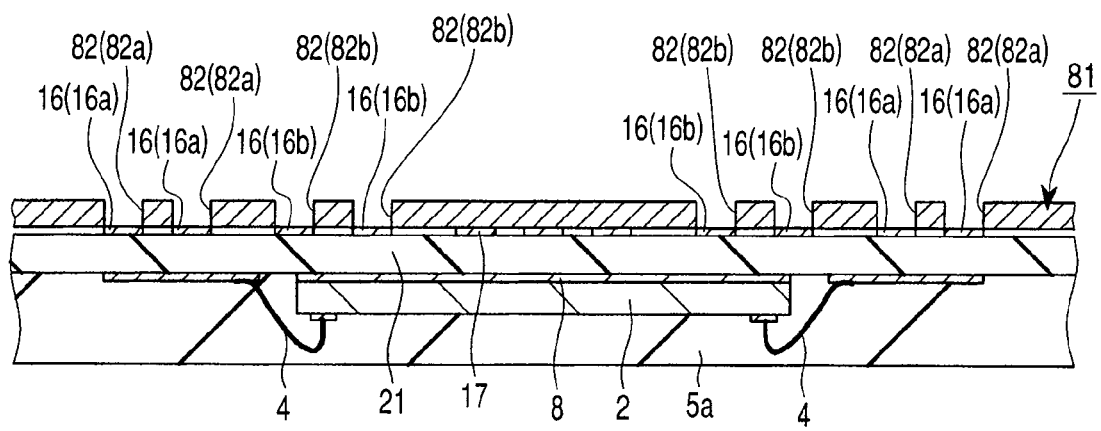
FIG. 55 is a cross-sectional view of the semiconductor device in a manufacturing step thereof, which is subsequent to FIG. 51.
Figure 56:
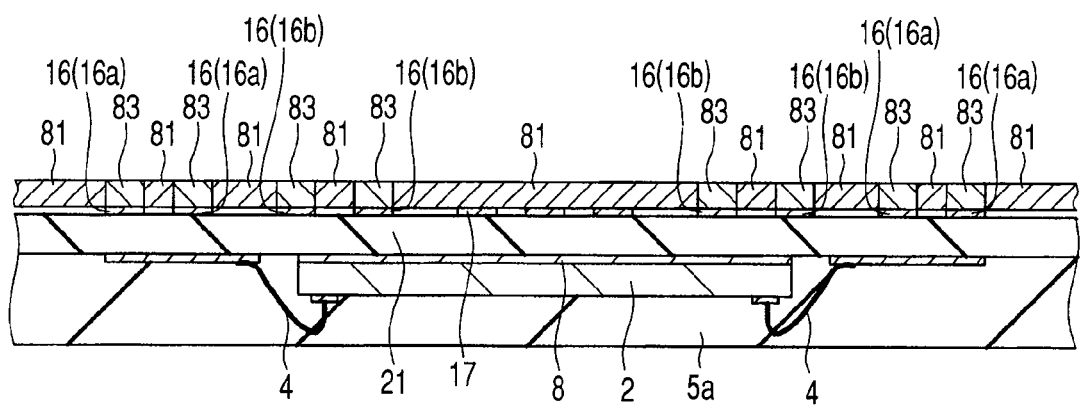
FIG. 56 is a cross-sectional view of the semiconductor device in a manufacturing step thereof, which is subsequent to FIG. 55.

Next, as shown in FIG. 55, the mask 81 is disposed (superimposed) on the lower surface 21b of the wiring substrate 21. At this time, the wiring substrate 21 formed with the mold resin 5a is disposed such that the lower surface 21b of the wiring substrate 21 faces upward, and the mask 81 is aligned and disposed on the lower surface 21b of the wiring substrate 21. In this manner, the lands 16 of the wiring substrate 21 are positioned under the respective openings 82 of the mask 81 so that the lands 16 are exposed through the respective openings 82. Note that the lands 16a are exposed through the openings 82a of the mask 81, and the lands 16b are exposed through the openings 82b of the mask 81.

Next, a predetermined amount of the solder paste (solder or cream solder) 83 is applied onto the mask 81, and spread out by moving a squeegee (not shown) or the like so as to be simultaneously supplied (applied or printed) onto the lower surface 21b of the wiring substrate 21, and selectively supplied (applied or printed) onto the lands 16 via the openings 82 of the mask 81.

Figure 57:
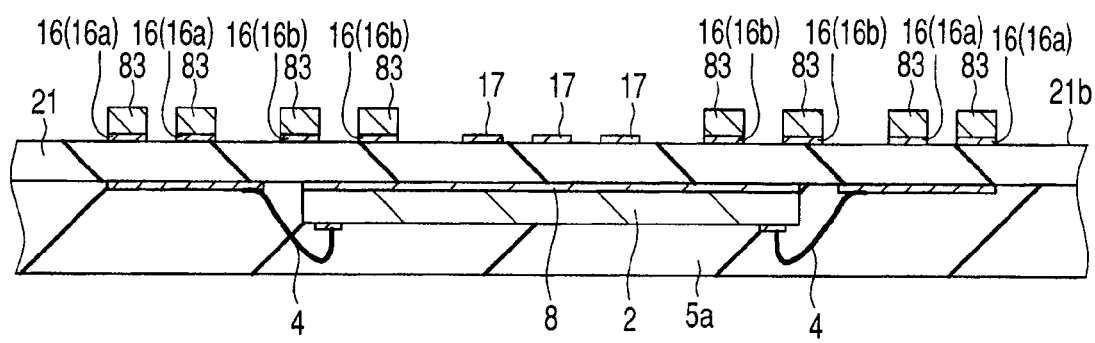
FIG. 57 is a cross-sectional view of the semiconductor device in a manufacturing step thereof, which is subsequent to FIG. 56.

Next, as shown in FIG. 57, the mask 81 is removed from the lower surface 21b of the wiring substrate 21. In this manner, by the printing method using the mask 81, the solder (solder paste 83) is supplied onto the plural lands 16 on the lower surface 21b of the wiring substrate 21. The solder paste 83 can also contain a flux or the like.

Figure 58:
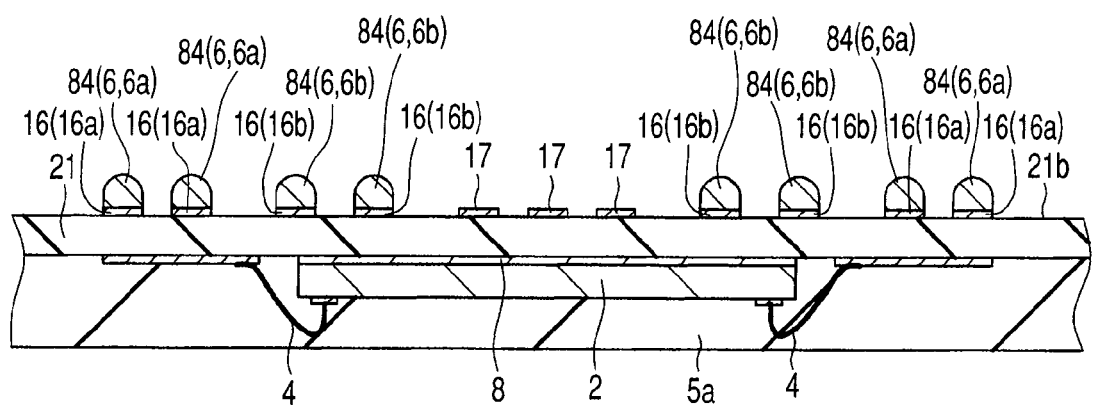
FIG. 58 is a cross-sectional view of the semiconductor device in a manufacturing step thereof, which is subsequent to FIG. 57.

Next, the solder reflow process (reflow process or heat treatment) is performed as the heat treatment. FIG. 58 shows a state after a solder reflow step.

For example, the wiring substrate 21 in which the solder paste 83 has been supplied onto the lands 16 as described above is caused to pass through a reflow oven, which is not shown, or the like so that the solder paste 83 is heated and molten. The solder paste 83 is molten/resolidified by the solder reflow process to form the solder bumps 84 (solder balls 6). The solder bumps 84 correspond to the solder balls 6 described above in Embodiment 1. The solder bumps 84 formed by the printing method may be slightly different in outer shape from the solder balls 6 provided on the wiring substrate 21 by the method described above with reference to FIGS. 16 to 21, but otherwise the same as the solder balls 6 described above in Embodiment 1. Therefore, the manner in which the solder bumps 84 are arranged on the wiring substrate 21 (wiring substrate 3) is the same as the manner in which the solder balls 6 are arranged described above in Embodiment 1. Note that the solder paste 83 supplied onto the lands 16a via the openings 82a of the mask 81 is caused to reflow, and form the solder bumps 84 formed on the lands 16a, and corresponding to the foregoing solder balls 6a. On the other hand, the solder paste 83 supplied onto the lands 16a via the openings 82b of the mask 81 is caused to reflow, and form the solder bumps 84 formed on the lands 16b, and corresponding to the foregoing solder balls 6b.

The subsequent steps are the same as described above in Embodiment 1. That is, in the same manner as described above in Embodiment 1, the marking step of Step S6, and the cutting step of S7 are performed, and an inspection using the terminals for testing 17 is further performed as necessary. The structure of the manufactured semiconductor device is the same as that of the semiconductor device 1 of Embodiment 1 described above except that the solder bump 84 are formed by the printing method, so that a description thereof is omitted herein.

In the case where the solder balls 6 are formed in the semiconductor device 1a of Embodiment 3 described above by a printing method as in the present embodiment, the openings 82 of the mask 81 used in the present embodiment may be arranged appropriately in the same manner as the solder balls 6 are arranged in the semiconductor device 1a of Embodiment 3 described above.

In the present embodiment, by the printing method using the mask 81 including the plural openings 82 in the arrangement corresponding to the arrangement of the solder bumps 84 (i.e., the arrangement of the solder balls 6 described above in Embodiments 1 and 3) which should be formed on the lower surface 21b of the wiring substrate 21 (lower surface 3b of the wiring substrate 3), the solder (solder paste 83) is supplied onto the lower surface 21b of the wiring substrate 21, and subjected to the solder reflow process, thereby forming the plural solder bumps 84 on the lower surface 21b of the wiring substrate 21. Therefore, in FIG. 54, the openings 82 of the mask 81 are arranged in the same manner as the solder balls 6 are arranged in the semiconductor device 1 of Embodiment 1 described above.

As a result, the plurality openings 82 in the mask 81 include the first opening group 58 in which the openings 82 (i.e., the openings 82a) are arranged in a plurality of rows along the peripheral edge portion of the region 22a of the mask 81 which overlaps the semiconductor device region 22 and in the second opening group 59 in which the openings 82 (i.e., the openings 82b) are arranged inwardly of the first opening group 58 in the region 22a of the mask 81 which overlaps the semiconductor device region 22. In the first opening group 58, the openings 82 (i.e., the openings 82a) are arranged with the first pitch (first spacing corresponding to the foregoing pitch $P_1$). In the second opening group 59, the openings 82 (i.e., the openings 82b) are arranged with the second pitch (second spacing corresponding to the foregoing pitch $P_2$) higher than the first pitch.

Specifically, the plural openings 82 of the mask 81 include the first opening group 58 in which the openings 82 are arranged in a plurality of rows extending in a circulating pattern, and the second opening group 59 in which the openings 82 are arranged in a plurality of rows extending in a circulating pattern at locations closer to the center portion than (inward of) the first opening group 58. As described above in Embodiment 1, the solder balls in the adjacent rows are arranged in alignment with each other in the first solder ball group 51, and the solder balls in the adjacent rows are arranged out of alignment with each other in the second ball group 52. Therefore, in the mask 81 also, the openings in the adjacent rows are likewise arranged in alignment with each other in the first opening group 58, and the openings in the adjacent rows are likewise arranged out of alignment with each other in the second opening group 59. Also, as described above in Embodiment 1, the distance between the adjacent solder balls 6 is larger in the second solder ball group 52 than in the first solder ball group 51. Therefore, in the mask 81 also, the distance between the adjacent openings 82 is likewise larger in the second opening group 59 than in the first opening group 58. Also, as described above in Embodiment 1, the spacing $G_1$ between the first solder ball group 51 and the second solder ball group is larger than the spacing $G_2$ between the rows in the first solder ball group 51, and than the spacing $G_3$ between the rows in the second solder ball group 52. Therefore, in the mask 81 also, the spacing between the first opening group 58 and the second opening group 59 is larger than the spacing between the rows in the first opening group 58, and than the spacing between the rows in the second opening group 59. Here, the distance between the adjacent openings 82 can be defined similarly to the distance between the adjacent solder balls 6 described above in Embodiment 1. Also, the spacing between the first opening group 58 and the second opening group 59 can be defined similarly to the spacing $G_1$ between the first solder ball group 51 and the second solder gall group 52 described above in Embodiment 1. Also, the spacing between the rows in the first opening group 58 and the spacing between the rows in the second opening group 59 can be defined similarly to the spacing $G_2$ between the rows in the first solder ball group 51, and to the spacing $G_3$ between the rows in the second solder ball group 52, each described above in Embodiment 1.

Also, in the present embodiment, by controlling the distance between the adjacent solder bumps 84 (solder balls 6), it is possible to prevent the solder bumps 84 (solder balls 6) from coming into contact with each other during the mounting of the semiconductor device, as described above with respect to the arrangement of the solder balls 6 in Embodiments 1 to 3. Therefore, by adjusting the arrangement of the lands 16 preliminarily provided on the wiring substrate 21 and the arrangement of the openings 82 of the mask 81, it is possible to adjust the arrangement of the solder bumps 84 (solder balls 6) on the lower surface of the semiconductor device 1 (lower surface 3b of the wiring substrate 3), and thereby control the distance between the adjacent solder bumps 84 (solder balls 6). Accordingly, in the present embodiment, the plural solder bumps 84 provided on the lower surface of the semiconductor device 1 (lower surface 3b of the wiring substrate 3) are preferably formed to have the same size (dimension or diameter). That is, in the printing method using the mask 81, the amount of the solder paste 83 supplied onto each of the lands 16 on the wiring substrate 21 are adjusted to be equal. Consequently, the structure of the mask 81 can be simplified, and the thickness of the mask 81 can be adjusted to be the same for each of the first opening group 58 and the second opening group 59. This allows easy solder printing using the mask 81, and proper formation of the solder bumps 84.

(Embodiment 6)

A semiconductor device of the present embodiment will be described with reference to the drawings.

Figure 59:
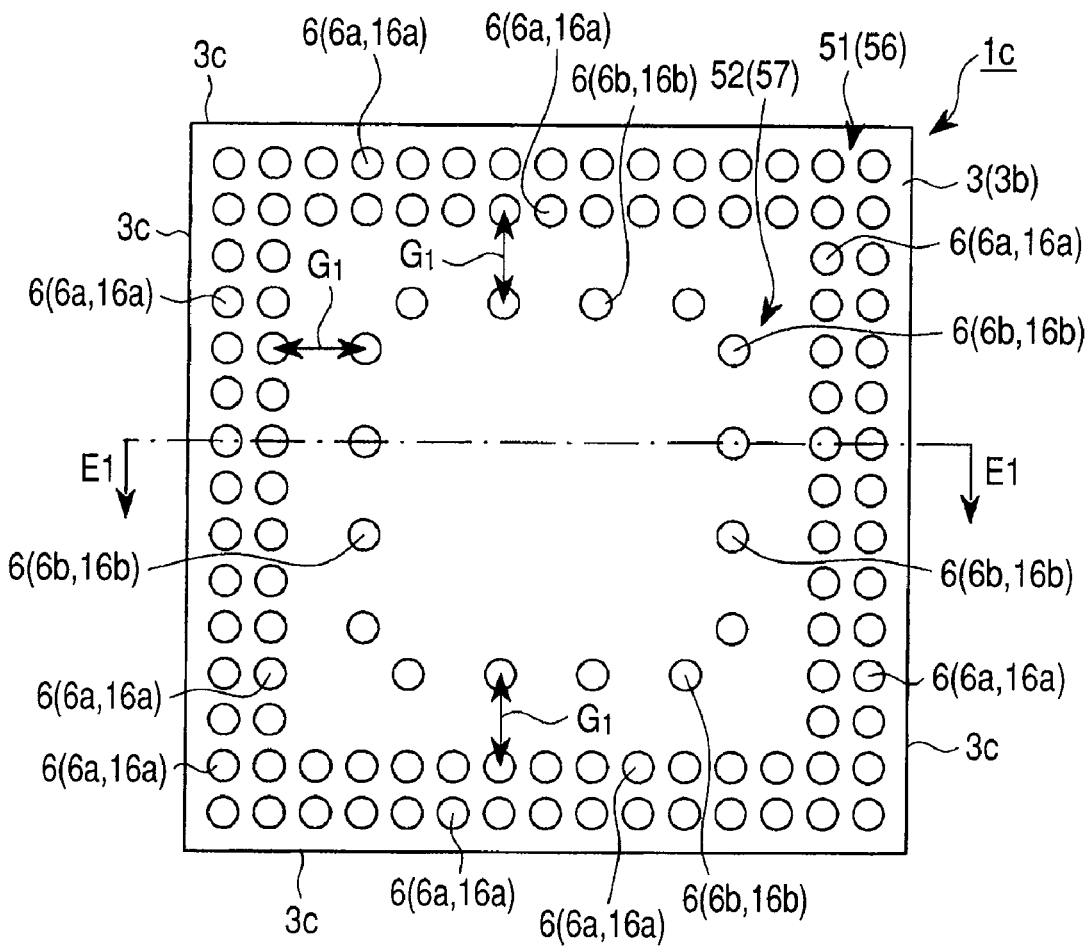
FIG. 59 is a bottom view of a semiconductor device of Embodiment 6 of the present invention.
Figure 60:
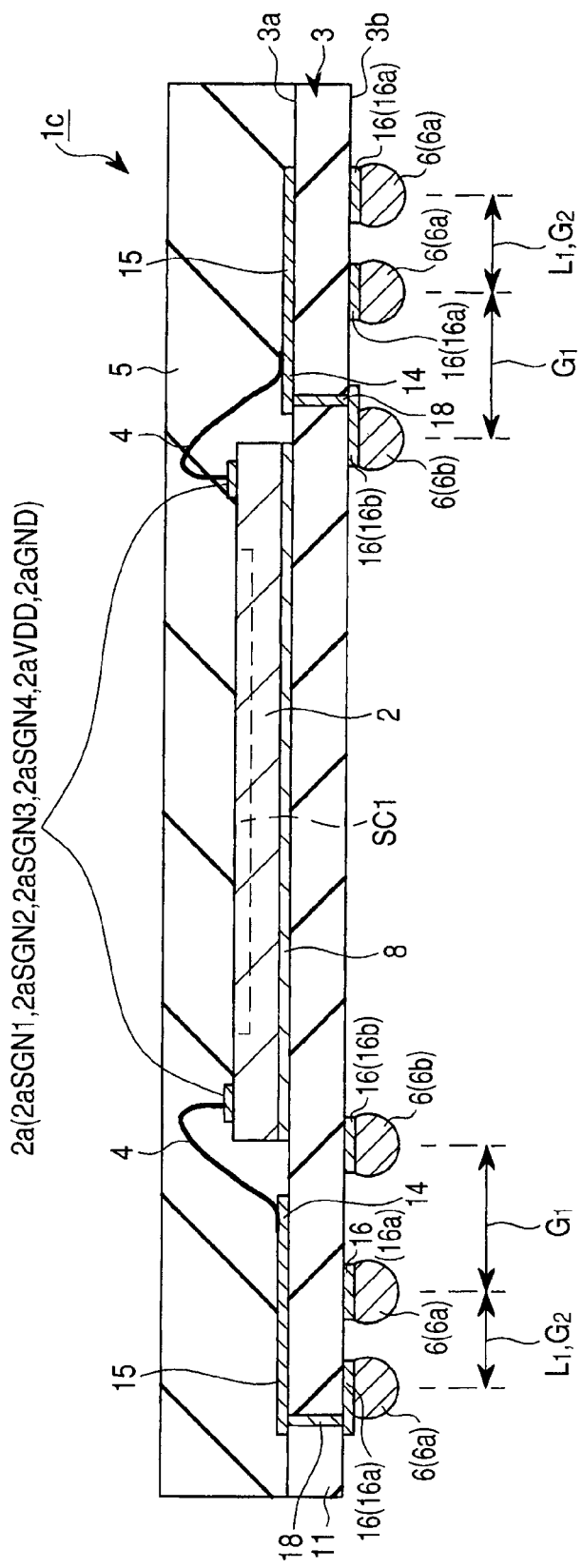
FIG. 60 is a cross-sectional view of the semiconductor device of Embodiment 6.

FIG. 59 is a bottom view (bottom surface view, back surface view, or plan view) of a semiconductor device 1c of Embodiment 6. FIG. 60 is a cross-sectional view (side cross-sectional view) of the semiconductor device 1c, which substantially corresponds to a cross section along the line E1-E1 of FIG. 59. Note that FIGS. 59 and 60 respectively correspond to FIGS. 2 and 4 of Embodiment 1 described above.

The semiconductor device 1c of Embodiment 6 has substantially the same structure as that of the semiconductor device 1 of Embodiment 1 described above except that, in the semiconductor device 1c of the present embodiment, the solder balls 6b (lands 16) in the second solder ball group 52 (second land group 57) are arranged in one row while, in the semiconductor device 1 of Embodiment 1 described above, the solder balls 6b (lands 16) in the second solder ball group 52 (second land group 57) are arranged in a plurality of rows (e.g., two rows).

That is, in the present embodiment, in the first solder ball group 51 (or the first land group 56) among the plural solder ball groups (or the land groups) formed on the lower surface 3b of the wiring substrate 3, the solder balls 6 (lands 16) are arranged in a plurality of rows (which are, e.g., two rows in the present embodiment) along the peripheral edge portion (each of the sides) of the lower surface 3b of the wiring substrate 3 in the same manner as described above in Embodiment 1. By contrast, in the present embodiment, in the second solder ball group 52 (or the second land group 57) located at the portion of the lower surface 3b of the wiring substrate 3 which is closer to the center portion thereof than the first solder ball group, the solder balls 6 (lands 16) are arranged in one row along each of the sides of the lower surface 3b of the wiring substrate 3.

Thus, in the present embodiment, the number of rows of the solder balls 6 in the second solder ball group 52 is smaller than in Embodiment 1 described above. Accordingly, the number of the external terminals (which are the solder balls 6 herein) of the semiconductor device 1c of the present embodiment is smaller than the number of the external terminals (which are the solder balls 6 herein) of the semiconductor device 1 of Embodiment 1 described above. In addition, at the region of the lower surface 3b of the wiring substrate 3 located inward of the second solder ball group 52 (or the second land group 57), the terminals for testing (lands) 17 provided in Embodiment 1 described above are not provided.

The structure is otherwise the same as that of Embodiment 1 described above so that a description thereof is omitted. It will be easily appreciated that, in the same manner as in Embodiment 1 described above, in the present embodiment also, the solder balls 6a (lands 16a) in the first solder ball group 51 (first land group 56) are arranged with the first pitch (first spacing corresponding to the foregoing pitch $P_1$), and the solder balls 6b (lands 16b) in the second solder ball group 52 (second land group 57) are arranged with the second pitch (second spacing corresponding to the foregoing pitch $P_2$) higher than the first pitch.

In the semiconductor device 1c of the present embodiment also, the pitch of the solder balls 6 (or the lands 16) is set larger in the second solder ball group 52 (or the second land group 57) located at the center-side portion of the lower surface 3b of the wiring substrate 3 than in the solder ball group 51 (or the first land group 56) located at the outer-peripheral-side portion of the lower surface 3b of the wiring substrate 3. Therefore, even when the semiconductor device 1c mounted on the mounting substrate (wiring substrate 31 described above) warps, and the distance between the upper surface (upper surface 31a described above) of the mounting substrate (wiring substrate 31 described above) and the near-center portion of the lower surface 3b of the wiring substrate 3 is reduced, it is possible to inhibit the problem of a short circuit between the adjacent solder balls 6 (which are the solder balls 6b) in the second solder ball group 52.

(Embodiment 7)

A semiconductor device of the present embodiment will be described with reference to the drawings.

Figure 61:
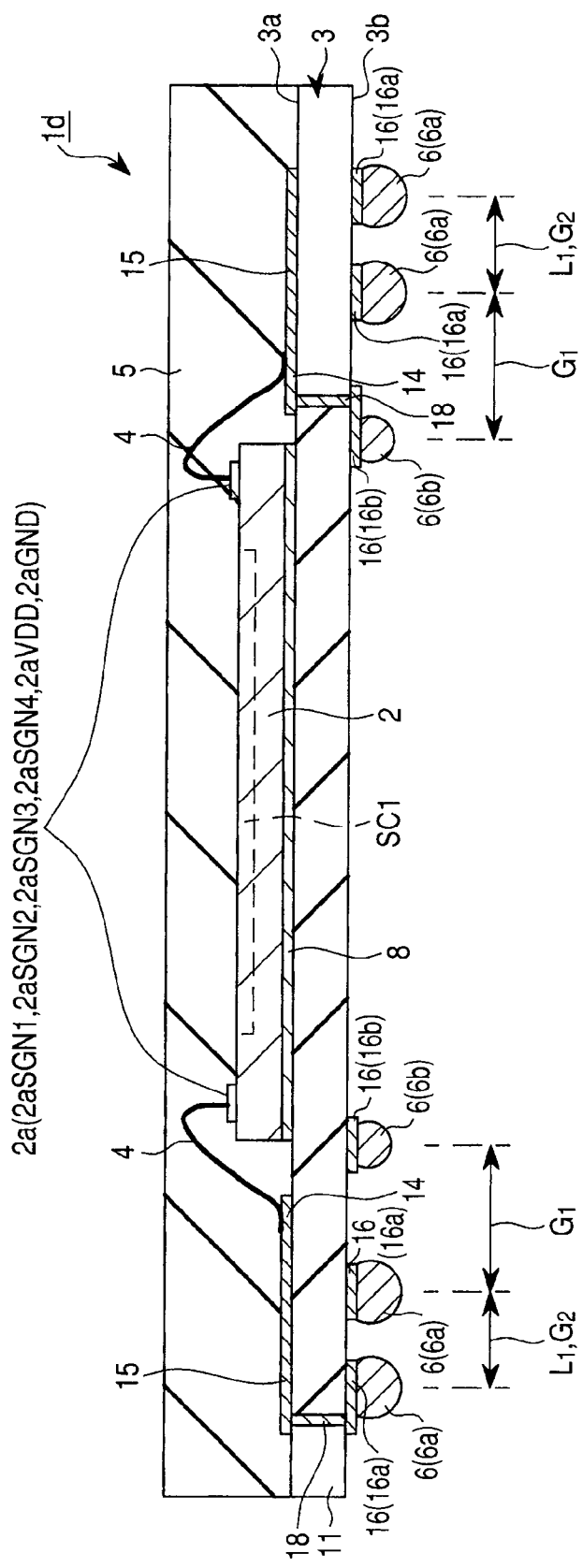
FIG. 61 is a cross-sectional view of a semiconductor device of Embodiment 7 of the present invention.

FIG. 61 is a cross-sectional view (side cross-sectional view) of a semiconductor device of Embodiment 7, which corresponds to FIG. 60 described above. In the wiring substrate, the cross-sectional position of FIG. 61 corresponds to a position along the line E1-E1 of FIG. 59 described above of Embodiment 6 described above.

In each of Embodiments 1 to 6 described above, the description has been given of the case where the plural external terminals (solder balls 6) provided on the lower surface 3b of the wiring substrate 3 are formed to have the same size, and the external terminals (solder balls 6) are formed on the respective lands 16 of the wiring substrate 3 using the ball supply method or the printing method. By contrast, in Embodiment 7, the sizes of the solder balls (solder bumps) 6 are varied depending on locations on the lower surface 3a of the wiring substrate 3. That is, in the present embodiment, the solder balls (solder bumps) 6 located at the center-side portion of the lower surface 3b of the wiring substrate 3 are formed smaller in size than the solder balls (solder bumps) 6 located at the peripheral-side portion thereof. The size relationship between the solder balls (solder bumps) 6 can also be defined by the quantitative relationship between the amounts of the solder in the solder balls (solder bumps) 6.

In a semiconductor device 1*d* shown in FIG. 61, the sizes (dimensions or diameters) of the solder balls 6*b* belonging to the solder ball group 52 are adjusted to be smaller than the sizes (dimensions or diameters) of the solder balls 6*a* belonging to the solder ball group 51. The structure of the semiconductor device 1*d* is otherwise the same as that of the semiconductor device 1*c* of Embodiment 6 described above, so that a description thereof is omitted herein.

The semiconductor device 1*c* of Embodiment 6 described above corresponds to the semiconductor device 1*d* of FIG. 61 only when the sizes of the solder balls 6*b* in the solder ball group 52 are adjusted to be smaller than those of the solder balls 6*a* in the solder ball group 51. However, Embodiment 7 is applicable not only to Embodiment 6 described above, but also to the semiconductor devices described above in Embodiments 1 to 5 and to a semiconductor device of Embodiment 8 described later. For example, in the case where the present embodiment is applied to Embodiment 1 described above, it is appropriate that the sizes (dimensions or diameters) of the solder balls 6*b* belonging to the second solder ball group 52 are adjusted to be smaller than the sizes (dimensions or diameters) of the solder balls 6*a* belonging to the first solder ball group 51 in the semiconductor device 1 of Embodiment 1 described above. In the case where the present embodiment is applied to Embodiment 3 described above, it is appropriate that the sizes (dimensions or diameters) of the solder balls 6*e* belonging to the solder ball group 52*a* are adjusted to be smaller than the sizes (dimensions or diameters) of the solder balls 6*c* and 6*d* belonging to the solder ball groups 51*a* and 51*b*.

Figure 62:
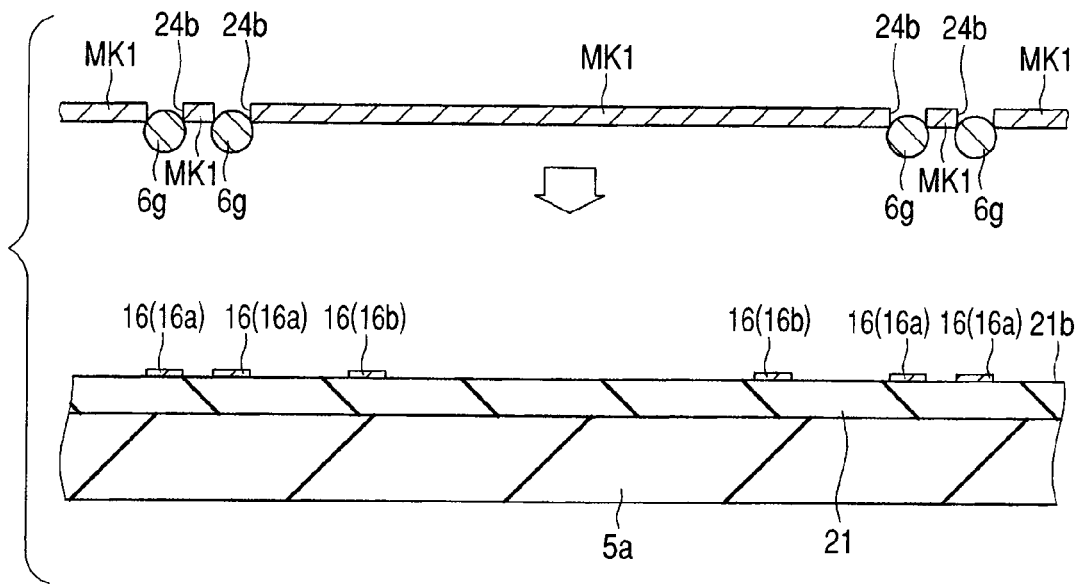
FIG. 62 is an illustrative view of a step of forming solder bumps in Embodiment 7.
Figure 63:
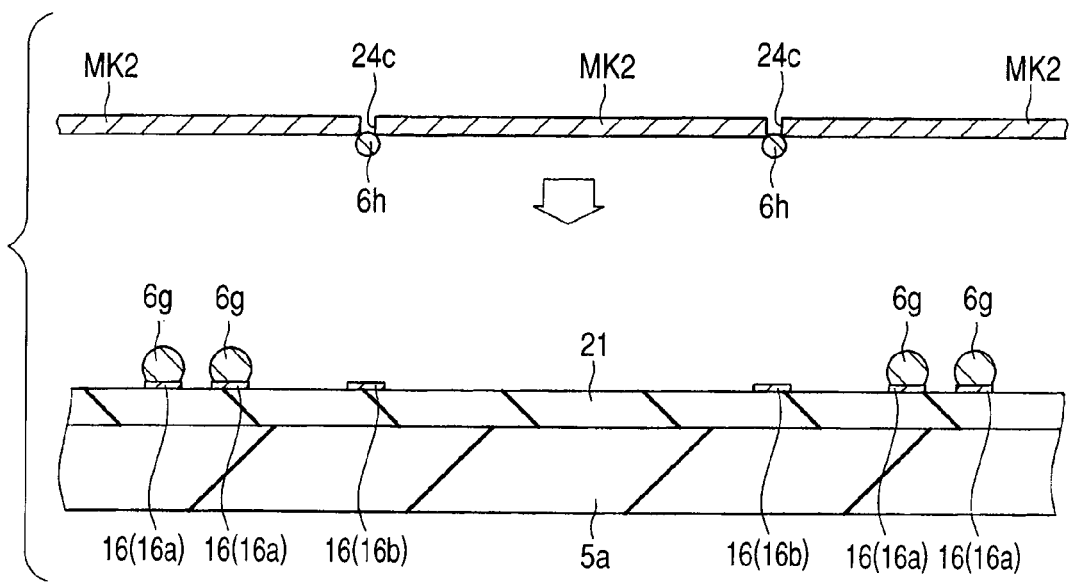
FIG. 63 is an illustrative view of the step of forming solder bumps in Embodiment 7.

FIGS. 62 and 63 are illustrative view of a step of forming the solder bumps (solder balls 6) in the present embodiment, which corresponds to Step S5 described above.

In the case of varying the sizes of the solder balls (solder bumps) 6 according to locations on the lower surface 3*a* of the wiring substrate 3 as in the present embodiment, when the ball supply method which holds the solder balls using a single mask by one secession of suction attraction as described above in Embodiment 1 is to be used, it is difficult to attract by suction the plural solder balls of different sizes to respective desired holes, and transfer the solder balls to the lands 16 of the wiring substrate 21.

Therefore, in the present embodiment, a first mask MK1 is prepared first, as shown in FIG. 62. The mask MK1 is provided with first holes 24*b* corresponding to the first land group 56 (individual lands 16*a* therein) located closer to the peripheral edge portion of the foregoing semiconductor device region 22 of the wiring substrate 21. That is, when the first mask MK1 is aligned and superimposed on the wiring substrate 21, the individual lands 16*a* of the wiring substrate 21 and the individual first holes 24*b* of the first mask MK1 are at the same two-dimensional locations. The diameters of the first holes 24*b* are smaller than the diameters of first solder balls 6*g* described later. The first mask MK1 is not provided with holes corresponding to the second land group 57 (individual lands 16*b* therein).

Then, using the first mask MK1, the first solder balls 6*g* are supplied to the respective lands 16*a* in the first land group 56. That is, the first solder balls 6*g* are attracted by suction to the respective first holes 24*b* of the first mask MK1, and supplied to the respective lands 16*a* in the first land group 56 of the wiring substrate 21.

Then, using a second mask MK2, second solder balls 6*h* smaller in size than the first solder balls 6*g* are supplied to the respective lands 16*b* in the second land group 57, as shown in FIG. 63. That is, the second solder balls 6*h* are attracted by suction to respective second holes 24*c* of the second mask MK2, and supplied to the respective lands 16*b* in the second land group 57 of the wiring substrate 21. The diameters (dimensions) of the second solder balls 6*h* are smaller than the diameters (dimensions) of the first solder balls 6*g*.

Here, the second mask MK2 is provided with the second holes 24*c* corresponding to the second land group 57 (individual lands 16*b* therein) located closer to the center portion of the foregoing semiconductor device region 22 of the wiring substrate 21. That is, when the second mask MK2 is aligned and superimposed on the wiring substrate 21, the individual lands 16*b* of the wiring substrate 21 and the individual second holes 24*c* of the second mask MK2 are at the same two-dimensional locations. The diameters of the second holes 24*c* are smaller than the diameters of the second solder balls 6*h*. The second mask MK2 is not provided with the holes corresponding to the first land group 56 (individual lands 16*a* therein). Note that the sizes (diameters) of the second holes 24*c* may be the same as the sizes (diameters) of the first holes 24*b* but, by adjusting the sizes (diameters) of the second holes 24*c* to be smaller than the sizes (diameters) of the first holes 24*b*, it is possible to improve the accuracy with which the second solder balls 6*h* smaller in size than the first solder balls 6*g* are supplied.

Thereafter, by performing the solder reflow process as the heat treatment to melt and resolidify the first solder balls 6*g* and the second solder balls 6*h*, it is possible to bond and electrically couple the solder balls 6 to the lands 16 on the lower surface 21*b* of the wiring substrate 21. The first solder balls 6*g* become the solder balls 6*a* bonded to the lands 16*a* in the first land group 56, and the second solder balls 6*h* become the solder balls 6*b* bonded to the lands 16*b* in the second land group 57. As a result, the solder balls 6*b* bonded to the lands 16*b* in the second land group 57 are smaller in size than the solder balls 6*a* bonded to the lands 16*a* in the first land group 56.

Otherwise, it is also possible to perform, prior to the supply of the second solder balls 6*h* using the second mask MK2, the solder reflow process to bond the first solder balls 6*g* to the lands 16*a* in the first land group 56, supply the second solder balls 6*h* onto the lands 16*b* in the second land group 57 using the second mask MK2, and then perform the solder reflow process again to bond the second solder balls 6*h* to the lands 16*b* in the second land group 57. It is also possible to change the order of the supply of the first solder balls 6*g* onto the lands 16*a* in the first land group 56 using the first mask MK1 and the supply of the second solder balls 6*h* onto the lands 16*b* in the second land group 57 using the second mask MK2.

As described above in Embodiments 1 to 6, the plural lands 16 formed on the lower surface 3*b* of the wiring substrate 3 are divided into a plurality of land groups, and the pitch (second pitch) of the lands 16 in the land group (second land group 57 or land group 57*a* described above) located closer to the center portion of the wiring substrate 3 is set higher than the pitch (first pitch) of the lands 16 in the land group (first land group 56 or land groups 56*a* and 56*b* described above) located closer to the outer peripheral portion of the wiring substrate 3. As a result, even when the semiconductor device mounted on the mounting substrate (wiring substrate 31 described above) warps, a short circuit between the adjacent solder balls 6 can be inhibited.

However, when a lead-free solder is used as the material of the solder balls 6 in consideration of the environmental pollution problem, heat applied in the reflow process (heat treatment) step after the semiconductor device is mounted on the mounting substrate becomes higher in temperature, and the warping of the semiconductor device may be more significant.

Otherwise, if the wiring substrate 3 to be used is further thinned with the increasing thinning of the semiconductor device, the warping of the semiconductor device may be more significant even when the temperature of heat applied in the reflow process step is not increased.

Therefore, as in the present embodiment, by not only dividing the plural lands 16 into the plural land groups (first and second land groups 56 and 57), but also adjusting the sizes of the solder balls 6*b* disposed on the respective lands 16*b* in the second land group 57 to be smaller than the sizes of the solder balls 6*a* disposed on the respective lands 16*a* in the first land group 56, it is possible to more reliably prevent the adjacent solder bumps (solder balls 6) from coming into contact with each other.

(Embodiment 8)

A semiconductor device of the present embodiment will be described with reference to the drawings.

Figure 64:
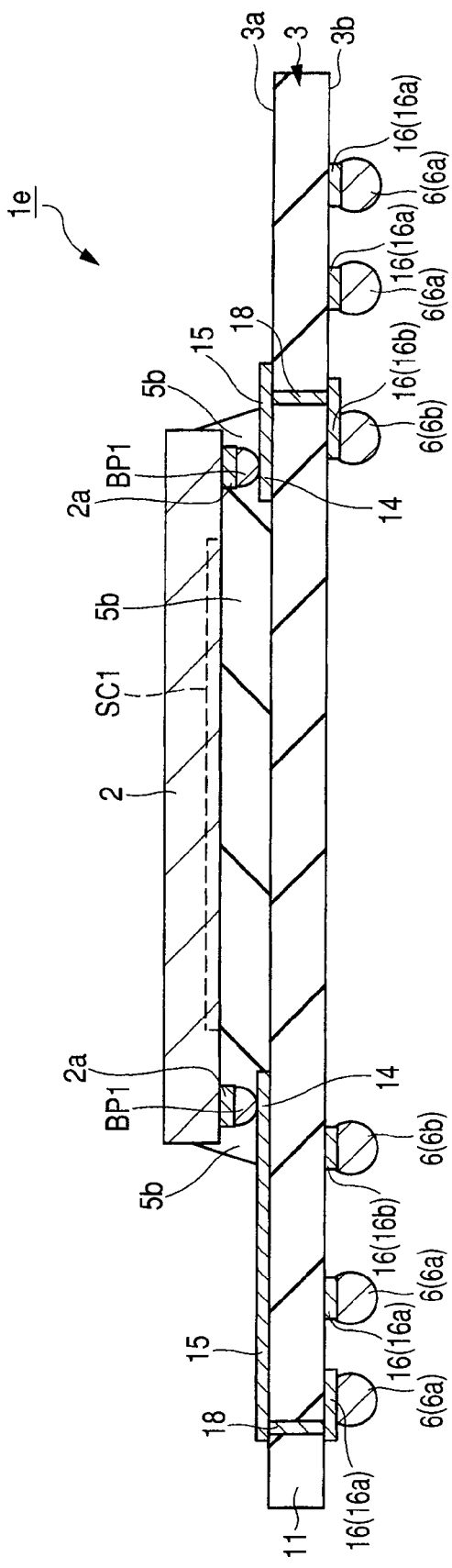
FIG. 64 is a cross-sectional view of a semiconductor device of Embodiment 8 of the present invention.

FIG. 64 is a cross-sectional view (side cross-sectional view) of a semiconductor device 1*e* of Embodiment 8, which corresponds to FIG. 60 described above. In the wiring substrate, the cross-sectional position of FIG. 64 corresponds to the position along the line E1-E1 of FIG. 59 described above of Embodiment 6 described above.

In Embodiment 1 described above, the description has been given of the case where the semiconductor chip 2 is mounted on the upper surface 3*a* of the wiring substrate 3 such that the top surface (main surface or third surface) of the semiconductor chip 2 opposes the upper surface 3*a* of the wiring substrate 3, and the electrodes 2*a* of the semiconductor chip 2 are electrically coupled to the bonding leads 14 of the wiring substrate 3 via the plural bonding wires 4 serving as the conductive members. By contrast, in Embodiment 8, the semiconductor chip 2 is flip-chip mounted onto the wiring substrate 3. That is, in the present embodiment, the semiconductor chip 2 is mounted on the wiring substrate 3 via a plurality of bumps (conductive members) BP1 such that the top surface of the semiconductor chip 2 opposes the upper surface 3*a* of the wiring substrate 3, as shown in FIG. 64. The individual electrodes 2*a* of the semiconductor chip 2 are bonded and electrically coupled to the bonding leads 14 of the wiring substrate 3 via the respective bump electrodes BP1.

In the semiconductor device 1*e* of the present embodiment, the space between the surface of the semiconductor chip 2 and the upper surface 3*a* of the wiring substrate 3 is filled with a resin (underfill resin) 5*b*, as shown in FIG. 64. In this manner, the bonded portions between the bump electrodes BP1 and the bonding leads 14 formed on the upper surface 3*a* of the wiring substrate 3 are protected. Note that the plural bump electrodes BP1 have been coupled (fixed) onto the plural electrodes (electrode pads) 2*a* formed on the top surface of the semiconductor chip 2 before the semiconductor chip 2 is mounted on the wiring substrate 3.

In each of Embodiments 1 to 7 described above, the plural conductive members electrically coupling the plural electrodes (electrode pads) 2*a* of the semiconductor chip 2 to the plural bonding leads 14 of the wiring substrate 3 are the plural bonding wires 4. By contrast, in the present embodiment, the plural conductive members electrically coupling the plural electrodes (electrode pads) 2*a* of the semiconductor chip 2 to the plural bonding leads 4 of the wiring substrate 3 are the plural bump electrodes BP1.

The semiconductor device 1*e* is otherwise the same as the semiconductor device 1*c* of Embodiment 6 described above, so that a description thereof is omitted. The semiconductor device 1*c* of Embodiment 6 described above corresponds to the semiconductor device 1*e* of FIG. 64 only when the semiconductor chip 2 is flip-chip mounted. However, Embodiment 8 is applicable not only to Embodiment 6 described above, but also to the semiconductor devices described above in Embodiments 1 to 5, and 7. In the semiconductor devices described above in Embodiments 1 to 5, and 7, the semiconductor chip 2 can be flip-chip mounted in the same manner as in the present embodiment.

Thus, by flip-chip mounting the semiconductor chip 2 on the wiring substrate 3, it is possible to expose the back surface of the semiconductor chip 2 from the resin (mold resin or molded body). This allows an improvement in the heat releasing property of the semiconductor chip 2.

As described above, in order to inhibit the warping of the semiconductor device, it is preferable to mold the semiconductor chip 2 and the upper surface 3*a* of the wiring substrate 3 with a mold resin having a thermal expansion coefficient between the thermal expansion coefficient of the semiconductor chip 2 and the thermal expansion coefficient of the wiring substrate 3. However, in the case of the semiconductor device of Embodiment 8, the volume of the mold resin (corresponding to the mold resin 5 in Embodiments 1 to described above and to the resin 5*b* in the present embodiment) is smaller than in embodiments 1 to 7 described above so that the warping of the semiconductor device is more likely to occur.

However, in the present embodiment also, in the same manner as in Embodiments 1 to 7 described above, the plural lands 16 (or the solder balls 6) are divided into the plural land groups (or the solder ball groups) and disposed, and the pitch of the lands 16 (or the solder balls 6) is set higher in the second land group 57 (or the second solder ball group 52) located at the center-side portion of the lower surface 3*b* of the wiring substrate 3 than in the first land group 56 (or the first solder ball group 51) located at the outer-peripheral-side portion of the lower surface 3*b* of the wiring substrate 3. Therefore, even when the warping of the semiconductor device is more likely to occur than that of the semiconductor devices described above in Embodiments 1 to 7, it is possible to inhibit a short circuit between the adjacent solder balls 6.

In the structure of the semiconductor device of Embodiment 8, by adjusting the sizes of the solder balls 6*b* disposed on the lands 16*b* in the second land group 57 to be smaller than the sizes of the solder balls 6*a* disposed on the lands 16*a* in the first land group 56, it is possible to more reliably inhibit a short circuit between the adjacent solder balls 6.

While the invention achieved by the present inventors has been specifically described heretofore based on the embodiments thereof, the present invention is not limited thereto. It will be easily appreciated that various modification and changes can be made in the invention without departing from the gist thereof.

For example, the description has been given of the structure in which the bonding leads 14 formed on the upper surface 3*a* of the wiring substrate 3 are electrically coupled to the lands 16 formed on the lower surface 3*b* of the wiring substrate 3 via the wires (wiring layers) and the conductors (via wires 18) formed within the wiring substrate 3. However, the present invention is not limited thereto.

Figure 65:
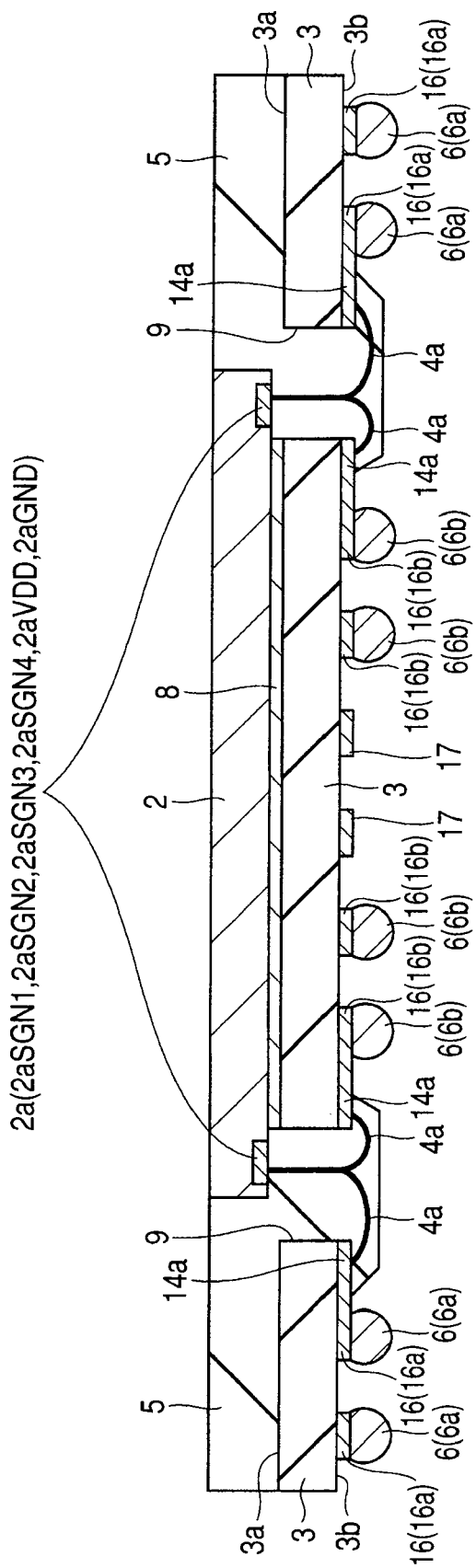
FIG. 65 is a cross-sectional view of a semiconductor device of a variation of the present invention.

That is, as shown in FIG. 65, a structure may also be adopted in which the semiconductor chip 2 is mounted on the wiring substrate 3 via the bonding material 8 such that the main surface (top surface) of the semiconductor chip 2 opposes the upper surface 3*a* of the wiring substrate 3, wires 4*a* are caused to pass through through holes (slits) 9 formed in the wiring substrate 3, and the electrodes 2*a* of the semiconductor chip 2 are electrically coupled to bonding leads 14a formed on the lower surface 3b of the wiring substrate 3 and formed integrally with the lands 16 via the wires 4a. FIG. 65 is a cross-sectional view (side cross-sectional view) showing a semiconductor device of a variation of the present invention.

Figure 66:
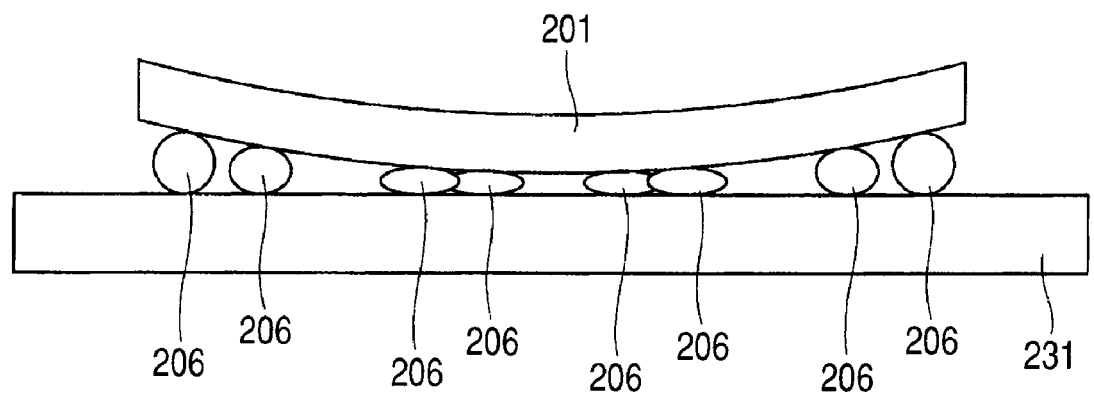
FIG. 66 is an illustrative view for illustrating a contact between individual solder bumps of a BGA mounted on a mounting substrate.

Here, each of the through holes (slits) 9 are partially located outside the semiconductor chip 2 when viewed in plan view. The portions of the wires 4a (corresponding to the bonding wires 4 described above) located within the through holes (slits) 9 are molded with the mold resin (molded resin portion, molded portion, or molded body) 5 supplied from the upper surface 3a of the wiring substrate 3 toward the lower surface 3b thereof via parts of the through holes 9. The mold resin 5 formed over the upper surface 3a of the wiring substrate 3, the mold resin 5 located within the through holes (slits) 9 of the wiring substrate 3, and the mold resin 5 formed over the lower surface 3b of the wiring substrate 3 are formed integrally. As shown in FIG. 66, the mold resin 5 over the upper surface 3a of the wiring substrate 3 is formed to come into contact with the side surfaces of the semiconductor chip 2 and with the upper surface 3a of the wiring substrate 3.

In such a structure also, by arranging the plural lands (or the plural external terminals, which are the solder balls herein) disposed on the lower surface 3b of the wiring substrate 3 in the manners described above in Embodiments 1 to 8, even when the semiconductor device (semiconductor package) warps, it is possible to ensure the reliability of the semiconductor device.

The present invention is preferably applied to a semiconductor device in the form of a semiconductor package, to a manufacturing method thereof, and to a manufacturing method of a semiconductor module.

What is claimed is:

1. A semiconductor device having a plurality of external terminals, for mounting on on a mother board by melting the external terminals with heat comprising:
  a wiring substrate having a first surface, a plurality of bonding leads formed on the first surface, a second surface opposite to the first surface, and a plurality of lands formed on the second surface;
  a semiconductor chip having a third surface, a plurality of electrode pads formed on the third surface, and a fourth surface opposite to the third surface, and mounted over the first surface of the wiring substrate;
  a plurality of conductive members electrically connecting the electrode pads of the semiconductor chip with the bonding leads of the wiring substrate, respectively; and
  the external terminals disposed on the land of the wiring substrate, respectively,
  wherein a shape in a plan view of the second surface of the wiring substrate is comprised of a quadrangle having a first side and a second side crossing to the first side in the plan view;
  wherein the external terminals include a first external terminal group arranged in a plurality of rows and arranged along each of the first and second sides of the second surface of the wiring substrate, and a second external terminal group arranged inside the first external terminal group in the plan view and arranged along each of the first and second sides of the second surface of the wiring substrate;
  wherein a pitch in a first direction along the first side of the lands in a second land group is larger than a pitch in the first direction of the lands in a first land group; and
  wherein a pitch in a second direction along the second side of the lands in the second land group is larger than a pitch in the second direction of the lands in the first land group.

2. A semiconductor device according to claim 1, wherein a distance between the first land group and the second land group is larger than a spacing between the rows in the first land group.

3. A semiconductor device according to claim 2, wherein a thermal expansion coefficient of the wiring substrate is larger than a thermal expansion coefficient of the semiconductor chip.

4. A semiconductor device according to claim 3,
  wherein a circuit element is formed in the semiconductor chip,
  wherein the electrode pads include a plurality of electrode pads for signal which are each electrically coupled to the circuit element, and
  wherein each of the electrode pads for signal is electrically coupled to either of the first land group and the second land group.

5. A semiconductor device according to claim 4,
  wherein the lands in the second land group are arranged in a plurality of rows,
  wherein the lands belonging to the adjacent rows in the first land group are arranged in alignment with each other, and
  wherein the lands belonging to the adjacent rows in the second land group are arranged out of alignment with each other.

6. A semiconductor device according to claim 5,
  wherein the lands belonging to the adjacent rows in the first land group overlap each other when viewed in a direction orthogonal to an extending direction of the rows, and,
  wherein between the lands belonging to each of the rows in the second land group, the lands belonging to a row adjacent to the row are located when viewed in the direction orthogonal to the extending direction of the rows.

7. A semiconductor device according to claim 1,
  wherein the pitch in the first direction of the lands in the second land group is larger than the pitch in the second direction of the lands in the first land group; and
  wherein the pitch in the second direction of the lands in the second land group is larger than the pitch in the first direction of the lands in the first land group.

8. A semiconductor device according to claim 1, wherein each of the external terminals is a solder ball.

9. A semiconductor device according to claim 8, wherein the solder ball is comprised of one of tin (Sn) only, a tin (Sn) alloy layer made of a tin (Sn)-bismuth (Bi) alloy, and a tin (Sn) alloy layer made of a tin (Sn)-silver (Ag)-copper (Cu) alloy.

10. A semiconductor device having a plurality of external terminals, for mounting on on a mother board by melting the external terminals with heat comprising:
  a wiring substrate having a first surface, a plurality of bonding leads formed on the first surface, a second surface opposite to the first surface, and a plurality of lands formed on the second surface;
  a semiconductor chip having a third surface, a plurality of electrode pads formed on the third surface, and a fourth surface opposite to the third surface, and mounted over the first surface of the wiring substrate;

a plurality of conductive members electrically connecting the electrode pads of the semiconductor chip with the bonding leads of the wiring substrate, respectively; and the external terminals disposed on the land of the wiring substrate, respectively, wherein a shape in a plan view of the second surface of the wiring substrate is comprised of a quadrangle having a first side and a second side crossing to the first side in the plan view;

wherein the external terminals include a first external terminal group arranged in a plurality of rows and arranged along each of the first and second sides of the second surface of the wiring substrate, and a second external terminal group arranged inside the first external terminal group in the plan view and arranged along each of the first and second sides of the second surface of the wiring substrate;

wherein a pitch in a first direction along the first side of the external terminals in the second external terminal group is larger than a pitch in the first direction of the external terminals in the first external terminal group; and wherein a pitch in a second direction along the second side of the external terminals in the second external terminal group is larger than a pitch in the second direction of the external terminals in the first external terminal group.

11. A semiconductor device according to claim 10, wherein a distance between the first external terminal group and the second external terminal group is larger than a spacing between the rows in the first external terminal group.

12. A semiconductor device according to claim 11, wherein a thermal expansion coefficient of the wiring substrate is larger than a thermal expansion coefficient of the semiconductor chip.

13. A semiconductor device according to claim 12, wherein a circuit element is formed in the semiconductor chip, wherein the electrode pads include a plurality of electrode pads for signal which are each electrically coupled to the circuit element, and wherein each of the electrode pads for signal is electrically coupled to either of the first external terminal group and the second external terminal group.

14. A semiconductor device according to claim 13, wherein the external terminals in the second external terminal group are arranged in a plurality of rows, wherein the external terminals belonging to the adjacent rows in the first external terminal group are arranged in alignment with each other, and wherein the external terminals belonging to the adjacent rows in the second external terminal group are arranged out of alignment with each other.

15. A semiconductor device according to claim 14, wherein the external terminals belonging to the adjacent rows in the first external terminal group overlap each other when viewed in a direction orthogonal to an extending direction of the rows, and wherein between the external terminals belonging to each of the rows in the second external terminal group, the external terminals belonging to a row adjacent to the row are located when viewed in the direction orthogonal to the extending direction of the rows.

16. A semiconductor device according to claim 10, wherein the pitch in the first direction of the external terminals in the second external terminal group is larger than the pitch in the second direction of the external terminals in the first external terminal group; and wherein the pitch in the second direction of the external terminals in the second external terminal group is larger than the pitch in the first direction of the external terminals in the first external terminal group.

17. A semiconductor device according to claim 10, wherein each of the external terminals is a solder ball.

18. A semiconductor device according to claim 17, wherein the solder ball is comprised of one of tin (Sn) only, a tin (Sn) alloy layer made of a tin (Sn)-bismuth (Bi) alloy, and a tin (Sn) alloy layer made of a tin (Sn)-silver (Ag)-copper (Cu) alloy.

* * * * *